(12) United States Patent
Nagai et al.

(10) Patent No.: US 10,429,732 B2
(45) Date of Patent: Oct. 1, 2019

(54) IMPRINT METHOD AND IMPRINT MOLD MANUFACTURING METHOD

(71) Applicant: DAI NIPPON PRINTING CO., LTD., Tokyo (JP)

(72) Inventors: Takaharu Nagai, Tokyo (JP); Yuichi Inazuki, Tokyo (JP); Katsutoshi Suzuki, Tokyo (JP); Ryugo Hikichi, Tokyo (JP); Koji Ichimura, Tokyo (JP); Saburou Harada, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 413 days.

(21) Appl. No.: 15/501,568

(22) PCT Filed: Mar. 11, 2015

(86) PCT No.: PCT/JP2015/057128
§ 371 (c)(1),
(2) Date: Feb. 3, 2017

(87) PCT Pub. No.: WO2016/021223
PCT Pub. Date: Feb. 11, 2016

(65) Prior Publication Data
US 2017/0235221 A1   Aug. 17, 2017

(30) Foreign Application Priority Data
Aug. 8, 2014 (JP) ................. 2014-162171

(51) Int. Cl.
| | |
|---|---|
| *G03F 7/00* | (2006.01) |
| *H01L 21/027* | (2006.01) |
| *B29C 59/02* | (2006.01) |
| *B29C 35/08* | (2006.01) |

(52) U.S. Cl.
CPC .......... *G03F 7/0002* (2013.01); *B29C 59/022* (2013.01); *B29C 59/026* (2013.01); *H01L 21/027* (2013.01); *B29C 35/0805* (2013.01); *B29C 2035/0827* (2013.01)

(58) Field of Classification Search
None
See application file for complete search history.

(56) References Cited

U.S. PATENT DOCUMENTS

2015/0224703 A1* 8/2015 Oda ...................... G03F 7/0002
264/447

FOREIGN PATENT DOCUMENTS

| | | |
|---|---|---|
| JP | 2012-504336 A | 2/2012 |
| WO | 2010/039226 A2 | 4/2010 |

* cited by examiner

*Primary Examiner* — Michael P. Rodriguez
(74) *Attorney, Agent, or Firm* — Oliff PLC

(57) ABSTRACT

An imprint method using a mold and/or a transfer substrate having a mesa structure includes a resin supply step, a contact step, a curing step, and a mold release step. In the resin supply step, a balance layer is formed by supplying a molded resin also to an area outside of a pattern formation area of the transfer substrate in which a pattern structure is to be formed.

19 Claims, 38 Drawing Sheets

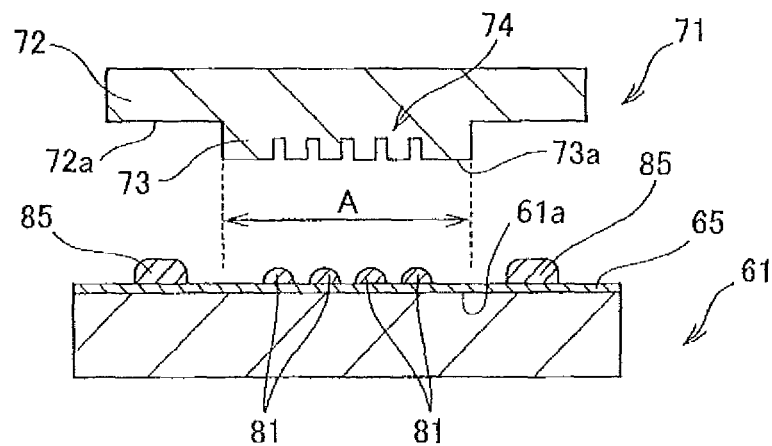
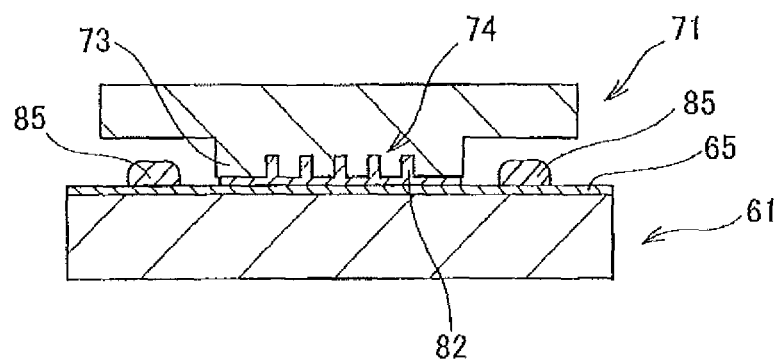
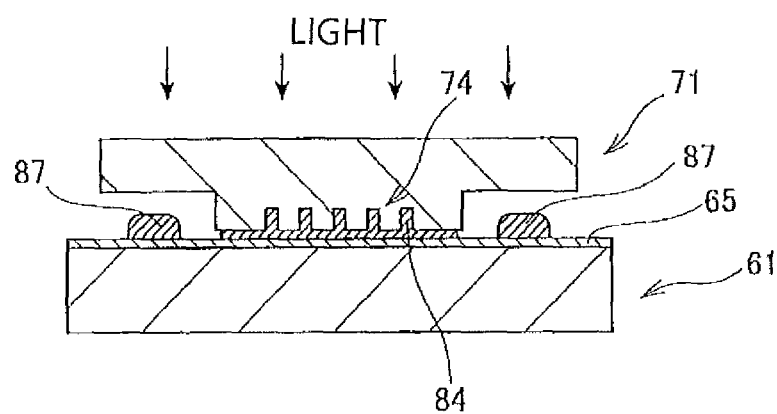

IMPRINT METHOD AND IMPRINT MOLD MANUFACTURING METHOD

TECHNICAL FIELD

The present invention relates to an imprint method and an imprint mold manufacturing method using the imprint method.

BACKGROUND ART

In recent years, as a fine pattern formation technique that replaces photolithography, a pattern formation technique that uses an imprint method is attracting attention. An imprint method is a pattern formation technique in which one-to-one transfer of a fine structure is performed by using a mold member (mold) having a fine uneven structure to transfer the uneven structure to a molded resin. For example, in an imprint method in which a photocurable resin is used as the molded resin, droplets of the photocurable resin are supplied to the surface of a transfer substrate, a mold having a desired uneven structure and the transfer substrate are brought close to each other until a distance therebetween becomes a predetermined distance, and the uneven structure is thereby filled with the photocurable resin. In this state, light is emitted from the side of the mold to cure the photocurable resin and, thereafter, the mold is separated from the resin layer. As a result, a pattern structure having an uneven structure (uneven pattern) in which projections and depressions of the mold are inverted is formed. Furthermore, imprint lithography is performed in which a transfer substrate is etched by using the pattern structure as an etching mask. In imprint lithography, as the transfer substrate, a transfer substrate provided with a material layer for a hard mask on the surface thereof may be used. In this case, the material layer for a hard mask is etched by using a resin layer formed by the imprint method as an etching mask to form a hard mask, and the transfer substrate is etched by using the hard mask as an etching mask.

When manufacturing a mold used in such an imprint method, usually, an electron beam-sensitive resist is applied to a base for the mold and a resist pattern is formed by performing electron beam drawing on the resist. Subsequently, an uneven pattern is formed by etching the base by using the resist pattern as an etching mask to manufacture the mold. However, electron beam lithography that uses electron beam drawing requires the use of an expensive drawing apparatus and takes a long time to complete the drawing, and hence there has been a problem in that the manufacturing cost of the mold increases. In addition, when a foreign object enters between the mold and the transfer substrate during imprinting, both the mold and the transfer substrate are significantly damaged, which makes it difficult to reuse the damaged mold. Hence, there is a problem in that the costly mold manufactured by electron beam lithography is lost.

To cope with this, a duplicate mold (hereinafter referred to as a replica mold) is manufactured by imprint lithography using an imprint method from a master mold, the master mold being a mold manufactured by electron beam lithography (PTL 1 and the like).

CITATION LIST

Patent Literature

[PTL 1]
Japanese Translation of PCT Application No. 2012-504336

SUMMARY OF INVENTION

Technical Problem

However, there is a problem when a transfer substrate for a replica mold has a mesa structure in which an area where a pattern structure is formed is more protruded than a surrounding area and an uneven structure is formed on a surface of the mesa structure. In other words, there is a problem in a manufactured replica mold in that there is a difference between dimensional accuracy of an uneven structure positioned on a side of a periphery of the mesa structure and dimensional accuracy of an uneven structure positioned closer to a central part. Such a variation in dimensional accuracy of uneven structures cannot be resolved despite variously adjusting an etching condition during formation of a hard mask and an etching condition of a transfer substrate when using the hard mask as an etching mask.

Meanwhile, such a variation in dimensional accuracy of uneven structures may conceivably be avoided by limiting a range of use of the mesa structure surface of the transfer substrate to the area close to the central part thereof. However, there is a problem with a replica mold manufactured by limiting the use of the peripheral side of the mesa structure surface so that an uneven structure is not provided on the peripheral side of the mesa structure surface in that there is a significant difference in density among the uneven structures of the mesa structure surface and imprinting cannot be stably performed with high accuracy.

Such problems similarly occur when a mold having a mesa structure is used to form an uneven structure in an area corresponding to the mesa structure portion of the mold on a surface of a flat transfer substrate.

In addition, a remaining film attributable to a gap between a projection of the mold and the transfer substrate exists on a pattern structure which is a cured product of molded resin. There is also a problem in that uniformity and reproducibility of thickness of the remaining film are inferior in an outer edge portion of an area where a pattern structure is formed due to oozing or volatilization of the molded resin or due to restrictions related to mechanical accuracy of an imprint apparatus. When a hard mask is etched via such a pattern structure with a remaining film having uneven thickness, there is a problem in that, in addition to the variation in dimensional accuracy between the peripheral side and the area close to the central part as described above, etching accuracy further declines to prevent a replica mold from being manufactured with high accuracy.

Furthermore, even when dividing one surface of a wafer into multiple patterns, performing imprinting by step and repeat using a mold on the divided multiple patterns to form a pattern structure which is a cured product of molded resin, and subsequently performing an etching process on the wafer, a problem occurs in that a difference arises between a pattern dimension of a pattern on a peripheral side of the wafer and a pattern dimension of a pattern close to a center of the wafer.

In addition, the presence of a foreign object or a projecting defect on the wafer results in destroying an uneven structure of a mold brought close to the wafer. Such a situation can be avoided by performing a defect inspection of the wafer in advance and not performing imprinting in a section where a defect has been detected. However, in this case, a problem occurs in that dimensional accuracy of an uneven structure of a formed pattern structure declines due to a variation in dimensional accuracy between the peripheral side and the area close to the central part as described above in a section adjacent to a section in which imprinting is not performed.

The present invention has been made in view of the circumstances described above, and an object thereof is to provide an imprint method for forming a pattern structure with high accuracy using a mold and/or a transfer substrate having a mesa structure, and an imprint mold manufacturing method that uses the imprint method.

Solution to Problem

In order to achieve the above object, an imprint method according to the present invention includes: a resin supply step of supplying a molded resin on a hard mask material layer of a transfer substrate having the hard mask material layer on one main surface thereof; a contact step of bringing a mold having an uneven structure and the transfer substrate close to each other and spreading the molded resin between the mold and the transfer substrate to form a molded resin layer; a curing step of curing the molded resin layer to obtain a transfer resin layer; and a mold release step of separating the transfer resin layer and the mold from each other and positioning a pattern structure, which is the transfer resin layer, on the transfer substrate, wherein in the resin supply step, a balance layer is formed by supplying a molded resin also to an area outside of a pattern formation area of the transfer substrate in which the pattern structure is to be formed.

In addition, an imprint method according to the present invention includes: a resin supply step of supplying a molded resin on a hard mask material layer of a transfer substrate having the hard mask material layer on one main surface thereof; a contact step of bringing a mold having an uneven structure and the transfer substrate close to each other and spreading the molded resin between the mold and the transfer substrate to form a molded resin layer; a curing step of curing the molded resin layer to obtain a transfer resin layer; a mold release step of separating the transfer resin layer and the mold from each other and positioning a pattern structure, which is the transfer resin layer, on the transfer substrate; and a balance layer formation step of forming a balance layer by supplying a molded resin to an area outside of a pattern formation area of the transfer substrate in which the pattern structure has been formed, and curing the molded resin.

In an imprint method according to the present invention, the balance layer is formed such that, when the pattern formation area and the balance layer separate from each other, a distance of separation is equal to or less than 300 µm.

In an imprint method according to the present invention, the balance layer is formed such that a shortest distance from an outer edge of the pattern formation area to an outer edge of the balance layer is equal to or more than 800 µm.

In an imprint method according to the present invention, by using a transfer substrate with a mesa structure in which the pattern formation area constitutes a projection structure part that is more projected than a surrounding area, the balance layer is formed on the transfer substrate on the outside of the projection structure part.

In an imprint method according to the present invention, by using a mold with a mesa structure in which an area having an uneven structure constitutes a projection structure part that is more projected than a surrounding area, the balance layer is formed on a surface of the transfer substrate so as to be positioned on the outside of an area corresponding to the projection structure part of the mold.

In an imprint method according to the present invention, when a distance from a balance layer positioned in a vicinity of a portion where thickness of a remaining film of a pattern structure formed in the pattern formation area is small to the pattern formation area is denoted by L1, a distance from an outer edge of the balance layer to the pattern formation area is denoted by L2, a distance from a balance layer positioned in a vicinity of a portion where thickness of the remaining film of the pattern structure formed in the pattern formation area is large to the pattern formation area is denoted by L1', and a distance from an outer edge of the balance layer to the pattern formation area is denoted by L2', the balance layer is formed so as to satisfy a relationship expressed by L2'<L2 or L1<L1', and satisfy a relationship expressed by (L2'−L1')<(L2−L1).

In an imprint method according to the present invention, the balance layer is formed such that coverage for the balance layer positioned in a vicinity of a portion where thickness of a remaining film of a pattern structure formed in the pattern formation area is small is greater than coverage for a balance layer positioned in a vicinity of a portion where thickness of the remaining film of the pattern structure formed in the pattern formation area is large.

In an imprint method according to the present invention, after the mold release step, an area where the balance layer is formed is determined based on a result of a measurement of a thickness distribution of a remaining film of a pattern structure formed in the pattern formation area.

In an imprint method according to the present invention, an area where the balance layer is formed is determined based on a result of a measurement of a thickness distribution of a remaining film of a pattern structure formed in the pattern formation area, the measurement being performed in advance in a plurality of previously performed imprints.

In an imprint method according to the present invention, in a plurality of previously performed imprints, a hard mask is formed by etching the hard mask material layer by using a pattern structure formed in the pattern formation area as an etching mask, an uneven structure is formed in the pattern formation area by etching the transfer substrate by using the hard mask as an etching mask, and in an outer edge portion in the pattern formation area, a contraction tendency portion where a width dimension of a projection of the uneven structure tends to be smaller than an opening dimension of a corresponding depression of the mold and an expansion tendency portion where the width dimension of the projection of the uneven structure tends to be larger than the opening dimension of the corresponding depression of the mold are identified, and when a distance from a balance layer positioned in a vicinity of the contraction tendency portion to the pattern formation area is denoted by L1, a distance from an outer edge of the balance layer to the pattern formation area is denoted by L2, a distance from a balance layer positioned in a vicinity of the expansion tendency portion to the pattern formation area is denoted by L1', and a distance from an outer edge of the balance layer to the pattern formation area is denoted by L2', the balance layer is formed so as to satisfy a relationship expressed by L2'<L2 or L1<L1', and satisfy a relationship expressed by (L2'−L1')<(L2−L1).

In an imprint method according to the present invention, in a plurality of previously performed imprints, a hard mask is formed by etching the hard mask material layer by using a pattern structure formed in the pattern formation area as an etching mask, an uneven structure is formed in the pattern formation area by etching the transfer substrate by using the hard mask as an etching mask, and in an outer edge portion in the pattern formation area, a contraction tendency portion where a width dimension of a projection of the uneven structure tends to be smaller than an opening dimension of a corresponding depression of the mold and an expansion tendency portion where the width dimension of the projection of the uneven structure tends to be larger than the opening dimension of the corresponding depression of the mold are identified, and the balance layer is formed such that coverage for the balance layer positioned in a vicinity of the contraction tendency portion is larger than coverage for the balance layer positioned in a vicinity of the expansion tendency portion.

In an imprint method according to the present invention, a dimension distribution of an opening of a depression of the uneven structure included in the mold is identified, when a distance from a balance layer positioned in a vicinity of a portion included in an outer edge portion in the pattern formation area of the transfer substrate and corresponding to a portion of the mold where an opening dimension of the depression is small to the pattern formation area is denoted by L1, a distance from an outer edge of the balance layer to the pattern formation area is denoted by L2, a distance from a balance layer positioned in a vicinity of a portion included in the outer edge portion in the pattern formation area of the transfer substrate and corresponding to a portion of the mold where the opening dimension of the depression is large to the pattern formation area is denoted by L1', and a distance from an outer edge of the balance layer to the pattern formation area is denoted by L2', the balance layer is formed so as to satisfy a relationship expressed by L2'<L2 or L1<L1', and satisfy a relationship expressed by (L2'−L1')< (L2−L1).

In an imprint method according to the present invention, a dimension distribution of an opening of a depression of the uneven structure included in the mold is identified, and the balance layer is formed such that coverage for a balance layer positioned in a vicinity of a portion included in an outer edge portion in the pattern formation area of the transfer substrate and corresponding to a portion of the mold where an opening dimension of the depression is small is larger than coverage for a balance layer positioned in a vicinity of a portion included in the outer edge portion in the pattern formation area of the transfer substrate and corresponding to a portion of the mold where the opening dimension of the depression is large.

In an imprint method according to the present invention, a silicon wafer is used as the transfer substrate, and a plurality of pattern formation areas in which a pattern structure is to be formed are set on one surface of the silicon wafer by multiple patterning, and in a stage of forming a pattern structure in the plurality of pattern formation areas by a step and repeat system or after forming the pattern structure in the plurality of pattern formation areas by the step and repeat system, the balance layer is formed by supplying a molded resin to an area outside of an area of the silicon wafer where the plurality of pattern formation areas are assembled.

In an imprint method according to the present invention, a silicon wafer subjected to a defect inspection is used as the transfer substrate, a plurality of pattern formation areas in which a pattern structure is to be formed are set on one surface of the silicon wafer by multiple patterning and a defective area in which a defect of a prescribed size exists among the pattern formation areas is excluded from the areas where the pattern structure is to be formed, and in a stage of forming a pattern structure in the plurality of pattern formation areas by a step and repeat system or after forming the pattern structure in the plurality of pattern formation areas by the step and repeat system, the balance layer is formed by supplying a molded resin to an area outside of an area of the silicon wafer where the plurality of pattern formation areas are assembled and also to the defective area.

An imprint mold manufacturing method according to the present invention is an imprint mold manufacturing method of manufacturing a replica mold using a master mold, the imprint mold manufacturing method including the steps of: preparing a transfer substrate for a replica mold having a hard mask material layer on one main surface thereof, and forming a pattern structure and a balance layer on the hard mask material layer of the transfer substrate by using a desired master mold and using one of the imprint methods described above; forming a hard mask by etching the hard mask material layer by using the pattern structure and the balance layer as etching masks; and etching the transfer substrate by using the hard mask as an etching mask.

Advantageous Effects of Invention

According to the present invention, advantageous effects are produced in that a pattern structure can be stably fabricated with high accuracy using a mold and/or a transfer substrate having a mesa structure and that a highly accurate replica mold can be manufacturing using a master mold.

BRIEF DESCRIPTION OF DRAWINGS

FIGS. 4A to 4C are step diagrams for explaining another embodiment of the imprint method and the mold manufacturing method according to the present invention.

DESCRIPTION OF EMBODIMENTS

Hereinafter, embodiments of the present invention will be described with reference to the drawings.

Note that the drawings are schematic or conceptual. The dimensions of each member and the size ratios among the members, for example, are not necessarily the same as actual values thereof. Further, the same member or the like may be shown with different dimensions or ratios depending on the drawings.

First Embodiment

FIGS. 1A to 1D and FIGS. 2A to 2C are step diagrams for explaining an embodiment of an imprint method according to the present invention.

Figure 1A:
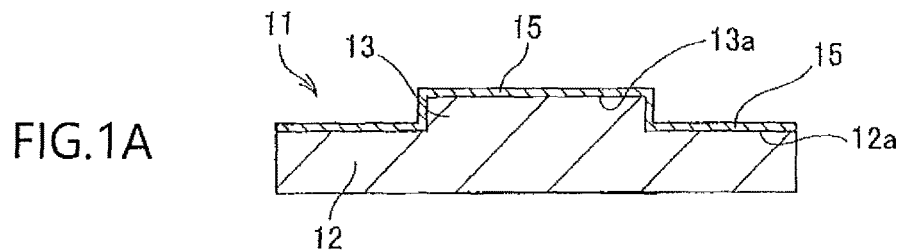
FIGS. 1A to 1D are step diagrams for explaining an embodiment of an imprint method and a mold manufacturing method according to the present invention.

In the present embodiment, a transfer substrate having a mesa structure in which an area where a pattern structure is formed is more protruded than a surrounding area. In the example shown in the drawing, a transfer substrate 11 has a projection structure part 13 positioned on one surface 12a of a base 12. A surface 13a of the projection structure part 13 is an area where a pattern structure is to be formed and which has a mesa structure which is more protruded than the surface 12a as a surrounding area. In addition, a hard mask material layer 15 is provided so as to cover the surface 12a and the surface 13a (FIG. 1A).

Examples of a material of the transfer substrate 11 include glass materials such as quartz, soda lime glass, and borosilicate glass, resin substrates of polycarbonate, polypropylene, polyethylene and the like, and composite material substrates of any combination of these materials. In addition, silicon or a metal such as nickel, titanium, and aluminum, alloys, oxides, and nitrides of these, and any laminated material of these can be used. However, when light irradiation is to be performed from a side of the transfer substrate 11 in a curing step to be described later, the transfer substrate 11 must have light transmissivity to enable a curing process.

The projection structure part 13 included in the transfer substrate 11 described above is a pattern formation area in which a pattern structure is to be formed and a plan view shape, plan view dimensions, and a projection height from the surface 12a as a surrounding area of the projection structure part 13 can be set as appropriate.

The hard mask material layer 15 can be formed by vacuum film deposition such as sputtering using a metal or a metal compound which enables dry etching that utilizes etching selectivity with respect to the transfer substrate 11. Examples of the metal and the metal compound include metals such as chromium, tantalum, aluminum, molybdenum, titanium, zirconium, and tungsten, alloys of these metals, metal oxides such as chromium oxide and titanium oxide, metal nitrides such as chromium nitride and titanium nitride, and intermetallic compounds such as gallium arsenide. A thickness of the hard mask material layer 15 described above can be set in consideration of etching selectivity (etching rate of hard mask material layer/etching rate of pattern structure or balance layer) during dry etching of the hard mask material layer 15 via the pattern structure and the balance layer to be described later, etching selectivity (etching rate of transfer substrate/etching rate of hard mask (hard mask material layer 15)) during dry etching of the transfer substrate 11 via a hard mask to be described later, differences in etching rates due to an opening area or an opening ratio of the pattern structure, and the like. While a thickness range cannot be unconditionally set, for example, the thickness can be appropriately set to a range of 1 to 100 nm and favorably set to a range of 3 to 15 nm.

Figure 1B:
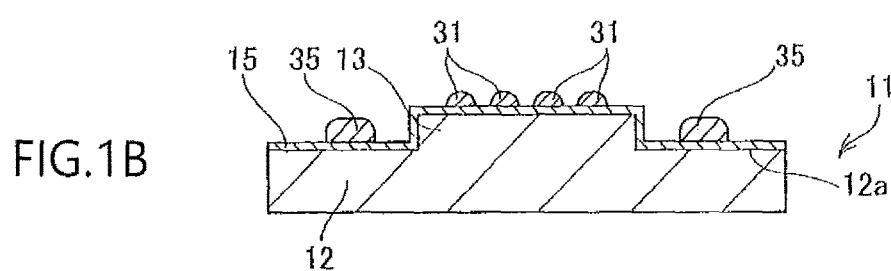

In the present embodiment, first, in a resin supply step, droplets of a molded resin 31 are discharged by an ink jet system and supplied to a desired area on the hard mask material layer 15 of the projection structure part 13 of the transfer substrate 11. In addition, a balance layer 35 is formed by an ink jet system in a desired area on the hard mask material layer 15 of the surface 12a in an area outside of the projection structure part 13 that is a pattern formation area (FIG. 1B). The number of the droplets of the molded resin 31 supplied onto the hard mask material layer 15 of the projection structure part 13 of the transfer substrate 11 and a distance between adjacent droplets can be appropriately set from a dropping amount of each droplet, a total required amount of the molded resin, a gap between a mold 21 and the transfer substrate 11 in a contact step that is a subsequent step, and the like. In addition, the balance layer 35 is formed as droplets of the molded resin 31 having been supplied onto the hard mask material layer 15 of the surface 12a of the base 12 wet-spread and come into contact with each other. The number of the droplets of the molded resin 31 supplied in order to form the balance layer 35 and a distance between adjacent droplets can be appropriately set in consideration of a plan view shape, plan view dimensions, and thickness of the balance layer 35 to be formed. The thickness of the balance layer 35 can be set such that, for example, a balance layer 37 (to be described later) obtained by curing the balance layer 35 equals or exceeds a thickness of a pattern structure 41 that is obtained in a mold release step to be described later. It should be noted that, while the balance layer 35 is formed using the molded resin 31 supplied onto the projection structure part 13 in the example described above, the balance layer 35 may be formed using a resin material that differs from the molded resin 31.

Figure 3:
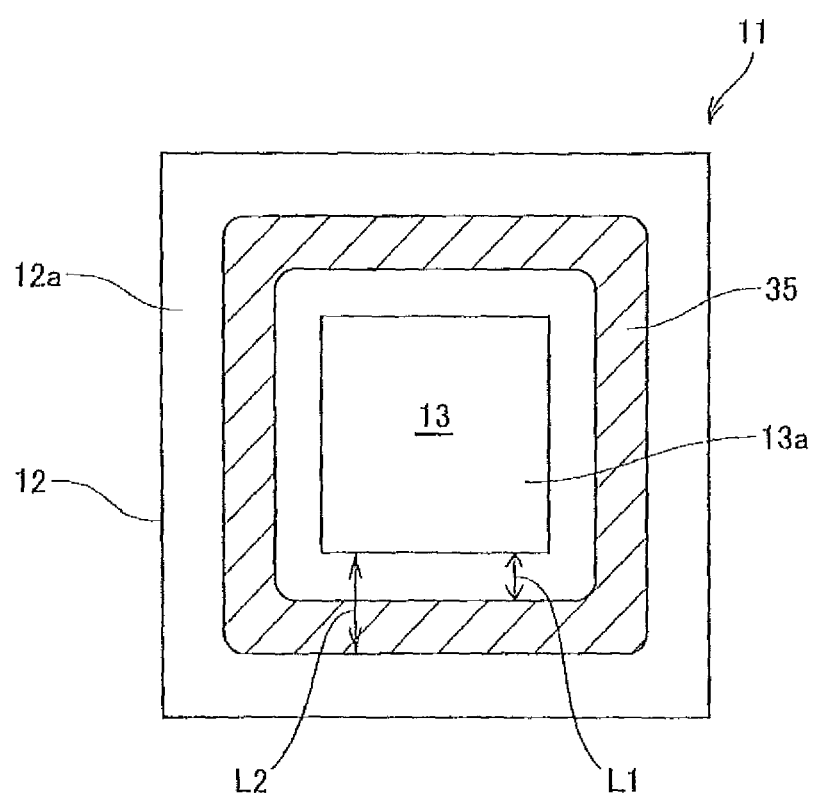
FIG. 3 is a plan view for explaining formation of a balance layer in the imprint method according to the present invention.

FIG. 3 is a plan view which shows the balance layer 35 formed on the surface 12a in an area outside of the projection structure part 13 and which omits the hard mask material layer 15. In the example shown in the drawing, the balance layer 35 (shown hatched) is formed in a ring shape on the surface 12a on the outside of the projection structure part 13 that is a pattern formation area so as to be separated from the projection structure part 13 and to enclose the projection structure part 13. In this case, a distance of separation L1 between the projection structure part 13 that is a pattern formation area and the balance layer 35 can be set to 300 µm or less and a shortest distance L2 from an outer edge of the projection structure part 13 that is a pattern formation area to an outer edge of the balance layer 35 can be set to 800 µm or more. When the distance of separation L1 exceeds 300 µm or when the shortest distance L2 falls below 800 µm, an effect of the balance layer may not be sufficiently exhibited. Specifically, this is not favorable since differences in an opening dimension of the hard mask to be described later and in dimensional accuracy of pattern structures formed by etching the transfer substrate 11 via the hard mask are more likely to arise between the periphery side and the area close to a center of the projection structure part 13 and, consequently, advantageous effects of the present invention may not be exhibited. While the balance layer 35 is a solid layer in which the molded resin exists in a gapless manner in an area with a ring-like external shape in the example described above, alternatively, the molded resin may exist in an insular manner in a desired area. In this case, coverage of the molded resin in the balance layer 35 is lower than the 100% coverage for the solid balance layer 35. The coverage can be set as appropriate to, for example, 17% or higher. Note that coverage refers to a proportion of an area covered by the molded resin in a unit area.

It should be noted that the distance of separation L1 between the projection structure part 13 that is a pattern formation area and the balance layer 35 may be zero or, in other words, the balance layer 35 may be brought into contact with the projection structure part 13.

By forming the balance layer 35 in this manner in the resin supply step, vapor pressure in the atmosphere rises due to volatilization of a resin component from the balance layer 35. As a result, volatilization of a resin component from the molded resin 31 supplied to the projection structure part 13 that is a pattern formation area is suppressed and a compositional change can be suppressed. In addition, since formation of the balance layer 35 is performed in a same step as the resin supply step, there is no need to add a step before an etching step to be described later and a process is achieved which is less affected by adhesion of foreign objects or the like.

Figure 1C:
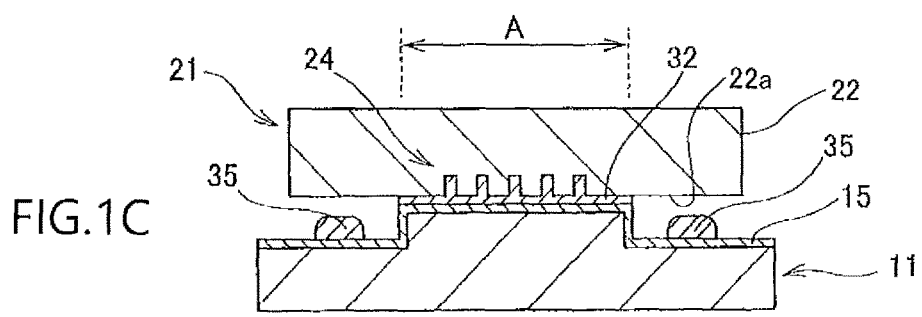

Next, in the contact step, the transfer substrate 11 and the mold 21 are brought close to each other, droplets of the molded resin 31 are spread between the transfer substrate 11 and the mold 21, and a molded resin layer 32 is formed (FIG. 1C). In the example shown in the drawing, the mold 21 used includes a base 22 and an uneven structure 24 positioned in an uneven formation area A that is set on one surface 22a of the base 22. In addition, as a material of the base 22 of the mold 21, in a case where the molded resin used for imprinting is a photocurable resin, it is possible to use a material that transmits irradiation light for curing the resin, and, in addition to glass materials such as quartz glass, silicate glass, calcium fluoride, magnesium fluoride, and acrylic glass, it is possible to use, e.g., sapphire, gallium nitride, resins such as polycarbonate, polystyrene, acrylic, and polypropylene, and any laminated material of these. Furthermore, in a case where the molded resin to be used is not a photocurable resin or in the case where light for curing the molded resin can be emitted from the side of the transfer substrate 11, the base 22 may not have light transmissivity.

Therefore, other than the above materials, it is possible to use, e.g., silicon, metals such as nickel, titanium, and aluminum, alloys, oxides, and nitrides of these, and any laminated material of these.

Figure 1D:
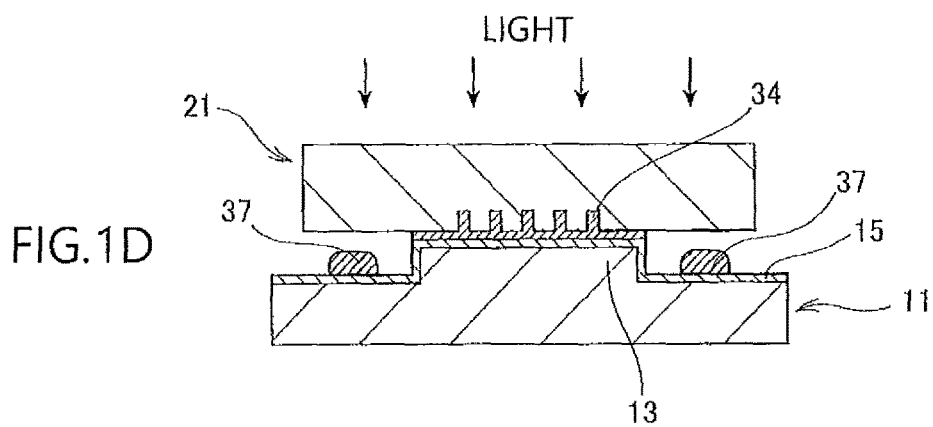

Subsequently, in the curing step, the molded resin layer 32 is cured to obtain a transfer resin layer 34 on which is formed an uneven structure in which projections and depressions of the uneven structure 24 of the mold 21 are inverted, and the balance layer 35 is cured to obtain the balance layer 37 (FIG. 1D). In the curing step, when the molded resin used is a photocurable resin, the molded resin layer 32 and the balance layer 35 can be cured by performing light irradiation from a side of the mold 21. In addition, when the transfer substrate 11 is formed of a light-transmitting material, the light irradiation may be performed from the side of the transfer substrate 11 and also from the sides of both of the transfer substrate 11 and the mold 21. On the other hand, when the molded resin used is a thermosetting resin, curing may be performed by applying a heating process to the molded resin layer 32 and the balance layer 35.

Figure 2A:
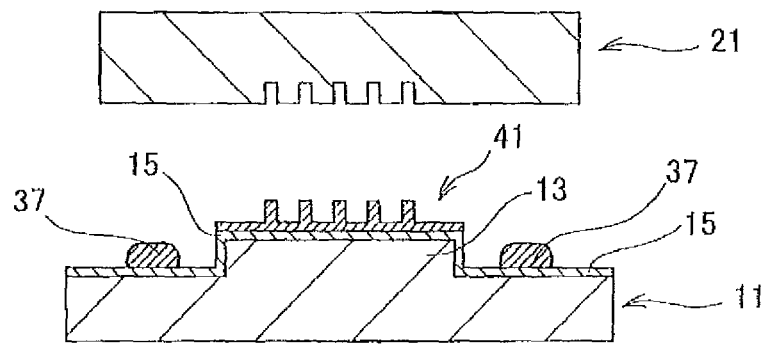
FIGS. 2A to 2C are step diagrams for explaining the embodiment of the imprint method and the mold manufacturing method according to the present invention.

Next, in the mold release step, the transfer resin layer 34 and the mold 21 are separated from each other, and the pattern structure 41 that is the transfer resin layer 34 is positioned on the hard mask material layer 15 of the projection structure part 13 of the transfer substrate 11 (FIG. 2A).

Figure 2B:
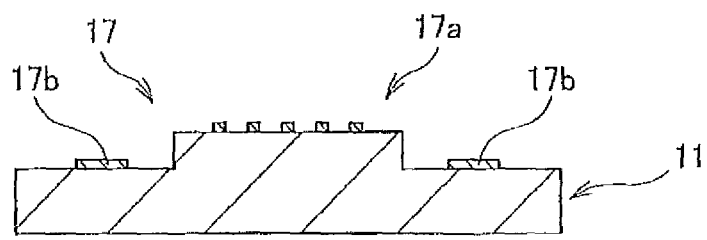

As described above, according to the imprint method of the present invention, a hard mask 17 is formed by etching the hard mask material layer 15 by using the pattern structure 41 formed on the hard mask material layer 15 of the projection structure part 13 of the transfer substrate 11 and the balance layer 37 formed on the hard mask material layer 15 on the surface 12a on the outside of the projection structure part 13 as etching masks (FIG. 2B). The hard mask 17 formed in this manner is constituted by a hard mask 17a which has a fine opening pattern positioned on the projection structure part 13 and a balance hard mask 17b which is positioned in the surface 12a as a surrounding area on the outside of the projection structure part 13.

With etching of the hard mask material layer 15 using the pattern structure 41 and the balance layer 37 as etching masks, etching via the pattern structure 41 is performed in a uniform and stable manner due to the presence of the balance layer 37. Specifically, when the balance layer 37 is absent, due to a micro-loading effect that describes a phenomenon in which the smaller an opening area or an opening ratio of a resist pattern, the lower the etching rate, an etching rate of the hard mask material layer 15 when using the pattern structure 41 as an etching mask becomes lower than an etching rate of the hard mask material layer 15 positioned on the base 12 of the transfer substrate 11. In addition, an influence of the micro-loading effect with respect to etching of the hard mask material layer 15 in the projection structure part 13 differs between the periphery side and near the center of the projection structure part 13. In other words, on the periphery side of the projection structure part 13, the micro-loading effect weakens under the influence of etching of the hard mask material layer 15 positioned on the base 12 of the transfer substrate 11 on the outside of the periphery side of the projection structure part 13. Therefore, in a hard mask formed on the projection structure part 13, a difference is created between a dimension on the periphery side of the projection structure part 13 and a dimension of the area close to the central part of the projection structure part 13. However, as in the imprint method of the present invention described above, by forming the balance layer 35 on the hard mask material layer 15 on the surface 12a on the outside of the projection structure part 13 and providing the balance layer 37 by curing the balance layer 35, the influence of the micro-loading effect with respect to etching of the hard mask material layer 15 in the projection structure part 13 can be made more uniform across the entire projection structure part 13. Therefore, the hard mask 17a formed on the projection structure part 13 by etching the hard mask material layer 15 by using the pattern structure 41 and the balance layer 37 as etching masks has suppressed variation in dimensional accuracy thereof and has high accuracy.

Figure 2C:
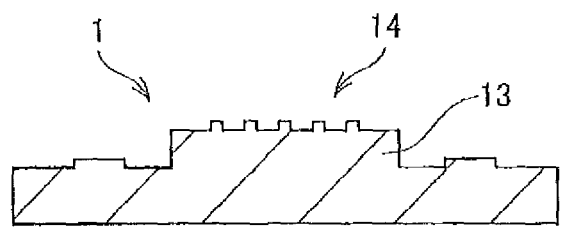

Next, by etching the transfer substrate 11 by using the hard mask 17a and the balance hard mask 17b as etching masks, a replica mold 1 in which an uneven structure 14 is formed in the projection structure part 13 is fabricated (FIG. 2C).

With etching of the transfer substrate 11 using the hard mask 17a and the balance hard mask 17b as etching masks, etching via the hard mask 17a is performed in a uniform and stable manner due to the presence of the balance hard mask 17b. Specifically, by providing the balance hard mask 17b, the influence of the micro-loading effect with respect to etching of the projection structure part 13 can be made more uniform across the entire projection structure part 13. Therefore, the uneven structure 14 formed in the projection structure part 13 has suppressed variation in dimensional accuracy thereof and the replica mold 1 can be fabricated with high accuracy.

Second Embodiment

FIGS. 4A to 4C and FIGS. 5A to 5C are step diagrams for explaining another embodiment of the imprint method according to the present invention.

In the present embodiment, as shown in FIG. 4A, a transfer substrate 61 is used which does not have a mesa structure and has a flat plate shape and which has a hard mask material layer 65 on one main surface 61a thereof. A material of the transfer substrate 61 can be selected in a similar manner to the transfer substrate 11 described above. In addition, the hard mask material layer 65 can be configured in a similar manner to the hard mask material layer 15 described above.

A mold used in the present embodiment is a mold having a mesa structure in which an area having an uneven structure is more protruded than a surrounding area. In the example shown in the drawing, a mold 71 has a projection structure part 73 positioned on one surface 72a of a base 72. A surface 73a of the projection structure part 73 is an area having an uneven structure 74 and creates a mesa structure which is more protruded than the surface 72a as a surrounding area. A material of the mold 71 can be selected in a similar manner to the mold 21 described above.

In the present embodiment, first, a pattern formation area A for forming a pattern structure is determined on the hard mask material layer 65 of the transfer substrate 61. The pattern formation area A normally corresponds to the projection structure part 73 of the mold 71. Subsequently, in the resin supply step, droplets of a molded resin 81 are discharged by an ink jet system and supplied to the pattern formation area A on the hard mask material layer 65. In addition, a balance layer 85 is formed by an ink jet system in a desired area on the hard mask material layer 65 in an area outside of the pattern formation area A (FIG. 4A). The number of the droplets of the molded resin 81 supplied to the transfer substrate 61 and a distance between adjacent droplets can be appropriately set from a dropping amount of each droplet, a total required amount of the molded resin, a gap between the mold 71 and the transfer substrate 61 in the contact step that is a subsequent step, and the like. Furthermore, the balance layer 85 is formed as droplets of the molded resin 81 having been supplied onto the hard mask material layer 65 in an area outside of the pattern formation area A wet-spread and come into contact with each other. The number of the droplets of the molded resin 81 supplied in order to form the balance layer 85 and a distance between adjacent droplets can be appropriately set in consideration of a plan view shape, plan view dimensions, and thickness of the balance layer 85 to be formed. The thickness of the balance layer 85 can be set such that, for example, a balance layer 87 (to be described later) obtained by curing the balance layer 85 equals or exceeds a thickness of a pattern structure 91 that is obtained in the mold release step to be described later. It should be noted that, while the balance layer 85 is formed using the molded resin 81 supplied to the pattern formation area A in the example described above, the balance layer 85 may be formed using a resin material that differs from the molded resin 81.

Figure 6:
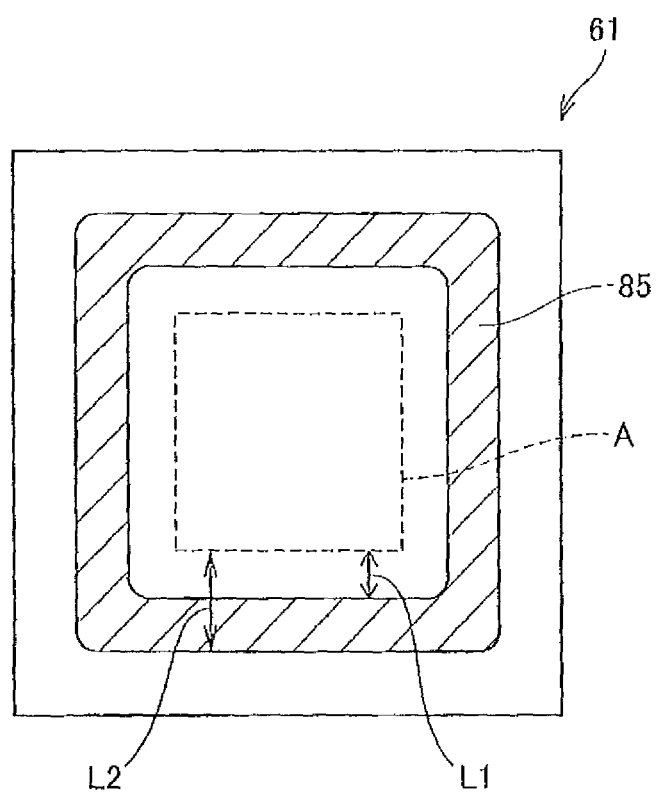
FIG. 6 is a plan view for explaining formation of a balance layer in the imprint method according to the present invention.

FIG. 6 is a plan view which shows the balance layer 85 formed in an area outside of the pattern formation area A and which omits the hard mask material layer 65. In the example shown in the drawing, the balance layer 85 (shown hatched) is formed in a ring shape so as to be separated from and to enclose the pattern formation area A. In this case, a distance of separation L1 between the pattern formation area A and the balance layer 85 can be set to 300 μm or less and a shortest distance L2 from an outer edge of the pattern formation area A to an outer edge of the balance layer 85 can be set to 800 μm or more. When the distance of separation L1 exceeds 300 μm or when the shortest distance L2 falls below 800 μm, an effect of the balance layer may not be sufficiently exhibited. Specifically, this is not favorable since differences in an accuracy of the hard mask to be described later and in dimensional accuracy of uneven structures formed by etching the transfer substrate 61 via the hard mask are more likely to arise between the periphery side and the area close to a center of the pattern formation area A and, consequently, advantageous effects of the present invention may not be exhibited. While the balance layer 85 is a solid layer in which the molded resin exists in a gapless manner in an area with a ring-like external shape in the example described above, alternatively, the molded resin may exist in an insular manner in a desired area. In this case, coverage of the molded resin in the balance layer 85 is lower than the 100% coverage for the solid balance layer 85. The coverage can be set as appropriate to, for example, 17% or higher. Note that coverage refers to a proportion of an area covered by the molded resin in a unit area.

It should be noted that the distance of separation L1 between the pattern formation area A and the balance layer 85 may be zero or, in other words, the balance layer 85 may be brought into contact with the pattern formation area A.

By forming the balance layer 85 in this manner in the resin supply step, vapor pressure in the atmosphere rises due to volatilization of a resin component from the balance layer 85. As a result, volatilization of a resin component from the molded resin 81 supplied to the pattern formation area A is suppressed and a compositional change can be suppressed. In addition, since formation of the balance layer 85 is performed in a same step as the resin supply step, there is no need to add a step before an etching step to be described later and a process is achieved which is less affected by adhesion of foreign objects or the like.

Next, in the contact step, the transfer substrate 61 and the mold 71 are brought close to each other, droplets of the molded resin 81 are spread between the transfer substrate 61 and the mold 71, and a molded resin layer 82 is formed (FIG. 4B).

Subsequently, in the curing step, the molded resin layer 82 is cured to obtain a transfer resin layer 84 on which is formed an uneven structure in which projections and depressions of the uneven structure 74 of the mold 71 are inverted, and the balance layer 85 is cured to obtain the balance layer 87 (FIG. 4C). In the curing step, when the molded resin used is a photocurable resin, the molded resin layer 82 and the balance layer 85 can be cured by performing light irradiation from a side of the mold 71. In addition, when the transfer substrate 61 is formed of a light-transmitting material, the light irradiation may be performed from the side of the transfer substrate 61 and also from the sides of both of the transfer substrate 61 and the mold 71. On the other hand, when the molded resin used is a thermosetting resin, curing may be performed by applying a heating process to the molded resin layer 82 and the balance layer 85.

Figure 5A:
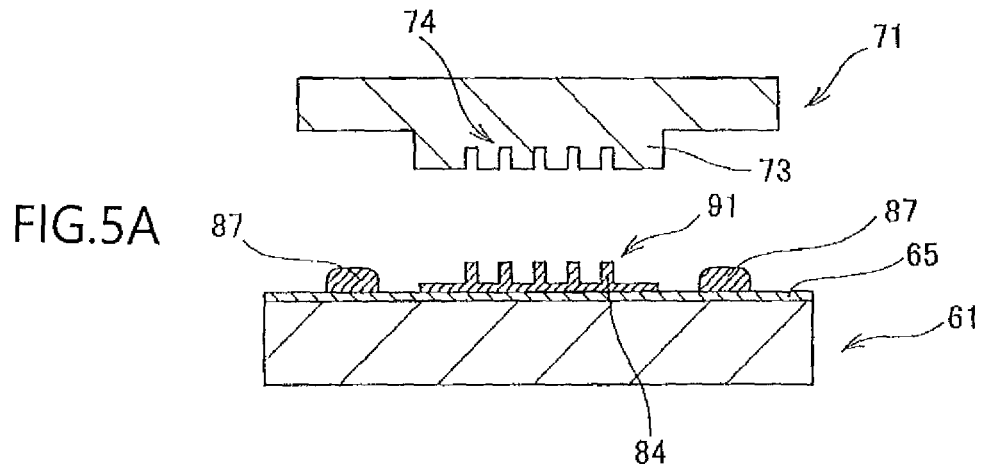
FIGS. 5A to 5C are step diagrams for explaining the other embodiment of the imprint method and the mold manufacturing method according to the present invention.

Next, in the mold release step, the transfer resin layer 84 and the mold 71 are separated from each other, and the pattern structure 91 that is the transfer resin layer 84 is positioned on the hard mask material layer 65 of the transfer substrate 61 (FIG. 5A).

Figure 5B:
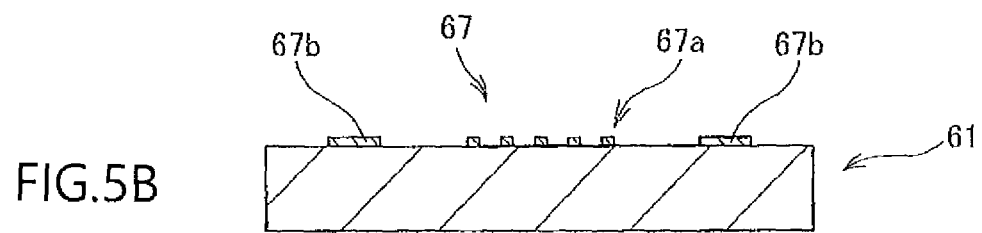

As described above, according to the imprint method of the present invention, a hard mask 67 is formed by etching the hard mask material layer 65 by using the pattern structure 91 formed on the hard mask material layer 65 of the pattern formation area A of the transfer substrate 61 and the balance layer 87 formed on the hard mask material layer 65 on the outside of the pattern formation area A as etching masks (FIG. 5B). The hard mask 67 formed in this manner is constituted by a hard mask 67a which has a fine opening pattern positioned in the pattern formation area A and a balance hard mask 67b which is positioned on the outside of the pattern formation area A.

With etching of the hard mask material layer 65 using the pattern structure 91 and the balance layer 87 as etching masks, as described above, the presence of the balance layer 87 enables an influence of a micro-loading effect with respect to etching of the hard mask material layer 65 in the pattern formation area A to be made more uniform across the entire pattern formation area A. Therefore, as described above, the hard mask 67a formed in the pattern formation area A by etching the hard mask material layer 65 by using the pattern structure 91 and the balance layer 87 as etching masks has suppressed variation in dimensional accuracy.

Figure 5C:
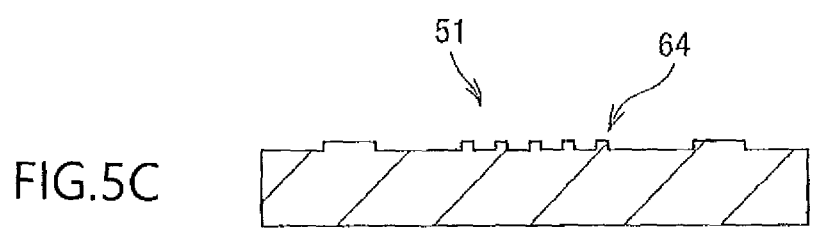

Next, by etching the transfer substrate 61 by using the hard mask 67a and the balance hard mask 67b as etching masks, a replica mold 51 in which an uneven structure 64 is formed in the pattern formation area A is fabricated (FIG. 5C).

With etching of the transfer substrate 61 using the hard mask 67a and the balance hard mask 67b as etching masks, etching via the hard mask 67a is performed in a uniform and stable manner due to the presence of the balance hard mask 67b. Specifically, by providing the balance hard mask 67b, the influence of the micro-loading effect with respect to etching of the pattern formation area A of the transfer substrate 61 can be made more uniform across the entire pattern formation area A. Therefore, the uneven structure 64 formed in the pattern formation area A has suppressed variation in dimensional accuracy thereof and the replica mold 51 can be fabricated with high accuracy.

Third Embodiment

FIGS. 7A to 7E are step diagrams for explaining another embodiment of the imprint method of the present invention.

In the present embodiment, the transfer substrate 11 having a mesa structure is used in a similar manner to the first embodiment described above.

Figure 7A:
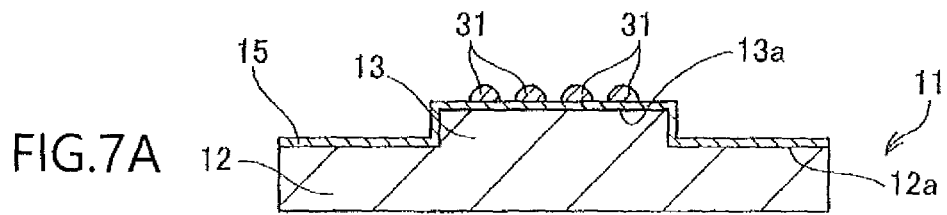
FIGS. 7A to 7E are step diagrams for explaining another embodiment of the imprint method and the mold manufacturing method according to the present invention.

In the present embodiment, first, the hard mask material layer 15 is formed on the transfer substrate 11, and droplets of the molded resin 31 are discharged by an ink jet system and supplied to a desired area on the hard mask material layer 15 of the projection structure part 13 (FIG. 7A). The number of the droplets of the molded resin 31 supplied to the transfer substrate 11 and a distance between adjacent droplets can be set in a similar manner to the first embodiment described above.

Figure 7B:
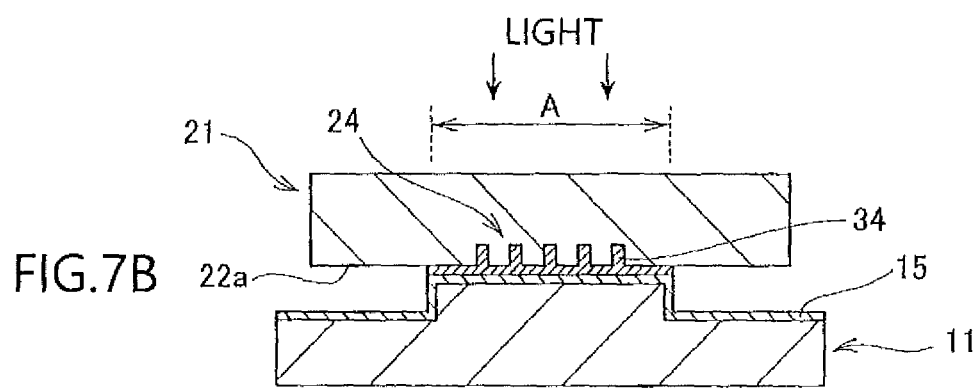

Next, in the contact step, the transfer substrate 11 and the mold 21 are brought close to each other, and droplets of the molded resin 31 are spread between the transfer substrate 11 and the mold 21 to form a molded resin layer. Subsequently, in the curing step, the molded resin layer is cured to obtain the transfer resin layer 34 on which is formed an uneven structure in which projections and depressions of the uneven structure 24 of the mold 21 are inverted (FIG. 7B). The mold 21 used includes the base 22 and the uneven structure 24 positioned in an uneven formation area A that is set on one surface 22a of the base 22.

Figure 7C:
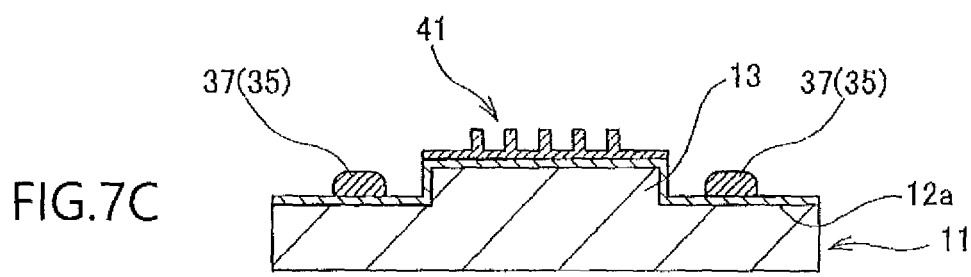

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11. Subsequently, in the balance layer formation step, the balance layer 35 is formed by an ink jet system in a desired area on the hard mask material layer 15 on the outside of the projection structure part 13 that is a pattern formation area, and the balance layer 35 is cured to obtain the balance layer 37 (FIG. 7C). Formation of the balance layer 35 can be performed in a similar manner to the first embodiment described above. In addition, when the molded resin used is a photocurable resin, curing of the balance layer 35 may be performed by directly irradiating the balance layer 35 with light. Furthermore, when the transfer substrate 11 is formed of a light-transmitting material, light irradiation may be performed from the side of the transfer substrate 11 or, alternatively, both direct light irradiation and light irradiation from the side of the transfer substrate 11 may be performed. On the other hand, when the molded resin used is a thermosetting resin, curing may be performed by applying a heating process to the balance layer 35.

Since the balance layer 35 is formed in the balance layer formation step following the mold release step in this manner, the balance layer 35 can be formed using a different resin material from the molded resin 31. In this case, the thickness of the balance layer 35 can be reduced within a range where the balance layer 37 functions as an etching mask in the formation of the hard mask 17 to be described later. For example, the balance layer 35 can be formed using a resin material with low viscosity or a resin material with a higher etching resistance than the molded resin 31. Accordingly, peeling and cleaning of the balance layer 37 after hard mask formation can be performed more readily. In addition, since the balance layer 35 is formed after the mold release step, prevention of coming into contact with the mold 21 and the like in the contact step described above need not be taken into consideration when supplying a resin material for forming the balance layer 35. Therefore, a shape and the like of the mold 21 need not be taken into consideration even when setting a distance of separation L1 between the projection structure part 13 that is a pattern formation area and the balance layer 35 and setting a shortest distance L2 from an outer edge of the projection structure part 13 that is a pattern formation area to an outer edge of the balance layer 35. As a result, various mold shapes can be accommodated.

Figure 7D:
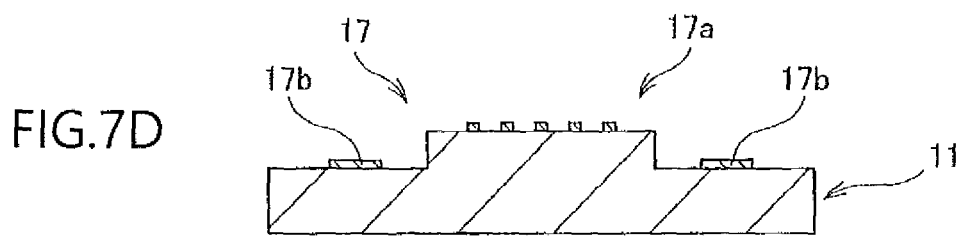

As described above, according to the imprint method of the present invention, the hard mask 17 is formed by etching the hard mask material layer 15 by using the pattern structure 41 formed on the hard mask material layer 15 of the projection structure part 13 of the transfer substrate 11 and the balance layer 37 formed on the hard mask material layer 15 on the surface 12a on the outside of the projection structure part 13 as etching masks (FIG. 7D). The hard mask 17 formed in this manner is constituted by the hard mask 17a which has a fine opening pattern positioned on the projection structure part 13 and the balance hard mask 17b which is positioned on the surface 12a on the outside of the projection structure part 13.

With etching of the hard mask material layer 15 using the pattern structure 41 and the balance layer 37 as etching masks, as described above, the presence of the balance layer 37 enables an influence of a micro-loading effect with respect to etching of the hard mask material layer 15 in the projection structure part 13 that is a pattern formation area to be made more uniform across the entire projection structure part 13. Therefore, as described above, the hard mask 17a formed in the projection structure part 13 that is a pattern formation area by etching the hard mask material layer 15 by using the pattern structure 41 and the balance layer 37 as etching masks has suppressed variation in dimensional accuracy.

Figure 7E:
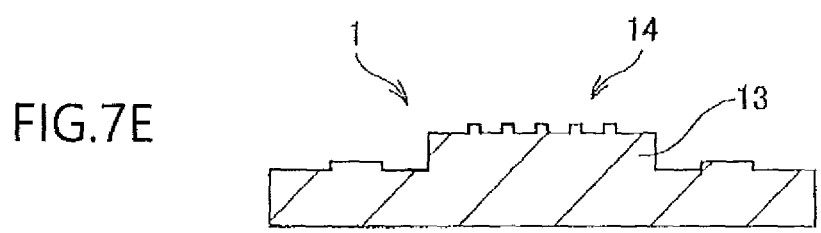

Next, by etching the transfer substrate 11 by using the hard mask 17a and the balance hard mask 17b as etching masks, the replica mold 1 in which the uneven structure 14 is formed in the projection structure part 13 is fabricated (FIG. 7E).

With etching of the transfer substrate 11 using the hard mask 17a and the balance hard mask 17b as etching masks, etching via the hard mask 17a is performed in a uniform and stable manner due to the presence of the balance hard mask 17b. Specifically, by providing the balance hard mask 17b, the influence of the micro-loading effect with respect to etching of the projection structure part 13 via the hard mask 17a can be made more uniform across the entire projection structure part 13. Therefore, the uneven structure 14 formed in the projection structure part 13 has suppressed variation in dimensional accuracy thereof and the replica mold 1 can be fabricated with high accuracy.

Fourth Embodiment

FIGS. 8A to 8E are step diagrams for explaining another embodiment of the imprint method of the present invention.

In the present embodiment, the mold 71 having a mesa structure is used in a similar manner to the second embodiment described above.

Figure 8A:
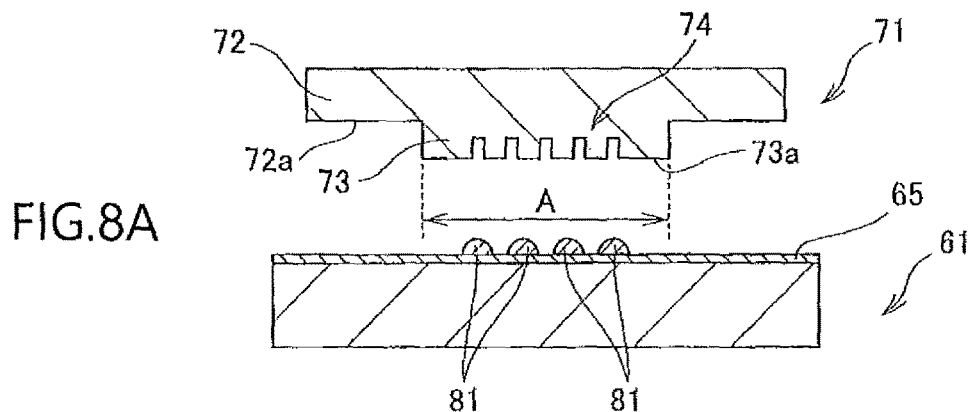
FIGS. 8A to 8E are step diagrams for explaining another embodiment of the imprint method and the mold manufacturing method according to the present invention.

In the present embodiment, first, the hard mask material layer 65 is formed on the transfer substrate 61, and a pattern formation area A for forming a pattern structure is determined on the hard mask material layer 65. The pattern formation area A normally corresponds to the projection structure part 73 of the mold 71. Subsequently, in the resin supply step, droplets of the molded resin 81 are discharged by an ink jet system and supplied to the pattern formation area A on the hard mask material layer 65 (FIG. 8A). The number of the droplets of the molded resin 81 supplied to the transfer substrate 61 and a distance between adjacent droplets can be set in a similar manner to the second embodiment described above.

Figure 8B:
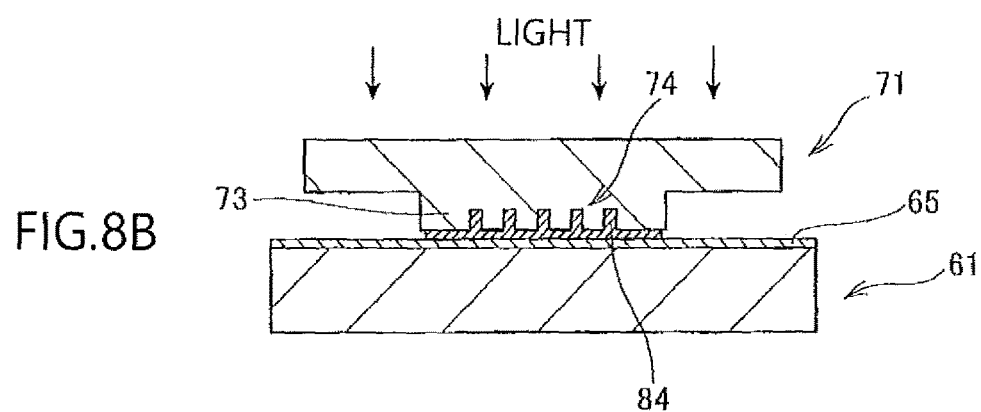

Next, in the contact step, the transfer substrate 61 and the mold 71 are brought close to each other, droplets of the molded resin 81 are spread between the transfer substrate 61 and the mold 71, and a molded resin layer is formed. Subsequently, in the curing step, the molded resin layer is cured to obtain the transfer resin layer 84 on which is formed an uneven structure in which projections and depressions of the uneven structure 74 of the mold 71 are inverted (FIG. 8B).

Figure 8C:
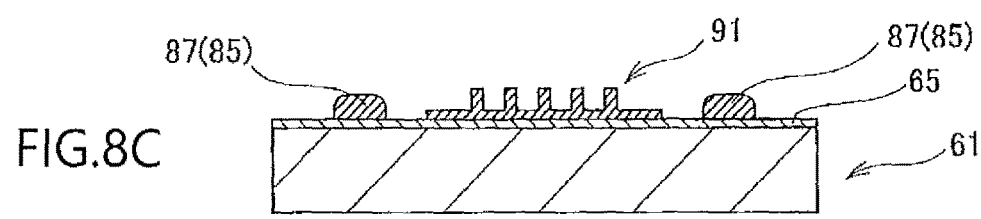

Next, in the mold release step, the transfer resin layer 84 and the mold 71 are separated from each other, and the pattern structure 91 that is the transfer resin layer 84 is positioned on the hard mask material layer 65 of the pattern formation area A of the transfer substrate 61. Subsequently, in the balance layer formation step, the balance layer 85 is formed by an ink jet system in a desired area on the hard mask material layer 65 on the outside of the pattern formation area A, and the balance layer 85 is cured to obtain the balance layer 87 (FIG. 8C). Formation of the balance layer 85 can be performed in a similar manner to the second embodiment described above. In addition, when the molded resin used is a photocurable resin, curing of the balance layer 85 may be performed by directly irradiating the balance layer 85 with light. Furthermore, when the transfer substrate 61 is formed of a light-transmitting material, light irradiation may be performed from the side of the transfer substrate 61 or, alternatively, both direct light irradiation and light irradiation from the side of the transfer substrate 61 may be performed. On the other hand, when the molded resin used is a thermosetting resin, curing may be performed by applying a heating process to the balance layer 85.

Since the balance layer 85 is formed in the balance layer formation step following the mold release step in this manner, the balance layer 85 can be formed using a different resin material from the molded resin 81. In this case, the thickness of the balance layer 85 can be reduced within a range where the balance layer 87 functions as an etching mask in the formation of the hard mask 67 to be described later. For example, the balance layer 85 can be formed using a resin material with low viscosity or a resin material with a higher etching resistance than the molded resin 81. Accordingly, separation and cleaning of the balance layer 87 after hard mask formation can be performed more readily. In addition, since the balance layer 85 is formed after the mold release step, prevention of coming into contact with the mold 21 and the like in the contact step described above need not be taken into consideration when supplying a resin material for forming the balance layer 85. Therefore, a shape and the like of the mold 21 need not be taken into consideration even when setting a distance of separation L1 between the pattern formation area A and the balance layer 85 and setting a shortest distance L2 from an outer edge of the pattern formation area A to an outer edge of the balance layer 85. As a result, various mold shapes can be accommodated.

Figure 8D:
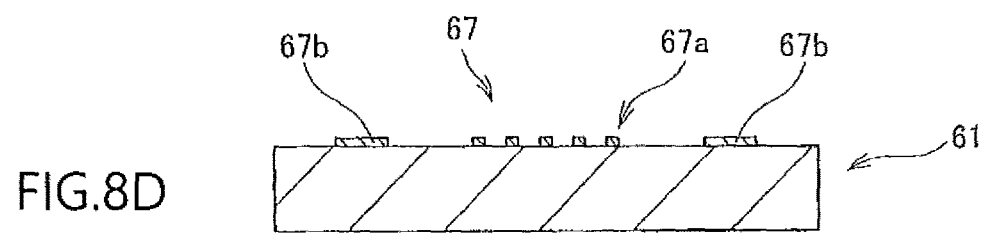

As described above, according to the imprint method of the present invention, the hard mask 67 is formed by etching the hard mask material layer 65 by using the pattern structure 91 formed on the hard mask material layer 65 of the pattern formation area A of the transfer substrate 61 and the balance layer 87 formed on the hard mask material layer 65 on the outside of the pattern formation area A as etching masks (FIG. 8D). The hard mask 67 formed in this manner is constituted by the hard mask 67a which has a fine opening pattern positioned in the pattern formation area A and the balance hard mask 67b which is positioned on the outside of the pattern formation area A.

With etching of the hard mask material layer 65 using the pattern structure 91 and the balance layer 87 as etching masks, as described above, the presence of the balance layer 87 enables an influence of a micro-loading effect with respect to etching of the hard mask material layer 65 in the pattern formation area A to be made more uniform across the entire pattern formation area A. Therefore, as described above, the hard mask 67a formed in the pattern formation area A by etching the hard mask material layer 65 by using the pattern structure 91 and the balance layer 87 as etching masks has suppressed variation in dimensional accuracy.

Figure 8E:
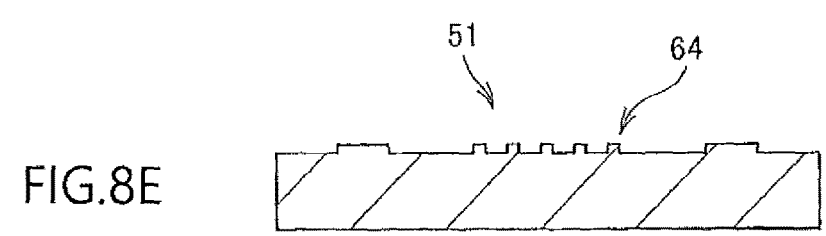

Next, by etching the transfer substrate 61 by using the hard mask 67a and the balance hard mask 67b as etching masks, the replica mold 51 in which the uneven structure 64 is formed in the pattern formation area A is fabricated (FIG. 8E).

With etching of the transfer substrate 61 using the hard mask 67a and the balance hard mask 67b as etching masks, etching via the hard mask 67a is performed in a uniform and stable manner due to the presence of the balance hard mask 67b. Specifically, by providing the balance hard mask 67b, the influence of the micro-loading effect with respect to etching of the pattern formation area A of the transfer substrate 61 can be made more uniform across the entire pattern formation area A. Therefore, the uneven structure 64 formed in the pattern formation area A has suppressed variation in dimensional accuracy thereof and the replica mold 51 can be fabricated with high accuracy.

Fifth Embodiment

FIGS. 9A to 9E are step diagrams for explaining another embodiment of the imprint method of the present invention.

In the present embodiment, a position and dimensions of a balance layer to be formed are adjusted in accordance with a thickness of a remaining film of a pattern structure formed in a pattern formation area. In this case, the remaining film of a pattern structure refers to a portion created on a transfer resin layer due to a gap between a projection of a mold and a transfer substrate. This definition will similarly apply to the description presented hereinafter.

Figure 9A:
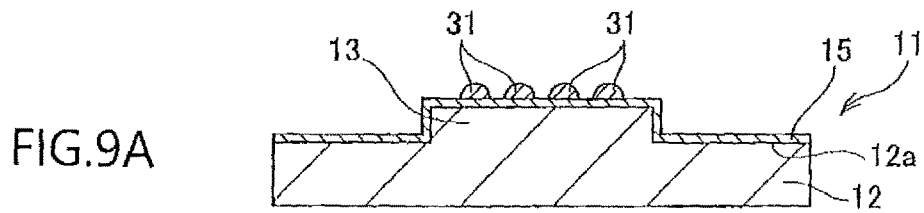
FIGS. 9A to 9E are step diagrams for explaining another embodiment of an imprint method of the present invention.

In the present embodiment, first, the hard mask material layer 15 is formed on the transfer substrate 11, and in the resin supply step, droplets of the molded resin 31 are discharged by an ink jet system and supplied to a desired area on the hard mask material layer 15 of the projection structure part 13 (FIG. 9A). The number of the droplets of the molded resin 31 supplied to the transfer substrate 11 and a distance between adjacent droplets can be set in a similar manner to the first embodiment described above.

Figure 9B:
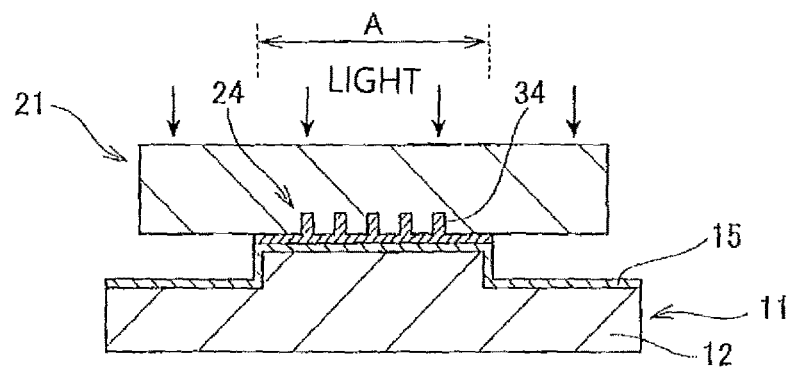

Next, in the contact step, the transfer substrate 11 and the mold 21 are brought close to each other, and droplets of the molded resin 31 are spread between the transfer substrate 11 and the mold 21 to form a molded resin layer. Subsequently, in the curing step, the molded resin layer is cured to obtain the transfer resin layer 34 on which is formed an uneven structure in which projections and depressions of the uneven structure 24 of the mold 21 are inverted (FIG. 9B). The mold 21 used includes the base 22 and the uneven structure 24 positioned in an uneven formation area A that is set on one surface 22a of the base 22.

Figure 9C:
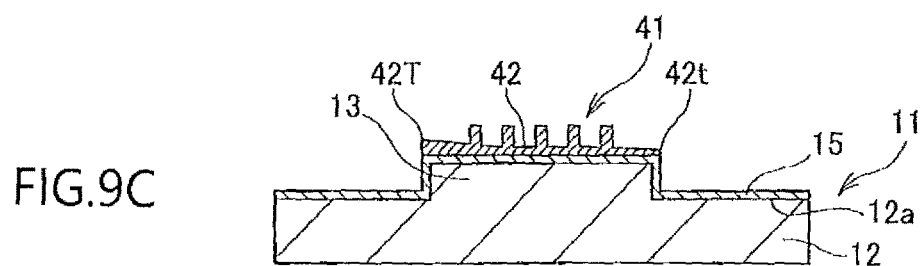

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11 (FIG. 9C).

Subsequently, in the balance layer formation step, the balance layer 35 is formed by an ink jet system in a desired area on the hard mask material layer 15 on the outside of the projection structure part 13 that is a pattern formation area, and the balance layer 35 is cured to obtain the balance layer 37. In the formation of the balance layer 35, first, a thickness distribution of a remaining film 42 of the pattern structure 41 is measured. In addition, a distance from the balance layer 35 positioned in a vicinity of a portion 42$t$ where the thickness of the remaining film 42 of the pattern structure 41 is small to the projection structure part 13 that is a pattern formation area is denoted by L1, and a distance from an outer edge of the balance layer 35 to the projection structure part 13 that is a pattern formation area is denoted by L2. Furthermore, a distance from the balance layer 35 positioned in a vicinity of a portion 42T where the thickness of the remaining film 42 of the pattern structure 41 is large to the projection structure part 13 that is a pattern formation area is denoted by L1', and a distance from an outer edge of the balance layer 35 to the projection structure part 13 that is a pattern formation area is denoted by L2'. Subsequently, the balance layer 35 is formed so as to satisfy a relationship expressed by L2'<L2 or L1<L1', and satisfy a relationship expressed by (L2'−L1')<(L2−L1). The balance layer 35 can be formed such that the distances L1 and L1' are equal to or less than 300 μm and the distances L2 and L2' are equal to or more than 800 μm. It should be noted that, in the present invention, measurements of the thickness of a remaining film of a pattern structure can be performed using a spectroscopic reflectometer (Atlas-M manufactured by Nanometrics Incorporated).

Figure 9D:
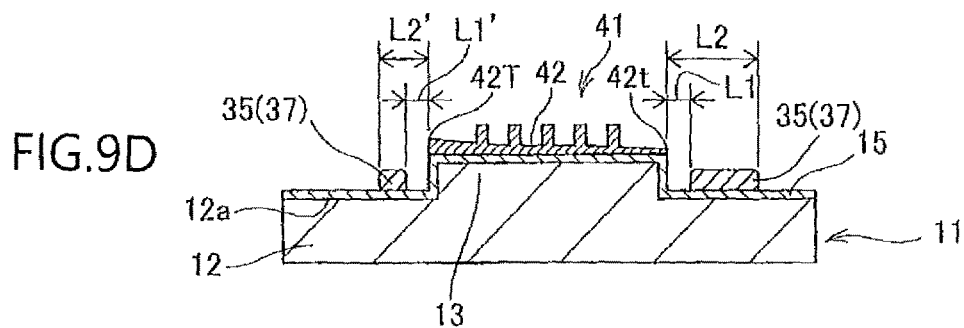
Figure 9E:
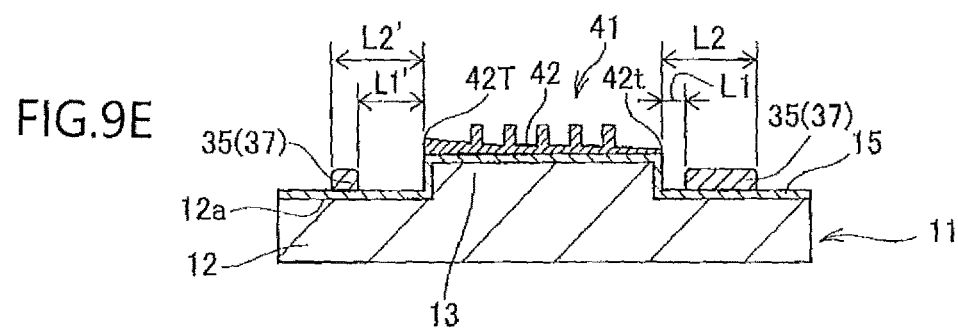
Figure 10:
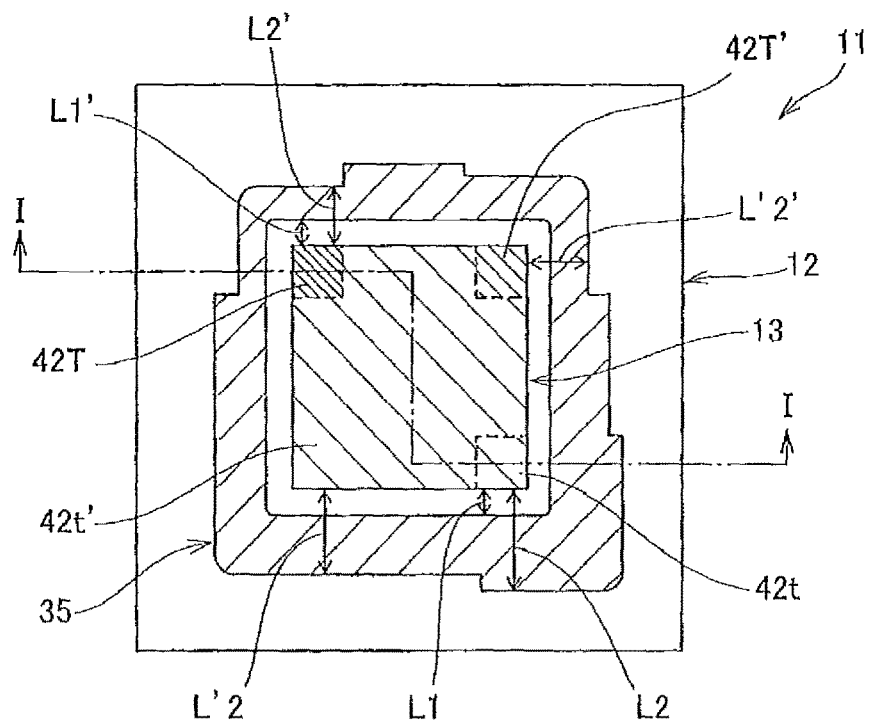
FIG. 10 is a plan view of a transfer substrate on which a balance layer is formed as shown in FIG. 9D.
Figure 11:
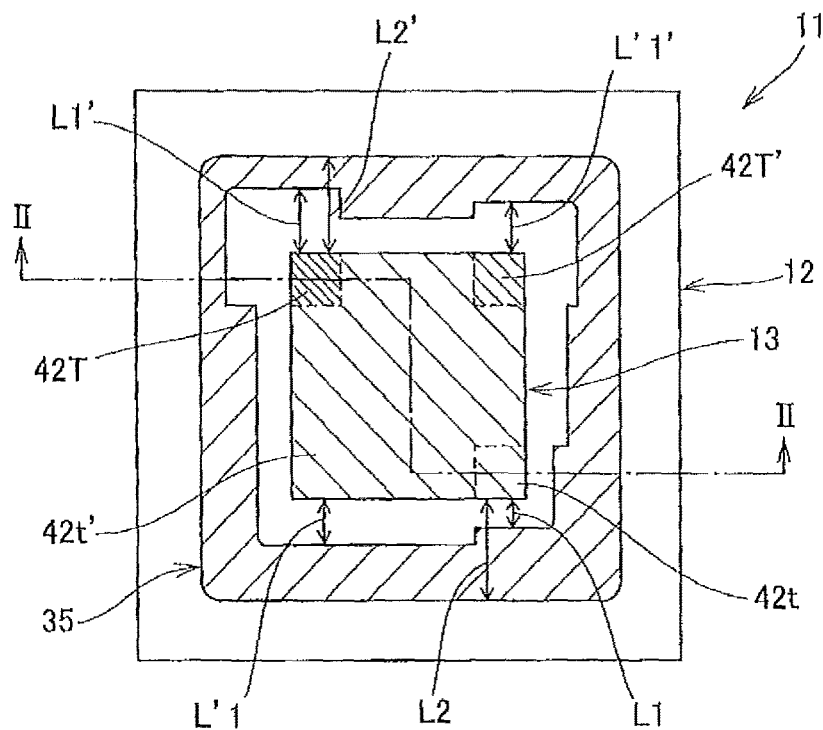
FIG. 11 is a plan view of a transfer substrate on which a balance layer is formed as shown in FIG. 9E.

FIG. 9D shows a case where the balance layer 35 has been formed so as to satisfy a relationship expressed by L2'<L2, and satisfy a relationship expressed by (L2'−L1')<(L2−L1), and FIG. 9E shows a case where the balance layer 35 has been formed so as to satisfy a relationship expressed by L1<L1', and satisfy a relationship expressed by (L2'−L1')<(L2−L1). In addition, FIG. 10 is a plan view of the transfer substrate 11 on which the balance layer 35 is formed as shown in FIG. 9D, and FIG. 11 is a plan view of the transfer substrate 11 on which the balance layer 35 is formed as shown in FIG. 9E. Note that FIG. 9D corresponds to a vertical section taken along line I-I in FIG. 10 and FIG. 9E corresponds to a vertical section taken along line II-II in FIG. 11. In addition, uneven structures of the hard mask material layer 15 and the pattern structure 41 are omitted in FIGS. 10 and 11.

In the examples shown in FIGS. 10 and 11, the remaining film 42 of the pattern structure 41 can be divided into four sections including, in a descending order of thickness, a remaining film 421, a remaining film 421', a remaining film 42$t'$, and a remaining film 42$t$. The respective sections are depicted by hatchings with different pitches.

In FIG. 10, distances from an outer edge of the balance layer 35 positioned in the vicinity of the remaining film 42T, the remaining film 42T', the remaining film 42$t'$, and the remaining film 42$t$ to the projection structure part 13 that is a pattern formation area are, respectively, L2', L'2', L'2, and L2, which satisfy a relationship expressed as L2'<L'2'<L'2<L2.

In addition, in FIG. 11, distances from the balance layer 35 positioned in the vicinity of the remaining film 42T, the remaining film 42T', the remaining film 42$t'$, and the remaining film 42$t$ to the projection structure part 13 that is a pattern formation area are, respectively, L1', L'1', L'1, and L1, which satisfy a relationship expressed as L1'>L'1'>L'1>L1.

When the molded resin used is a photocurable resin, curing of the balance layer 35 may be performed by directly irradiating the balance layer 35 with light. Furthermore, when the transfer substrate 11 is formed of a light-transmitting material, light irradiation may be performed from the side of the transfer substrate 11 or, alternatively, both direct light irradiation and light irradiation from the side of the transfer substrate 11 may be performed. On the other hand, when the molded resin used is a thermosetting resin, curing may be performed by applying a heating process to the balance layer 35.

After curing the balance layer 35 to obtain the balance layer 37 as described above, the hard mask material layer 15 is etched by using the balance layer 37 and the pattern structure 41 formed on the hard mask material layer 15 of the projection structure part 13 of the transfer substrate 11 as etching masks to form the hard mask 17 constituted by the hard mask 17$a$ which has a fine opening pattern positioned on the projection structure part 13 and the balance hard mask 17$b$ which is positioned on the surface 12$a$ on the outside of the projection structure part 13 (refer to FIG. 7D). With etching of the hard mask material layer 15 using the pattern structure 41 and the balance layer 37 as etching masks, as described above, the presence of the balance layer 37 enables an influence of a micro-loading effect with respect to etching of the hard mask material layer 15 in the projection structure part 13 that is a pattern formation area to be made more uniform across the entire projection structure part 13. Furthermore, since the position and dimensions of the balance layer 37 have been adjusted in accordance with the thickness of the remaining film 42 of the pattern structure 41, a decline in etching accuracy due to uneven thickness of the remaining film 42 can be suppressed. Therefore, as described above, the hard mask 17$a$ formed in the projection structure part 13 that is a pattern formation area by etching the hard mask material layer 15 by using the pattern structure 41 and the balance layer 37 as etching masks has suppressed variation in dimensional accuracy.

Next, in a similar manner to the third embodiment, by etching the transfer substrate 11 by using the hard mask 17$a$ and the balance hard mask 17$b$ as etching masks, the replica mold 1 in which the uneven structure 14 is formed in the projection structure part 13 is fabricated (refer to FIG. 7E).

While the balance layer 35 is formed in the balance layer formation step following the mold release step in the embodiment shown in FIGS. 9A to 9E, 10, and 11 described above, a part of the balance layer 35 may be formed in the resin supply step. FIGS. 12A to 12E are step diagrams for explaining such an embodiment.

Figure 12A:
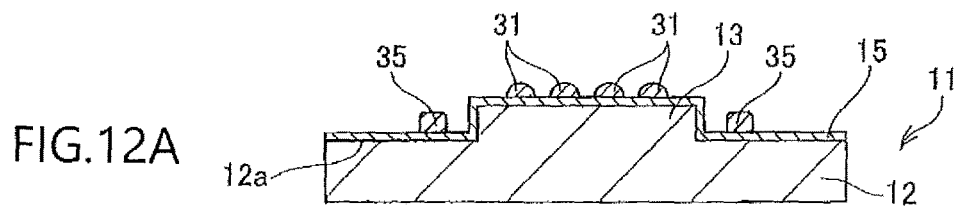
FIGS. 12A to 12E are step diagrams for explaining another embodiment of an imprint method of the present invention.

In the embodiment shown in FIGS. 12A to 12E, in a resin supply step, droplets of the molded resin 31 are discharged by an ink jet system and supplied to a desired area on the hard mask material layer 15 of the projection structure part 13. In addition, the balance layer 35 is formed in a desired area on the hard mask material layer 15 of the surface 12$a$ in an area outside of the projection structure part 13 that is a pattern formation area (FIG. 12A). The balance layer 35 can be formed in, for example, a ring shape such as that shown in FIG. 3.

Figure 12B:
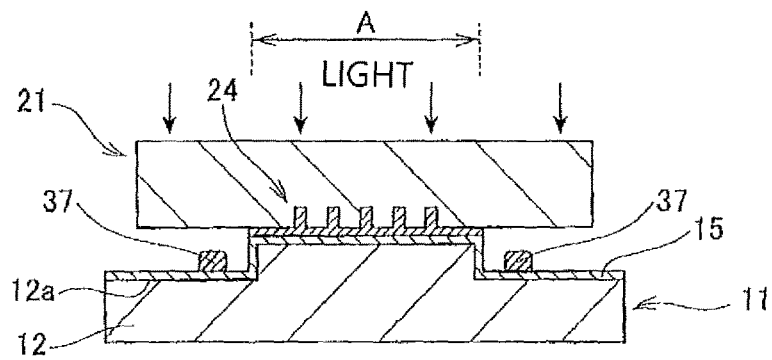

Next, in the contact step, the transfer substrate 11 and the mold 21 are brought close to each other, droplets of the molded resin 31 are spread between the transfer substrate 11 and the mold 21, and a molded resin layer is formed. Subsequently, in the curing step, the molded resin layer is cured to obtain the transfer resin layer 34 on which is formed an uneven structure in which projections and depressions of the uneven structure 24 of the mold 21 are inverted, and the balance layer 35 is cured to obtain the balance layer 37 (FIG. 12B). The mold 21 used includes the base 22 and the uneven structure 24 positioned in an uneven formation area A that is set on one surface 22a of the base 22.

Figure 12C:
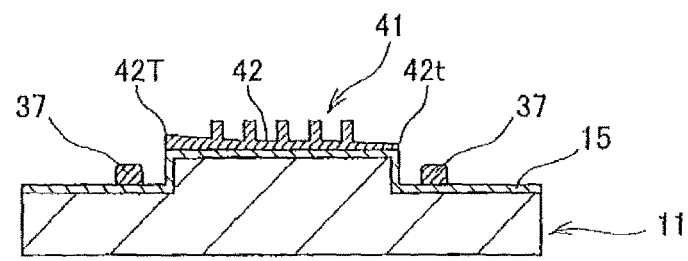

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11 (FIG. 12C).

Figure 12D:
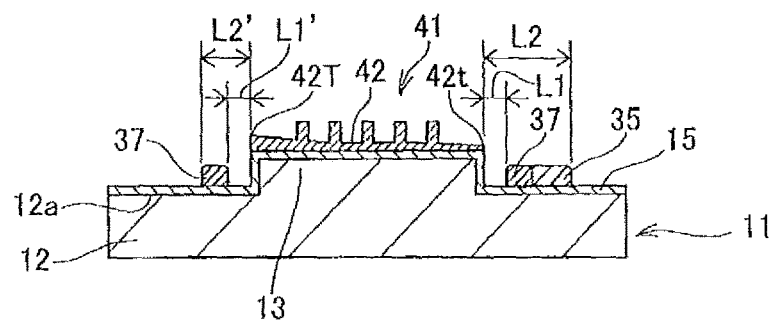
Figure 12E:
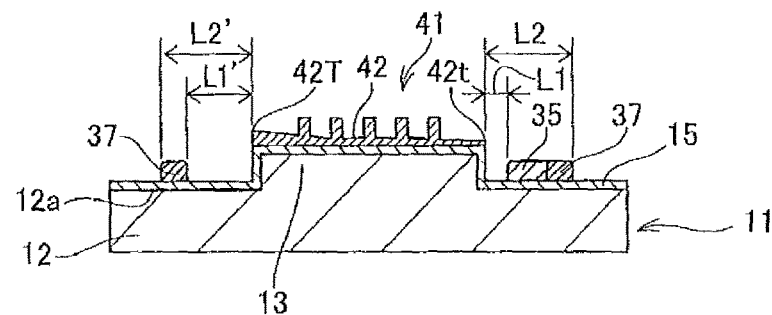

Subsequently, in the balance layer formation step, an additional balance layer 35 is formed by an ink jet system in a desired area on the hard mask material layer 15 on the outside of the projection structure part 13 that is a pattern formation area, and the additional balance layer 35 is cured to obtain a final balance layer 37 (FIGS. 12D and 12E). In the formation of the additional balance layer 35, first, a thickness distribution of the remaining film 42 of the pattern structure 41 is measured. In addition, a distance from the final balance layer 37 positioned in a vicinity of a portion 42t where the thickness of the remaining film 42 of the pattern structure 41 is small to the projection structure part 13 that is a pattern formation area is denoted by L1, and a distance from an outer edge of the balance layer 37 to the projection structure part 13 that is a pattern formation area is denoted by L2. Furthermore, a distance from the final balance layer 37 positioned in a vicinity of a portion 42T where the thickness of the remaining film 42 of the pattern structure 41 is large to the projection structure part 13 that is a pattern formation area is denoted by L1', and a distance from an outer edge of the balance layer 37 to the projection structure part 13 that is a pattern formation area is denoted by L2'. Subsequently, the additional balance layer 35 is formed so as to satisfy a relationship expressed by L2'<L2 or L1<L1', and satisfy a relationship expressed by (L2'−L1')<(L2−L1). The final balance layer 37 can be formed such that the distances L1 and L1' are equal to or less than 300 μm and the distances L2 and L2' are equal to or more than 800 μm.

FIG. 12D shows a case where the additional balance layer 35 is formed on the outside of an already-formed balance layer 37 so as to satisfy a relationship expressed by L2'<L2, and satisfy a relationship expressed by (L2'−L1')<(L2−L1). In addition, FIG. 12E shows a case where the additional balance layer 35 is formed on an inner side of the already-formed balance layer 37 so as to satisfy a relationship expressed by L1<L1', and satisfy a relationship expressed by (L2'−L1')<(L2−L1). Furthermore, an appearance shape of the final balance layer 37 formed in this manner is similar to that of the balance layer 37 shown in FIG. 10 described above in the case of the example shown in FIG. 12D and similar to that of the balance layer 37 shown in FIG. 11 described above in the case of the example shown in FIG. 12E.

After forming the additional balance layer 35 and forming the final balance layer 37 as described above, the replica mold 1 in which the uneven structure 14 is formed on the projection structure part 13 can be fabricated in a similar manner to the third embodiment described above (refer to FIGS. 7D and 7E).

Figure 13A:
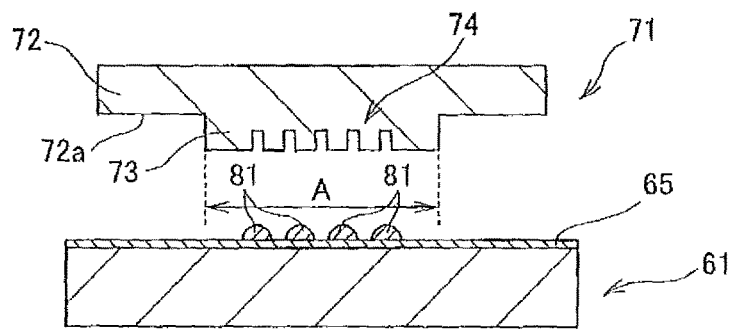
FIGS. 13A to 13E are step diagrams for explaining the other embodiment of an imprint method of the present invention.

In addition, in the present embodiment, as shown in FIG. 13A, the transfer substrate 61 can be used which does not have a mesa structure and has a flat plate shape and which has the hard mask material layer 65 on one main surface 61a.

In this embodiment, first, the hard mask material layer 65 is formed on the transfer substrate 61, and a pattern formation area A for forming a pattern structure is determined on the hard mask material layer 65. The pattern formation area A normally corresponds to the projection structure part 73 of the mold 71. Subsequently, in the resin supply step, droplets of the molded resin 81 are discharged by an ink jet system and supplied to the pattern formation area A on the hard mask material layer 65 (FIG. 13A). The number of the droplets of the molded resin 81 supplied to the transfer substrate 61 and a distance between adjacent droplets can be set in a similar manner to the second embodiment described above.

Figure 13B:
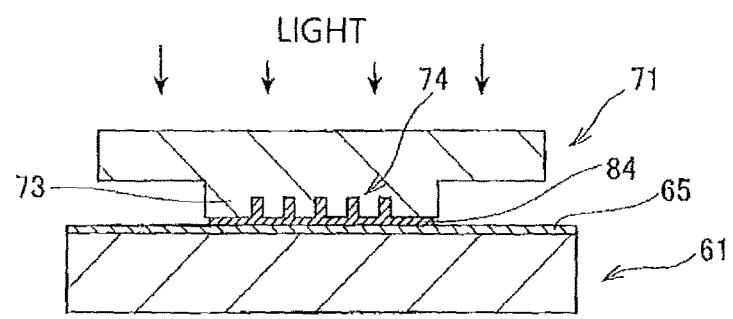

Next, in the contact step, the transfer substrate 61 and the mold 71 are brought close to each other, droplets of the molded resin 81 are spread between the transfer substrate 61 and the mold 71, and a molded resin layer is formed. Subsequently, in the curing step, the molded resin layer is cured to obtain the transfer resin layer 84 on which is formed an uneven structure in which projections and depressions of the uneven structure 74 of the mold 71 are inverted (FIG. 13B).

Figure 13C:
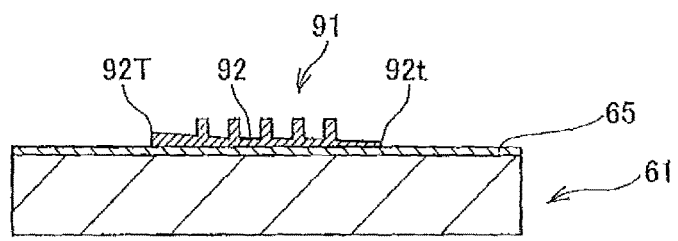

Next, in the mold release step, the transfer resin layer 84 and the mold 71 are separated from each other, and the pattern structure 91 that is the transfer resin layer 84 is positioned on the hard mask material layer 65 of the pattern formation area A of the transfer substrate 61 (FIG. 13C).

Figure 13D:
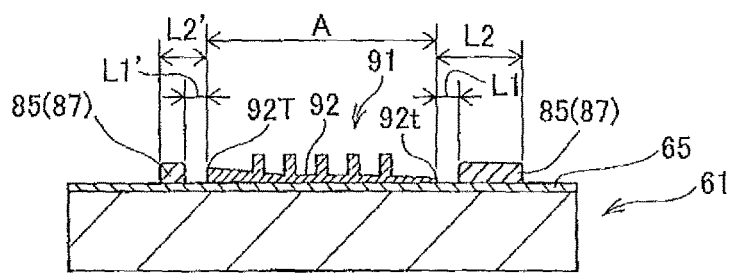
Figure 13E:
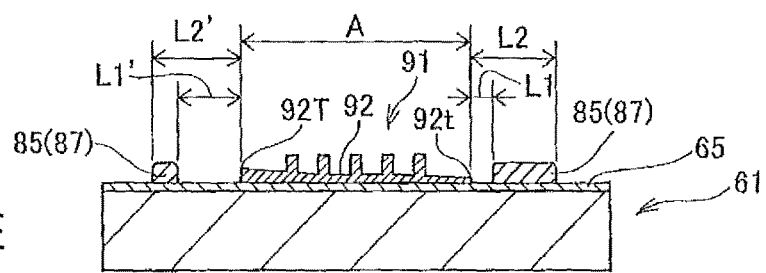

Subsequently, in the balance layer formation step, the balance layer 85 is formed by an ink jet system in a desired area on the hard mask material layer 65 on the outside of the pattern formation area A of the transfer substrate 61, and the balance layer 85 is cured to obtain the balance layer 87 (FIGS. 13D and 13E). In the formation of the balance layer 85, first, a thickness distribution of a remaining film 92 of the pattern structure 91 is measured. In addition, a distance from the balance layer 85 positioned in a vicinity of a portion 92t where the thickness of the remaining film 92 of the pattern structure 91 is small to the pattern formation area A is denoted by L1, and a distance from an outer edge of the balance layer 85 to the pattern formation area A is denoted by L2. In addition, a distance from the balance layer 85 positioned in a vicinity of a portion 92T where the thickness of the remaining film 92 of the pattern structure 91 is large to the pattern formation area A is denoted by L1', and a distance from an outer edge of the balance layer 85 to the pattern formation area A is denoted by L2'. Subsequently, the balance layer 85 is formed so as to satisfy a relationship expressed by L2'<L2 or L1<L1', and satisfy a relationship expressed by (L2'−L1')<(L2−L1). The balance layer can be formed such that the distances L1 and L1' are equal to or less than 300 μm and the distances L2 and L2' are equal to or more than 800 μm.

FIG. 13D shows a case where the balance layer 85 has been formed so as to satisfy a relationship expressed by L2'<L2, and satisfy a relationship expressed by (L2'−L1')<(L2−L1), and FIG. 13E shows a case where the balance layer 85 has been formed so as to satisfy a relationship expressed by L1<L1', and satisfy a relationship expressed by (L2'−L1')<(L2−L1). Furthermore, while an appearance shape of the balance layer 85 formed in this manner is determined based on a thickness distribution of the remaining film 92 of the pattern structure 91 as described above, for example, the appearance shape of the balance layer 85 is similar to that of the balance layer 37 shown in FIG. 10 described above in the case of the example shown in FIG. 13D and similar to that of the balance layer 37 shown in FIG. 11 described above in the case of the example shown in FIG. 13E.

After forming the balance layer 85 and curing the balance layer 85 to form the balance layer 87 as described above, the replica mold 51 in which the uneven structure 64 is formed in the pattern formation area A can be fabricated in a similar manner to the fourth embodiment described above (refer to FIGS. 8D and 8E).

Sixth Embodiment

Figure 14A:
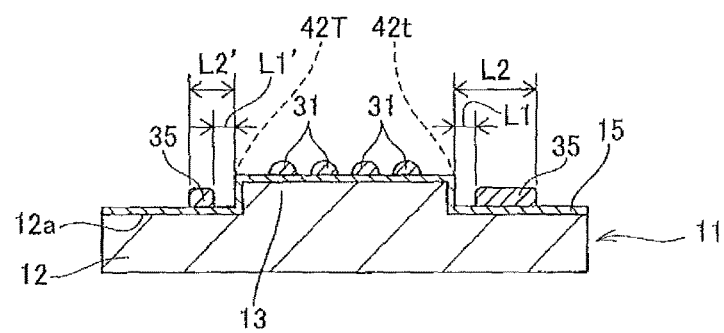
FIGS. 14A to 14C are step diagrams for explaining another embodiment of an imprint method of the present invention.
Figure 14B:
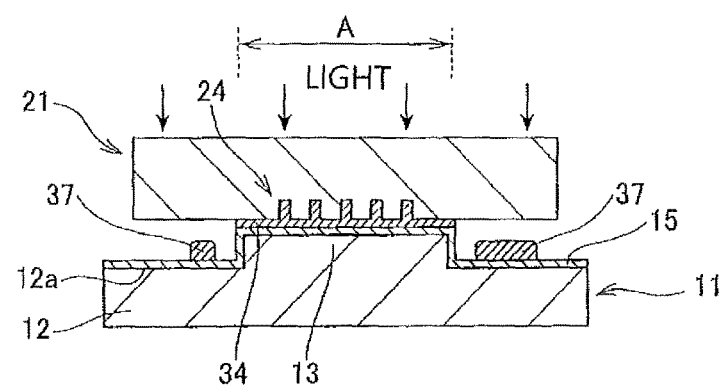
Figure 14C:
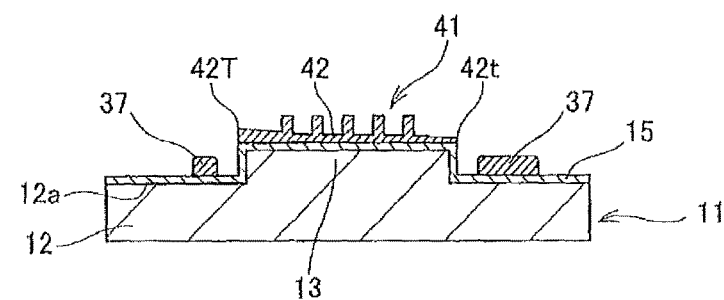

FIGS. 14A to 14C are step diagrams for explaining another embodiment of the imprint method of the present invention.

In the present embodiment, a thickness distribution of a remaining film of a pattern structure formed in a pattern formation area is measured in a plurality of previously performed imprints, and a position and dimensions of a balance layer to be formed are adjusted based on a result of the measurement.

In the present embodiment, first, the hard mask material layer 15 is formed on the transfer substrate 11, and in the resin supply step, droplets of the molded resin 31 are discharged by an ink jet system and supplied to a desired area on the hard mask material layer 15 of the projection structure part 13. In addition, the balance layer 35 is formed in a desired area on the hard mask material layer 15 of the surface 12a in an area outside of the projection structure part 13 that is a pattern formation area (FIG. 14A). The balance layer 35 is formed based on a result of a measurement of a thickness distribution of a remaining film of a pattern structure formed in a pattern formation area in a plurality of previously performed imprints. Specifically, based on a thickness of a remaining film of the pattern structure 41 as determined from the measured thickness distribution of the remaining film, a distance from the balance layer 35 positioned in a vicinity of the portion 42t where the thickness of the remaining film 42 of the pattern structure 41 is small to the projection structure part 13 that is a pattern formation area is denoted by L1, and a distance from an outer edge of the balance layer 35 to the projection structure part 13 that is a pattern formation area is denoted by L2. Furthermore, a distance from the balance layer 35 positioned in a vicinity of the portion 42T where the thickness of the remaining film 42 of the pattern structure 41 is large to the projection structure part 13 that is a pattern formation area is denoted by L1', and a distance from an outer edge of the balance layer 35 to the projection structure part 13 that is a pattern formation area is denoted by L2'. Subsequently, the balance layer 35 is formed so as to satisfy a relationship expressed by L2'<L2, and satisfy a relationship expressed by (L2'−L1')<(L2−L1). In addition, the balance layer 35 can be formed such that the distances L1 and L1' are equal to or less than 300 μm and the distances L2 and L2' are equal to or more than 800 μm.

Figure 15:
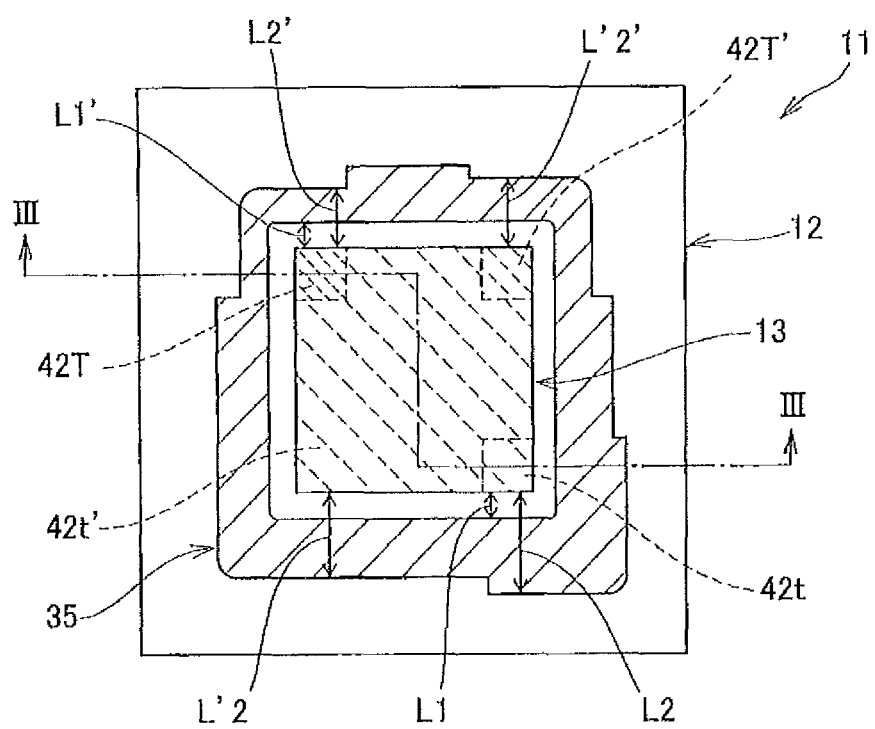
FIG. 15 is a plan view of a transfer substrate on which a balance layer is formed as shown in FIG. 14A.

FIG. 15 is a plan view of the transfer substrate 11 on which the balance layer 35 is formed as shown in FIG. 14A. Note that FIG. 14A corresponds to a vertical section taken along line in FIG. 15 and that, in FIG. 15, the hard mask material layer 15 and the molded resin 31 are omitted. In the example shown in FIG. 15, the remaining film 42 of the pattern structure 41 as determined from a plurality of previously performed imprints are divided into four sections including, in a descending order of thickness, the remaining film 42T, the remaining film 42T', the remaining film 42t', and the remaining film 42t. Note that the respective four sections are depicted by hatchings with different pitches. In addition, in FIG. 15, distances from an outer edge of the balance layer 35 positioned in the vicinity of the remaining film 42T, the remaining film 42T', the remaining film 42t', and the remaining film 42t to the projection structure part 13 that is a pattern formation area are, respectively, L2', L'2', L'2, and L2, which satisfy a relationship expressed as L2'<L'2'<L'2<L2.

Next, in the contact step, the transfer substrate 11 and the mold 21 are brought close to each other, droplets of the molded resin 31 are spread between the transfer substrate 11 and the mold 21, and a molded resin layer is formed. Subsequently, in the curing step, the molded resin layer is cured to obtain the transfer resin layer 34 on which is formed an uneven structure in which projections and depressions of the uneven structure 24 of the mold 21 are inverted, and the balance layer 35 is cured to obtain the balance layer 37 (FIG. 14B).

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11 (FIG. 14C).

After forming the pattern structure 41 and forming the balance layer 37 on the hard mask material layer 15 of the surface 12a in an area outside of the projection structure part 13 that is a pattern formation area as described above, the replica mold 1 in which the uneven structure 14 is formed on the projection structure part 13 can be fabricated in a similar manner to the first embodiment described above (refer to FIGS. 2B and 2C).

Figure 16A:
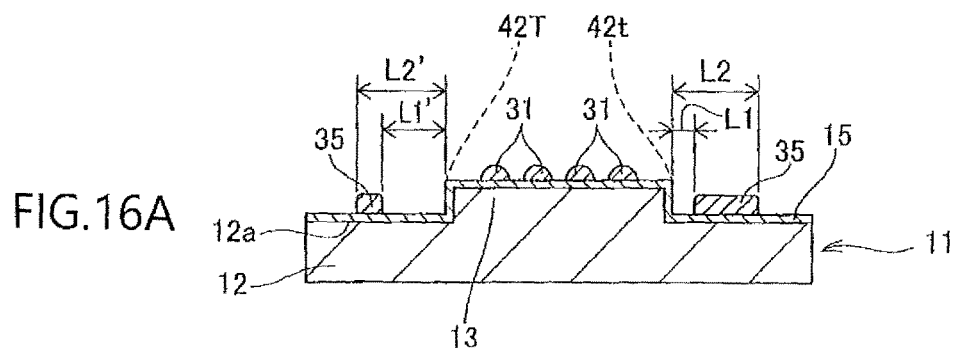
FIGS. 16A to 16C are step diagrams for explaining another embodiment of an imprint method of the present invention.
Figure 16B:
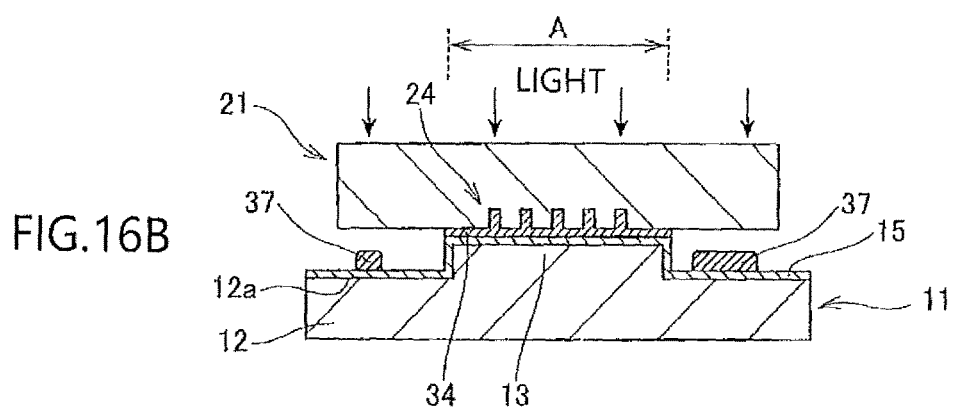
Figure 16C:
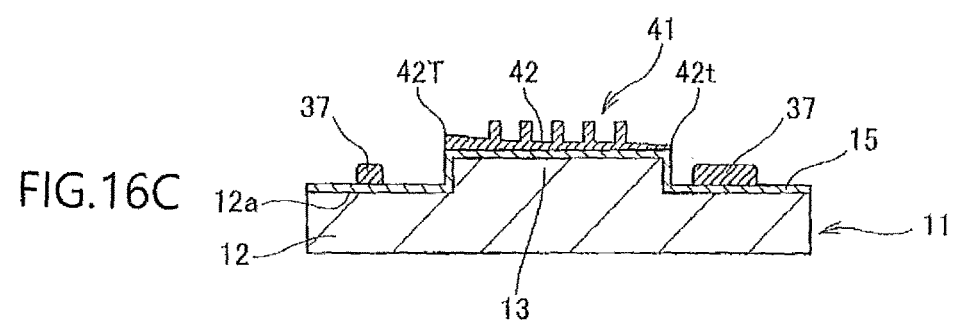

The step diagrams of the imprint method shown in FIGS. 16A to 16C represent an embodiment in which, in a similar manner to the imprint method shown in FIGS. 14A to 14C, a thickness distribution of a remaining film of a pattern structure formed in a pattern formation area is measured in a plurality of previously performed imprints, and a position and dimensions of a balance layer to be formed are adjusted based on a result of the measurement.

Even in this embodiment, first, the hard mask material layer 15 is formed on the transfer substrate 11, and in the resin supply step, droplets of the molded resin 31 are discharged by an ink jet system and supplied to a desired area on the hard mask material layer 15 of the projection structure part 13. In addition, the balance layer 35 is formed in a desired area on the hard mask material layer 15 of the surface 12a in an area outside of the projection structure part 13 that is a pattern formation area (FIG. 16A). Formation of this balance layer 35 can be performed as follows. Specifically, based on a thickness of a remaining film of the pattern structure 41 as determined from the measured thickness distribution of the remaining film, a distance from the balance layer 35 positioned in a vicinity of the portion 42t where the thickness of the remaining film 42 of the pattern structure 41 is small to the projection structure part 13 that is a pattern formation area is denoted by L1, and a distance from an outer edge of the balance layer 35 to the projection structure part 13 that is a pattern formation area is denoted by L2. Furthermore, a distance from the balance layer 35 positioned in a vicinity of the portion 42T where the thickness of the remaining film 42 of the pattern structure 41 is large to the projection structure part 13 that is a pattern formation area is denoted by L1', and a distance from an outer edge of the balance layer 35 to the projection structure part 13 that is a pattern formation area is denoted by L2'. Subsequently, the balance layer 35 is formed so as to satisfy a relationship expressed by L1<L1', and satisfy a relationship expressed by (L2'−L1')<(L2−L1). In addition, the balance layer 35 can be formed such that the distances L1 and L1' are equal to or less than 300 μm and the distances L2 and L2' are equal to or more than 800 μm.

Figure 17:
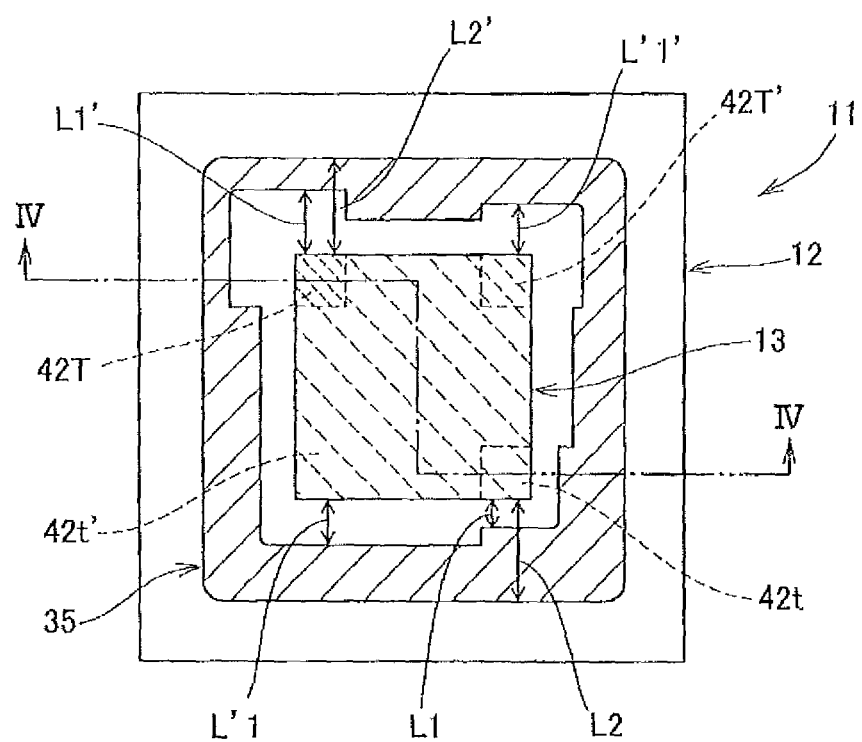
FIG. 17 is a plan view of a transfer substrate on which a balance layer is formed as shown in FIG. 16A.

FIG. 17 is a plan view of the transfer substrate 11 on which the balance layer 35 is formed as shown in FIG. 16A. Note that FIG. 16A corresponds to a vertical section taken along line IV-IV in FIG. 17 and that, in FIG. 17, the hard mask material layer 15 and the molded resin 31 are omitted. In the example shown in FIG. 17, the remaining film 42 of the pattern structure 41 as determined from a plurality of previously performed imprints are divided into four sections including, in a descending order of thickness, the remaining film 42T, the remaining film 42T', the remaining film 42t', and the remaining film 42t. Note that the respective four sections are depicted by hatchings with different pitches. In addition, in FIG. 17, distances from the balance layer 35 positioned in the vicinity of the remaining film 42T, the remaining film 42T', the remaining film 42t', and the remaining film 42t to the projection structure part 13 that is a pattern formation area are, respectively, L1', L'1', L'1, and L1, which satisfy a relationship expressed as L1'>L'1'>L'1>L1.

Next, in the contact step, the transfer substrate 11 and the mold 21 are brought close to each other, droplets of the molded resin 31 are spread between the transfer substrate 11 and the mold 21, and a molded resin layer is formed. Subsequently, in the curing step, the molded resin layer is cured to obtain the transfer resin layer 34 on which is formed an uneven structure in which projections and depressions of the uneven structure 24 of the mold 21 are inverted, and the balance layer 35 is cured to obtain the balance layer 37 (FIG. 16B).

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11 (FIG. 16C).

After forming the pattern structure 41 and forming the balance layer 37 on the hard mask material layer 15 of the surface 12a in an area outside of the projection structure part 13 that is a pattern formation area as described above, the replica mold 1 in which the uneven structure 14 is formed on the projection structure part 13 can be fabricated in a similar manner to the first embodiment described above (refer to FIGS. 2B and 2C).

Figure 18A:
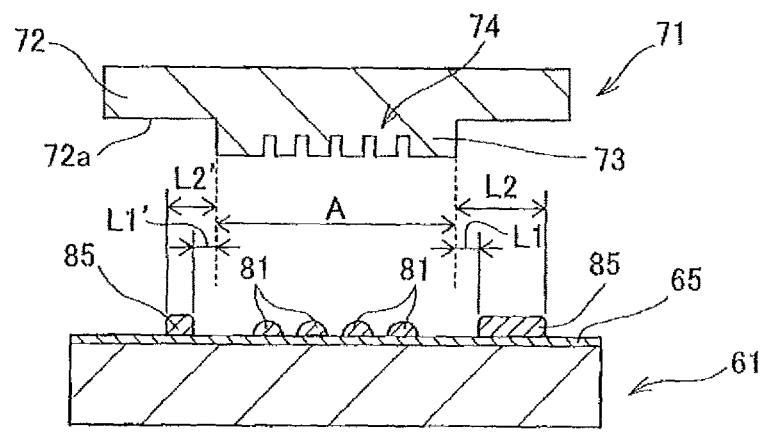
FIGS. 18A to 18C are step diagrams for explaining another embodiment of an imprint method of the present invention.

In addition, in the present embodiment, as shown in FIG. 18A, the transfer substrate 61 can be used which does not have a mesa structure and has a flat plate shape and which has the hard mask material layer 65 on one main surface 61a.

In this embodiment, first, the hard mask material layer 65 is formed on the transfer substrate 61, and a pattern formation area A for forming a pattern structure is determined on the hard mask material layer 65. The pattern formation area A normally corresponds to the projection structure part 73 of the mold 71. Subsequently, in the resin supply step, droplets of the molded resin 81 are discharged by an ink jet system and supplied to the pattern formation area A on the hard mask material layer 65, and the balance layer 85 is formed in a desired area on the hard mask material layer 65 in an area on the outside of the pattern formation area A (FIG. 18A). The balance layer 85 is formed based on a result of a measurement of a thickness distribution of a remaining film of a pattern structure formed in a pattern formation area in a plurality of previously performed imprints. Specifically, based on a thickness of a remaining film of the pattern structure 91 as determined from the measured thickness distribution of the remaining film, a distance from the balance layer 85 positioned in a vicinity of the portion 92t where the thickness of the remaining film 92 of the pattern structure 91 is small to the pattern formation area A is denoted by L1, and a distance from an outer edge of the balance layer 85 to the pattern formation area A is denoted by L2. In addition, a distance from the balance layer 85 positioned in a vicinity of the portion 92T where the thickness of the remaining film 92 of the pattern structure 91 is large to the pattern formation area A is denoted by L1', and a distance from an outer edge of the balance layer 85 to the pattern formation area A is denoted by L2'. Subsequently, the balance layer 85 is formed so as to satisfy a relationship expressed by L2'<L2 or L1<L1', and satisfy a relationship expressed by (L2'-L1')<(L2-L1). In addition, the balance layer 85 can be formed such that the distances L1 and L1' are equal to or less than 300 μm and the distances L2 and L2' are equal to or more than 800 μm. FIG. 18A shows a state where a relationship expressed by L2'<L2 is satisfied, and a relationship expressed by (L2'-L1')<(L2-L1) is satisfied.

Figure 18B:
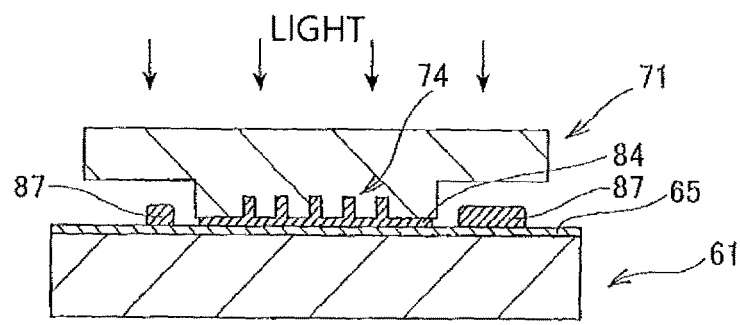

Next, in the contact step, the transfer substrate 61 and the mold 71 are brought close to each other, and droplets of the molded resin 81 are spread between the transfer substrate 61 and the mold 71 to form a molded resin layer. Subsequently, in the curing step, the molded resin layer is cured to obtain the transfer resin layer 84 on which is formed an uneven structure in which projections and depressions of the uneven structure 74 of the mold 71 are inverted, and the balance layer 85 is cured to obtain the balance layer 87 (FIG. 18B).

Figure 18C:
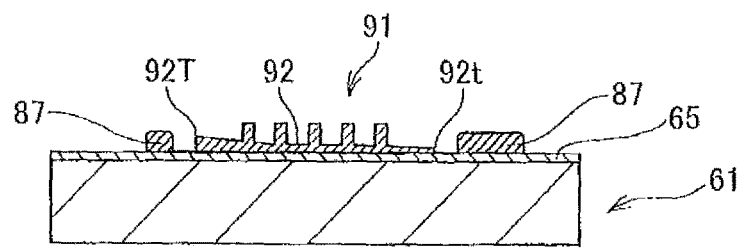

Next, in the mold release step, the transfer resin layer 84 and the mold 71 are separated from each other, and the pattern structure 91 that is the transfer resin layer 84 is positioned on the hard mask material layer 65 of the pattern formation area A of the transfer substrate 61 (FIG. 18C).

After forming the pattern structure 91 and forming the balance layer 87 on the hard mask material layer 65 in an area outside of the pattern formation area A as described above, the replica mold 51 in which the uneven structure 64 is formed in the pattern formation area A can be fabricated in a similar manner to the second embodiment described above (refer to FIGS. 5B and 5C).

Seventh Embodiment

FIGS. 19A to 19D are step diagrams for explaining another embodiment of the imprint method of the present invention.

In the present embodiment, coverage for a balance layer is adjusted in accordance with a thickness of a remaining film of a pattern structure formed in a pattern formation area. Note that, as described above, coverage for a balance layer refers to a proportion of an area covered by the molded resin in a unit area of the balance layer.

Figure 19A:
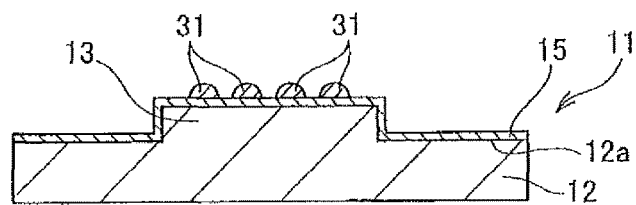
FIGS. 19A to 19D are step diagrams for explaining another embodiment of an imprint method of the present invention.

In the present embodiment, first, the hard mask material layer 15 is formed on the transfer substrate 11, and in the resin supply step, droplets of the molded resin 31 are discharged by an ink jet system and supplied to a desired area on the hard mask material layer 15 of the projection structure part 13 (FIG. 19A). The number of the droplets of the molded resin 31 supplied to the transfer substrate 11 and a distance between adjacent droplets can be set in a similar manner to the first embodiment described above.

Figure 19B:
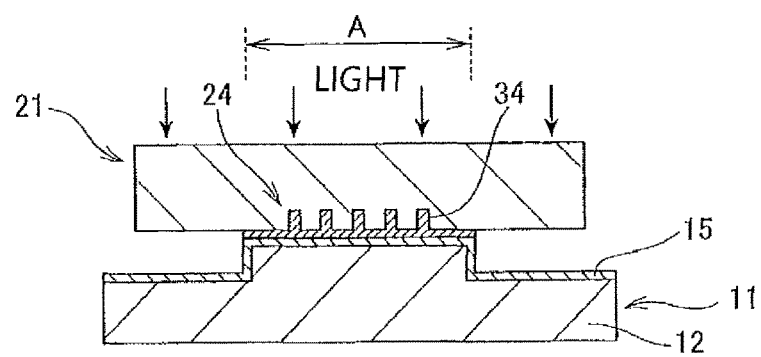

Next, in the contact step, the transfer substrate 11 and the mold 21 are brought close to each other, droplets of the molded resin 31 are spread between the transfer substrate 11 and the mold 21, and a molded resin layer is formed. Subsequently, in the curing step, the molded resin layer is cured to obtain the transfer resin layer 34 on which is formed an uneven structure in which projections and depressions of the uneven structure 24 of the mold 21 are inverted (FIG. 19B). The mold 21 used includes the base 22 and the uneven structure 24 positioned in an uneven formation area A that is set on one surface 22a of the base 22.

Figure 19C:
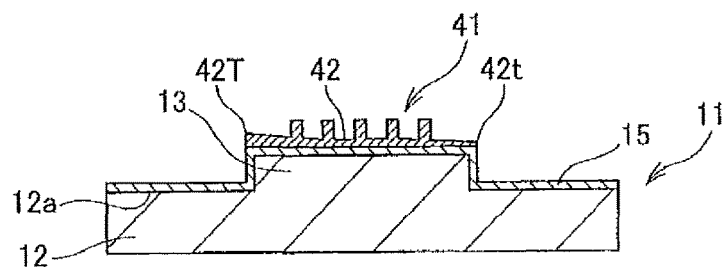

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11 (FIG. 19C).

Figure 19D:
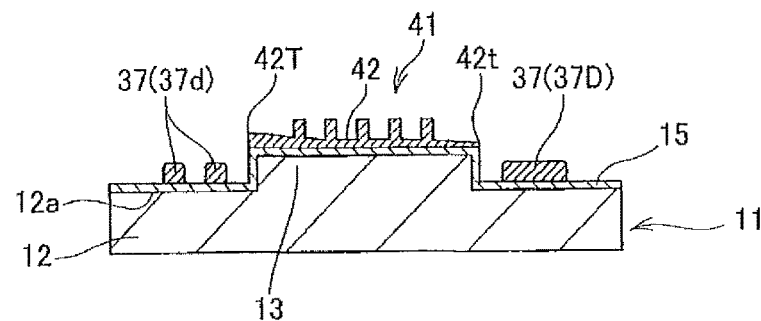

Subsequently, in the balance layer formation step, the balance layer 35 is formed by an ink jet system in a desired area on the hard mask material layer 15 on the outside of the projection structure part 13 that is a pattern formation area, and the balance layer 35 is cured to obtain the balance layer 37 (FIG. 19D). In the formation of the balance layer 35, first, a thickness distribution of the remaining film 42 of the pattern structure 41 is measured. In addition, the balance layer 35 is formed such that coverage for the balance layer 35 positioned in a vicinity of the portion 42t where thickness of the remaining film 42 of the pattern structure 41 is small is greater than coverage for the balance layer 35 positioned in a vicinity of the portion 42T where thickness of the remaining film 42 of the pattern structure 41 is large. Furthermore, the balance layer 35 can be formed such that a distance of separation between the projection structure part 13 that is a pattern formation area and the balance layer 35 is equal to or less than 300 μm and a shortest distance from an outer edge of the projection structure part 13 that is a pattern formation area to an outer edge of the balance layer 35 is equal to or more than 800 μm.

Figure 20:
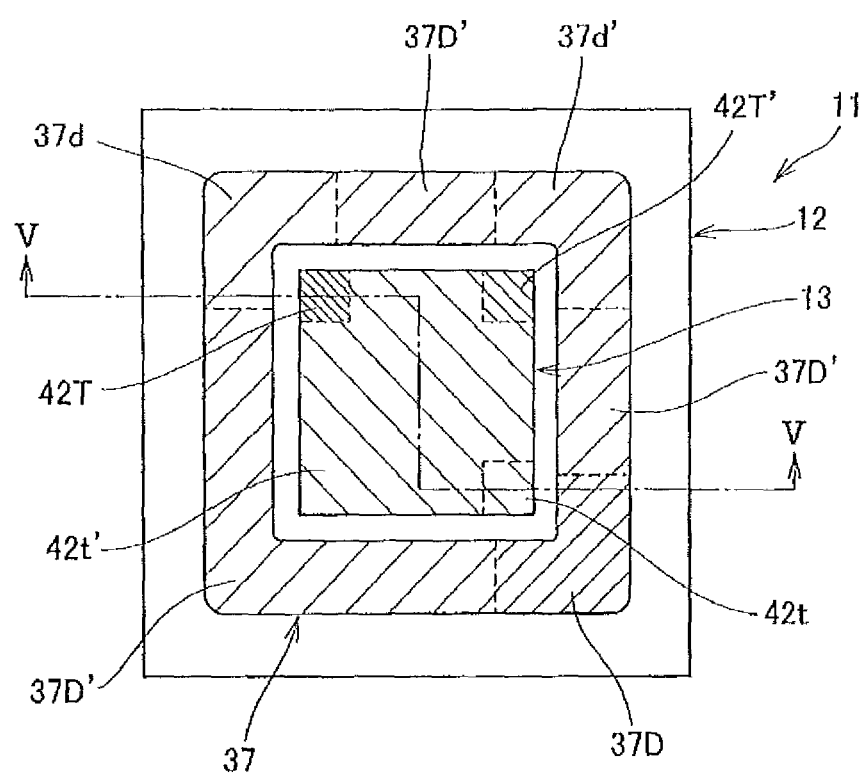
FIG. 20 is a plan view of a transfer substrate on which a balance layer is formed as shown in FIG. 19D.

FIG. 20 is a plan view of the transfer substrate 11 on which the balance layer 35 is formed as shown in FIG. 19D, and FIG. 19D corresponds to a vertical section taken along line V-V in FIG. 20. In addition, uneven structures of the hard mask material layer 15 and the pattern structure 41 are omitted in FIG. 20.

In the example shown in FIG. 20, the remaining film 42 of the pattern structure 41 is divided into four sections including, in a descending order of thickness, the remaining film 42T, the remaining film 42T', the remaining film 42t', and the remaining film 42t. The respective sections are depicted by hatchings with different pitches. An appearance shape of the balance layer 37 formed on the hard mask material layer 15 on the outside of the projection structure part 13 that is a pattern formation area is a ring shape which encloses a periphery of the projection structure part 13. As shown in FIG. 20, the balance layer 37 positioned in the vicinity of the remaining film 42T, the remaining film 42T', the remaining film 42t', and the remaining film 42t is constituted by four portions 37d, 37d', 37D', and 37D with different coverages, and the coverages for the respective portions satisfy a relationship expressed as 37d<37d'<37D'<37D. In other words, as the thickness of the remaining film of the pattern structure 41 becomes thinner (42T>42T'>42t'>42t), coverage for the balance layer 35 positioned in a vicinity thereof increases (37d<37d'<37D'<37D). Note that the respective portions with different coverages of the balance layer 37 are depicted by hatchings with different pitches.

Figure 21A:
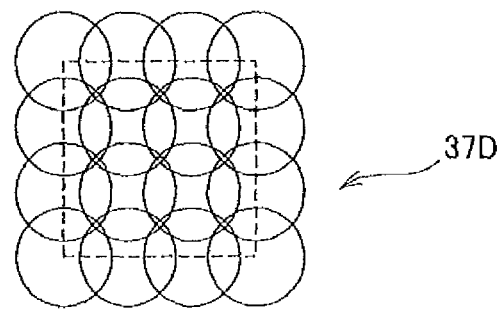
FIGS. 21A to 21D are diagrams for explaining an example of a covered state at four portions with different coverages which constitute a balance layer.
Figure 21B:
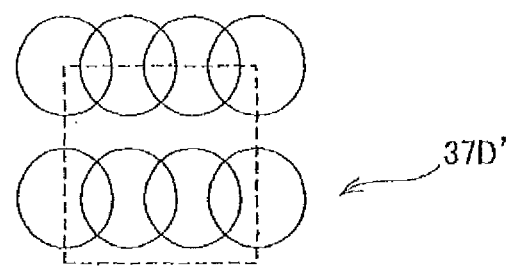
Figure 21C:
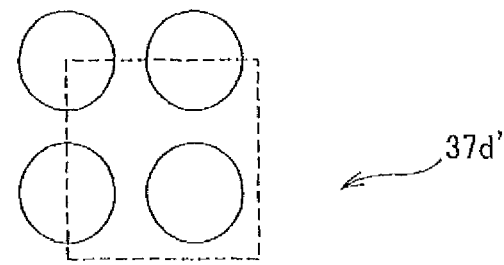
Figure 21D:
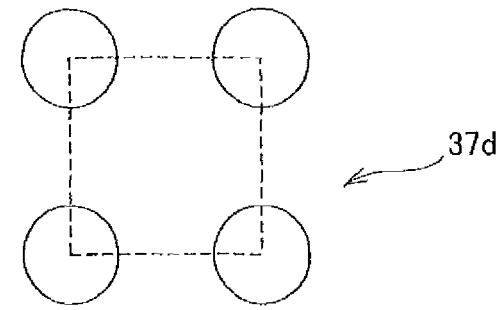

FIGS. 21A to 21D are diagrams for explaining an example of a covered state at the four portions 37d, 37d', 37D', and 37D with different coverages which constitute the balance layer 37. In FIG. 21, one droplet of a molded resin supplied in order to form the balance layer 35 is depicted as one circular shape. In the example shown in FIG. 21, the portion 37D with highest coverage has 100% (a solid state) coverage (FIG. 21A) while the molded resin exists in an insular manner in the portions 37D', 37d', and 37d. In addition, coverage for the portion 37D' is approximately 85% (FIG. 21B), coverage for the portion 37d' is 38% (FIG. 21C), and coverage for the portion 37d with lowest coverage is 17% (FIG. 21D). In FIG. 21, a droplet of the supplied molded resin is depicted as a circular shape for the sake of convenience. However, for example, as shown in FIGS. 21A and 21B, when droplets of the supplied molded resin connect with each other, the droplets deform and coverage increases from the coverage at the time of supply. In comparison, as shown in FIGS. 21C and 21D, when droplets of the supplied molded resin are mutually independent, the droplets do not deform and the coverage at the time of supply is maintained.

After curing the balance layer 35 to obtain the balance layer 37 as described above, the hard mask material layer 15 is etched by using the balance layer 37 and the pattern structure 41 formed on the hard mask material layer 15 of the projection structure part 13 of the transfer substrate 11 as etching masks. Accordingly, the hard mask 17 constituted by the hard mask 17a which has a fine opening pattern positioned on the projection structure part 13 and the balance hard mask 17b which is positioned on the surface 12a on the outside of the projection structure part 13 is formed (refer to FIG. 7D). With etching of the hard mask material layer 15 using the pattern structure 41 and the balance layer 37 as etching masks, as described above, the presence of the balance layer 37 enables an influence of a micro-loading effect with respect to etching of the hard mask material layer 15 in the projection structure part 13 that is a pattern formation area to be made more uniform across the entire projection structure part 13. Furthermore, since the coverage for the balance layer 37 has been adjusted in accordance with the thickness of the remaining film 42 of the pattern structure 41, a decline in etching accuracy due to uneven thickness of the remaining film 42 can be suppressed. Therefore, as described above, the hard mask 17a formed in the projection structure part 13 that is a pattern formation area by etching the hard mask material layer 15 by using the pattern structure 41 and the balance layer 37 as etching masks has suppressed variation in dimensional accuracy.

Next, by etching the transfer substrate 11 by using the hard mask 17a and the balance hard mask 17b as etching masks, the replica mold 1 in which the uneven structure 14 is formed in the projection structure part 13 is fabricated in a similar manner to the third embodiment described above (refer to FIG. 7E).

While the balance layer 35 is formed in the balance layer formation step following the mold release step in the embodiment shown in FIGS. 19A to 19D, 20, and 21A to 21D described above, a part of the balance layer 35 may be formed in the resin supply step. FIGS. 22A to 22D are step diagrams for explaining such an embodiment.

Figure 22A:
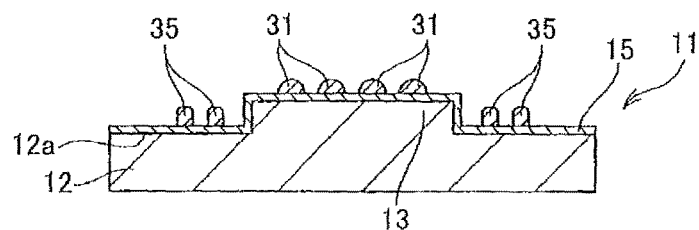
FIGS. 22A to 22D are step diagrams for explaining another embodiment of an imprint method of the present invention.

In the embodiment shown in FIGS. 22A to 22D, in the resin supply step, droplets of the molded resin 31 are discharged by an ink jet system and supplied to a desired area on the hard mask material layer 15 of the projection structure part 13. In addition, the balance layer 35 is formed in a desired area on the hard mask material layer 15 of the surface 12a in an area outside of the projection structure part 13 that is a pattern formation area (FIG. 22A). The balance layer 35 can be formed so as to have low coverage within a range where a function as the balance layer can be exhibited. For example, the balance layer 35 can be formed in a state where coverage is 17% as shown in FIG. 21D.

Figure 22B:
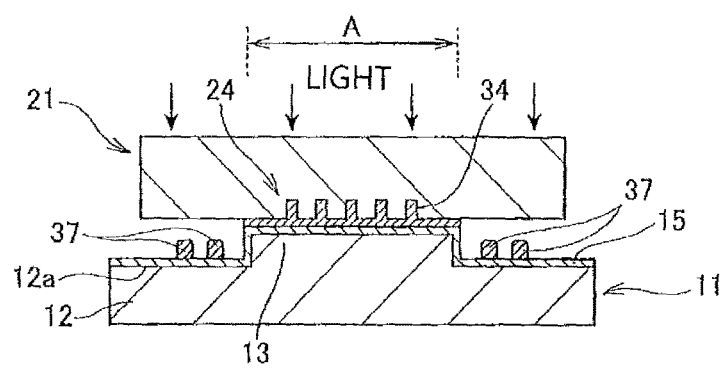

Next, in the contact step, the transfer substrate 11 and the mold 21 are brought close to each other, droplets of the molded resin 31 are spread between the transfer substrate 11 and the mold 21, and a molded resin layer is formed. Subsequently, in the curing step, the molded resin layer is cured to obtain the transfer resin layer 34 on which is formed an uneven structure in which projections and depressions of the uneven structure 24 of the mold 21 are inverted, and the balance layer 35 is cured to obtain the balance layer 37 (FIG. 22B). The mold 21 used includes the base 22 and the uneven structure 24 positioned in an uneven formation area A that is set on one surface 22a of the base 22.

Figure 22C:
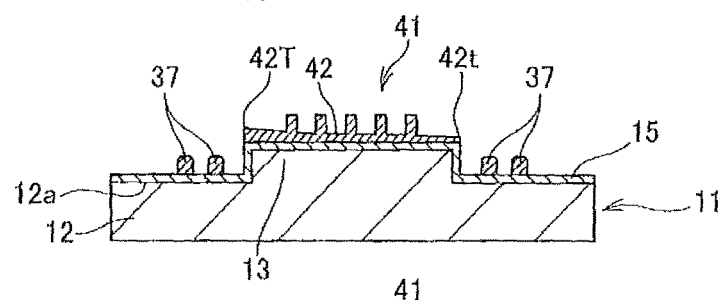
Figure 22D:
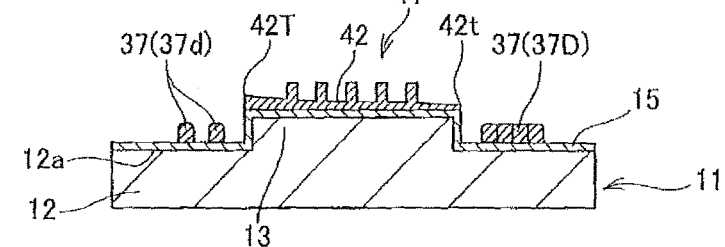

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11 (FIG. 22C).

Subsequently, in the balance layer formation step, the additional balance layer 35 is formed by an ink jet system in a desired area on the hard mask material layer 15 on the outside of the projection structure part 13 that is a pattern formation area, and the additional balance layer 35 is cured to obtain the final balance layer 37. In the formation of the additional balance layer 35, first, a thickness distribution of the remaining film 42 of the pattern structure 41 is measured. In addition, the additional balance layer 35 is formed such that coverage for the final balance layer 37 positioned in a vicinity of the portion 42t where thickness of the remaining film 42 of the pattern structure 41 is small is greater than coverage for the final balance layer 37 positioned in a vicinity of the portion 42T where thickness of the remaining film 42 of the pattern structure 41 is large. For example, when coverage for the initially formed balance layer 35 is 17% and coverage for the final balance layer 37 is as shown in FIG. 20, the molded resin can be supplied so that the coverages for the portions 37d', 37D', and 37D of the balance layer become 38%, approximately 85%, and 100%. Furthermore, the additional balance layer 35 can be formed such that a distance of separation between the projection structure part 13 that is a pattern formation area and the final balance layer 37 is equal to or less than 300 μm and a shortest distance from an outer edge of the projection structure part 13 that is a pattern formation area to an outer edge of the final balance layer 35 is equal to or more than 800 μm.

After forming the additional balance layer 35 and forming the final balance layer 37 as described above, the replica mold 1 in which the uneven structure 14 is formed on the projection structure part 13 can be fabricated in a similar manner to the third embodiment described above (refer to FIGS. 7D and 7E).

Figure 23A:
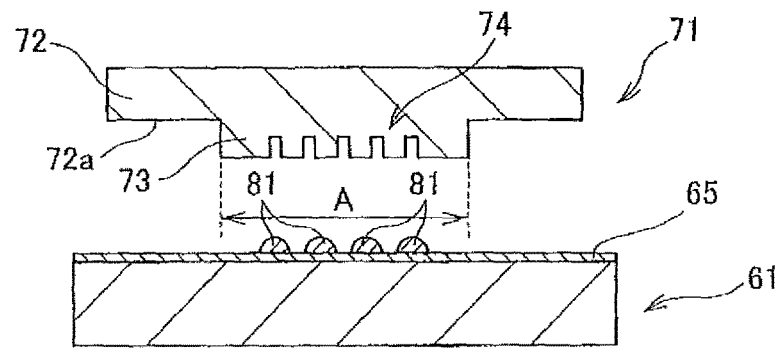
FIGS. 23A to 23D are step diagrams for explaining another embodiment of an imprint method of the present invention.

In addition, in the present embodiment, as shown in FIG. 23A, the transfer substrate 61 can be used which does not have a mesa structure and has a flat plate shape and which has the hard mask material layer 65 on one main surface 61a.

In this embodiment, first, the hard mask material layer 65 is formed on the transfer substrate 61, and a pattern formation area A for forming a pattern structure is determined on the hard mask material layer 65. The pattern formation area A normally corresponds to the projection structure part 73 of the mold 71. Subsequently, in the resin supply step, droplets of the molded resin 81 are discharged by an ink jet system and supplied to the pattern formation area A on the hard mask material layer 65 (FIG. 23A). The number of the droplets of the molded resin 81 supplied to the transfer substrate 61 and a distance between adjacent droplets can be set in a similar manner to the second embodiment described above.

Figure 23B:
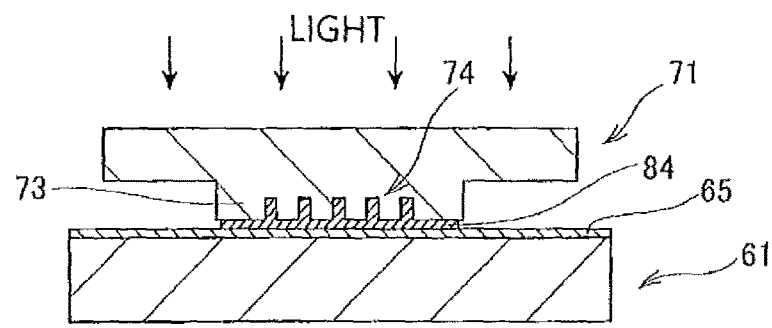

Next, in the contact step, the transfer substrate 61 and the mold 71 are brought close to each other, droplets of the molded resin 81 are spread between the transfer substrate 61 and the mold 71, and a molded resin layer is formed. Subsequently, in the curing step, the molded resin layer is cured to obtain the transfer resin layer 84 on which is formed an uneven structure in which projections and depressions of the uneven structure 74 of the mold 71 are inverted (FIG. 23B).

Figure 23C:
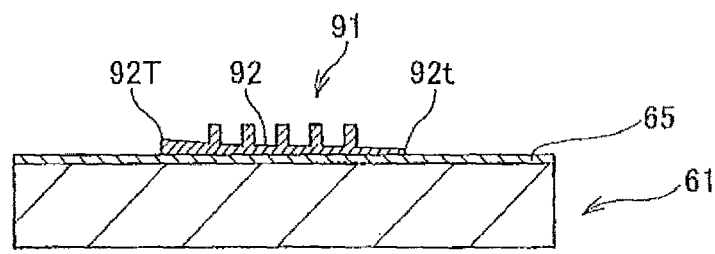

Next, in the mold release step, the transfer resin layer 84 and the mold 71 are separated from each other, and the pattern structure 91 that is the transfer resin layer 84 is positioned on the hard mask material layer 65 of the pattern formation area A of the transfer substrate 61 (FIG. 23C).

Figure 23D:
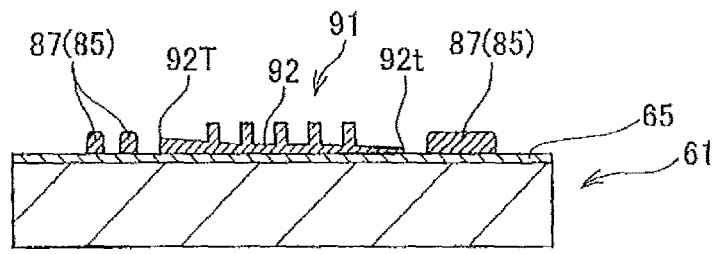

Subsequently, in the balance layer formation step, the balance layer 85 is formed by an ink jet system in a desired area on the hard mask material layer 65 on the outside of the pattern formation area A of the transfer substrate 61, and the balance layer 85 is cured to obtain the balance layer 87 (FIG. 23D). In the formation of the balance layer 85, first, a thickness distribution of the remaining film 92 of the pattern structure 91 is measured. In addition, the balance layer 85 is formed such that coverage for the balance layer 87 positioned in a vicinity of the portion 92t where thickness of the remaining film 92 of the pattern structure 91 is small is greater than coverage for balance layer 87 positioned in a vicinity of the portion 92T where thickness of the remaining film 92 of the pattern structure 91 is large. In addition, the balance layer 85 can be formed such that a distance of separation between the pattern formation area A and the balance layer 87 is 300 μm or less and a shortest distance from an outer edge of the pattern formation area A to an outer edge of the balance layer 87 is 800 μm or more.

After forming the balance layer 85 and curing the balance layer 85 to form the balance layer 87 as described above, the replica mold 51 in which the uneven structure 64 is formed in the pattern formation area A can be fabricated in a similar manner to the fourth embodiment described above (refer to FIGS. 8D and 8E).

Eighth Embodiment

Figure 24A:
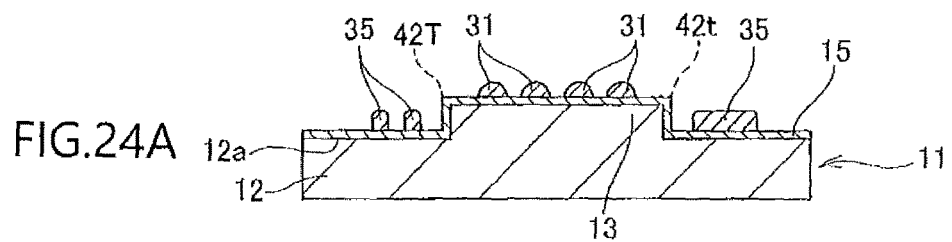
FIGS. 24A to 24C are step diagrams for explaining another embodiment of an imprint method of the present invention.
Figure 24B:
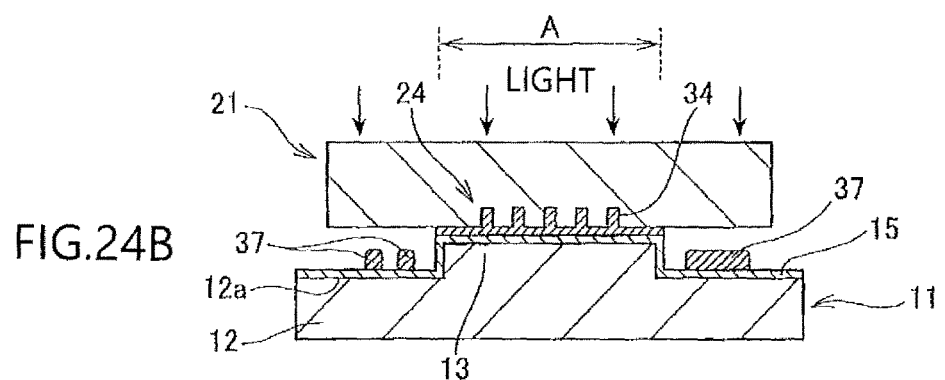
Figure 24C:
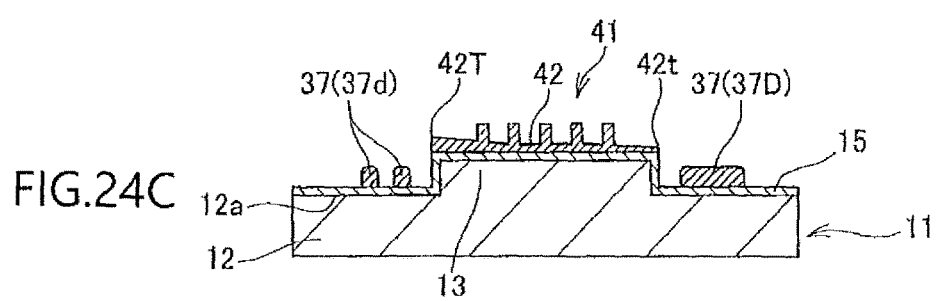

FIGS. 24A to 24C are step diagrams for explaining another embodiment of the imprint method of the present invention.

In the present embodiment, a thickness distribution of a remaining film of a pattern structure formed in a pattern formation area is measured in a plurality of previously performed imprints and coverage for a balance layer is adjusted based on a result of the measurement.

In the present embodiment, first, the hard mask material layer 15 is formed on the transfer substrate 11, and in the resin supply step, droplets of the molded resin 31 are discharged by an ink jet system and supplied to a desired area on the hard mask material layer 15 of the projection structure part 13. In addition, the balance layer 35 is formed in a desired area on the hard mask material layer 15 of the surface 12a in an area outside of the projection structure part 13 that is a pattern formation area (FIG. 24A). The balance layer 35 is formed based on a result of a measurement of a thickness distribution of a remaining film of a pattern structure formed in a pattern formation area in a plurality of previously performed imprints. Specifically, based on the thickness of the remaining film of the pattern structure 41 as determined from the measured thickness distribution of the remaining film, the balance layer 35 is formed such that coverage for the balance layer 35 positioned in a vicinity of the portion 42t where thickness of the remaining film 42 of the pattern structure 41 is small is greater than coverage for the balance layer 35 positioned in a vicinity of the portion 42T where thickness of the remaining film 42 of the pattern structure 41 is large. Furthermore, the balance layer 35 can be formed such that a distance of separation between the projection structure part 13 that is a pattern formation area and the balance layer 37 is equal to or less than 300 µm and a shortest distance from an outer edge of the projection structure part 13 that is a pattern formation area to an outer edge of the balance layer 37 is equal to or more than 800 µm.

Figure 25:
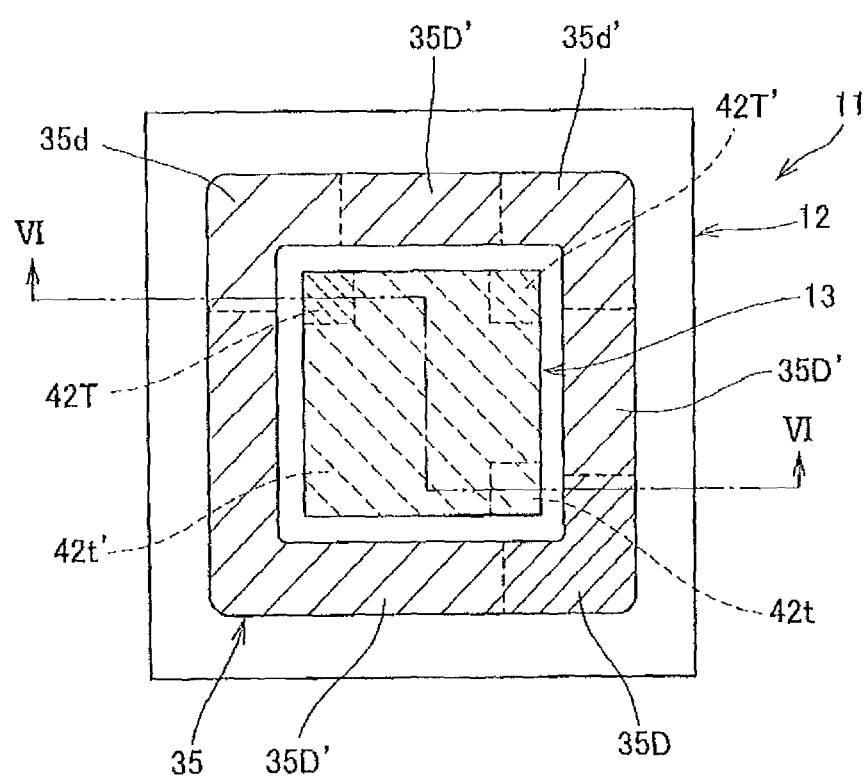
FIG. 25 is a plan view of a transfer substrate on which a balance layer is formed as shown in FIG. 24A.

FIG. 25 is a plan view of the transfer substrate 11 on which the balance layer 35 is formed as shown in FIG. 24A, and FIG. 24A corresponds to a vertical section taken along line VI-VI in FIG. 25. In addition, the hard mask material layer 15 and the molded resin 31 are omitted in FIG. 25.

In the example shown in FIG. 25, the remaining film 42 of the pattern structure 41 as determined from a plurality of previously performed imprints are divided into four sections including, in a descending order of thickness, the remaining film 42T, the remaining film 42T', the remaining film 42t', and the remaining film 42t. In the example shown in the drawing, the respective sections are depicted by hatchings with different pitches. An appearance shape of the balance layer 35 formed on the hard mask material layer 15 on the outside of the projection structure part 13 that is a pattern formation area is a ring shape which encloses a periphery of the projection structure part 13. As shown in FIG. 25, the balance layer 35 positioned in the vicinity of the remaining film 42T, the remaining film 421', the remaining film 42t', and the remaining film 42t is constituted by four portions 35d, 35d', 35D', and 35D with different coverages, and the coverages for the respective portions satisfy a relationship expressed as 35d<35d'<35D'<35D. In other words, as the thickness of the remaining film of the pattern structure 41 as determined from a plurality of previously performed imprints becomes thinner (42T>42T'>42t'>42t), coverage for the balance layer 35 positioned in a vicinity thereof increases (35d<35d'<35D'<35D). Note that the respective portions with different coverages of the balance layer 35 are depicted by hatchings with different pitches.

In the four portions 35d, 35d', 35D', and 35D with different coverages which constitute the balance layer 35, for example, the portion 35D with highest coverage may have 100% (a solid state) coverage while the molded resin may exist in an insular manner in the portions 35D', 35d', and 35d, in which case coverage for the portion 35D' may be approximately 85%, coverage for the portion 35d' may be 38%, and coverage for the portion 35d with lowest coverage may be 17%.

Next, in the contact step, the transfer substrate 11 and the mold 21 are brought close to each other, droplets of the molded resin 31 are spread between the transfer substrate 11 and the mold 21, and a molded resin layer is formed. Subsequently, in the curing step, the molded resin layer is cured to obtain the transfer resin layer 34 on which is formed an uneven structure in which projections and depressions of the uneven structure 24 of the mold 21 are inverted, and the balance layer 35 is cured to obtain the balance layer 37 (FIG. 24B).

Next, in the mold release step, the transfer resin layer 34 and the mold 21 are separated from each other, and the pattern structure 41 that is the transfer resin layer 34 is positioned on the hard mask material layer 15 of the projection structure part 13 that is a pattern formation area of the transfer substrate 11 (FIG. 24C).

After forming the pattern structure 41 and forming the balance layer 37 on the hard mask material layer 15 in an area outside of the projection structure part 13 that is a pattern formation area as described above, the replica mold 1 in which the uneven structure 14 is formed on the projection structure part 13 can be fabricated in a similar manner to the first embodiment described above (refer to FIGS. 2B and 2C).

Figure 26A:
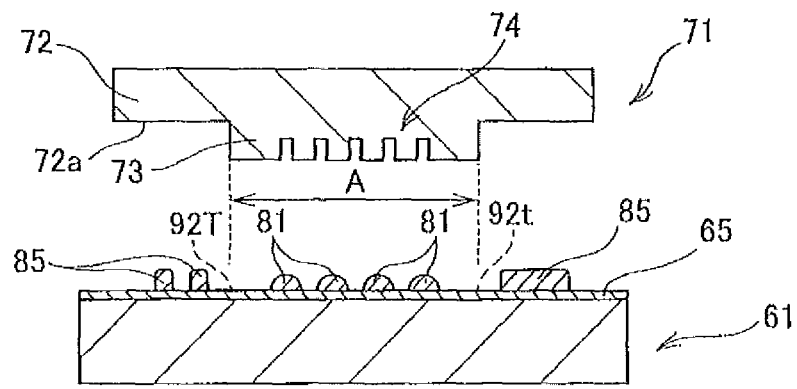
FIGS. 26A to 26C are step diagrams for explaining another embodiment of an imprint method of the present invention.

In addition, in the present embodiment, as shown in FIG. 26A, the transfer substrate 61 can be used which does not have a mesa structure and has a flat plate shape and which has the hard mask material layer 65 on one main surface 61a.

In this embodiment, first, the hard mask material layer 65 is formed on the transfer substrate 61, and a pattern formation area A for forming a pattern structure is determined on the hard mask material layer 65. The pattern formation area A normally corresponds to the projection structure part 73 of the mold 71. Subsequently, in the resin supply step, droplets of the molded resin 81 are discharged by an ink jet system and supplied to the pattern formation area A on the hard mask material layer 65. In addition, the balance layer 85 is formed in a desired area on the hard mask material layer 65 in an area outside of the pattern formation area A (FIG. 26A). The balance layer 85 is formed based on a result of a measurement of a thickness distribution of a remaining film of a pattern structure formed in a pattern formation area in a plurality of previously performed imprints. Specifically, based on the thickness of the remaining film of the pattern structure 91 as determined from the measured thickness distribution of the remaining film, the balance layer 85 is formed such that coverage for the balance layer 85 positioned in a vicinity of the portion 92t where thickness of the remaining film 92 of the pattern structure 91 is small is greater than coverage for the balance layer 85 positioned in a vicinity of the portion 92T where thickness of the remaining film 92 of the pattern structure 91 is large. In addition, the balance layer 85 can be formed such that a distance of separation between the pattern formation area A and the balance layer 85 is 300 µm or less and a shortest distance from an outer edge of the pattern formation area A to an outer edge of the balance layer 85 is 800 µm or more.

Figure 26B:
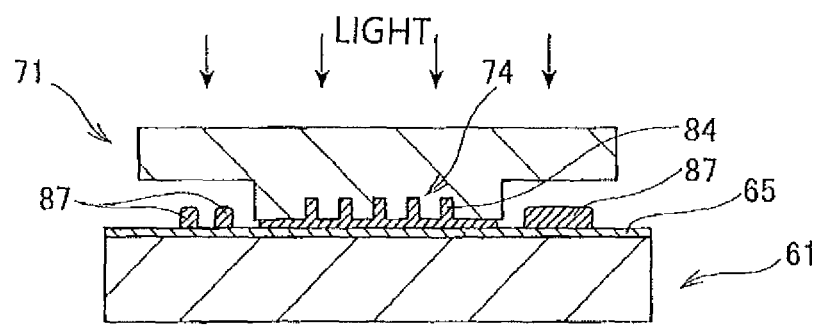

Next, in the contact step, the transfer substrate 61 and the mold 71 are brought close to each other, droplets of the molded resin 81 are spread between the transfer substrate 61 and the mold 71, and a molded resin layer is formed. Subsequently, in the curing step, the molded resin layer is cured to obtain the transfer resin layer 84 on which is formed an uneven structure in which projections and depressions of the uneven structure 74 of the mold 71 are inverted, and the balance layer 85 is cured to obtain the balance layer 87 (FIG. 26B).

Figure 26C:
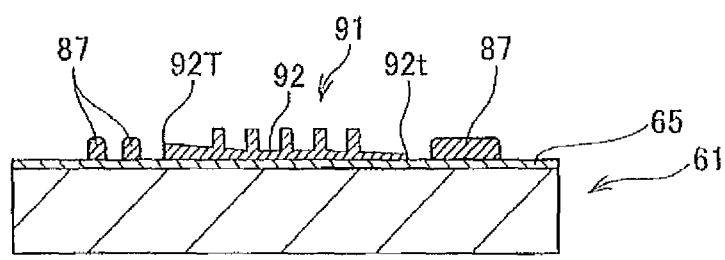

Next, in the mold release step, the transfer resin layer 84 and the mold 71 are separated from each other, and the pattern structure 91 that is the transfer resin layer 84 is positioned on the hard mask material layer 65 of the pattern formation area A of the transfer substrate 61 (FIG. 26C).

After forming the pattern structure 91 and forming the balance layer 87 on the hard mask material layer 65 in an area outside of the pattern formation area A as described above, the replica mold 51 in which the uneven structure 64 is formed in the pattern formation area A can be fabricated in a similar manner to the second embodiment described above (refer to FIGS. 5B and 5C).

It should be noted that, in the present embodiment, the final balance layer 87 may be formed by forming the additional balance layer 85 after forming the pattern structure 91 in a similar manner to the seventh embodiment (refer to FIGS. 22A to 22D).

Ninth Embodiment

In the present embodiment, a state where a width dimension of a projection of a formed uneven structure changes relative to an opening dimension of a depression of a used mold is identified in a plurality of previously performed imprints, and a position and dimensions of a balance layer to be formed are adjusted based on a result of the identification.

Figure 27:
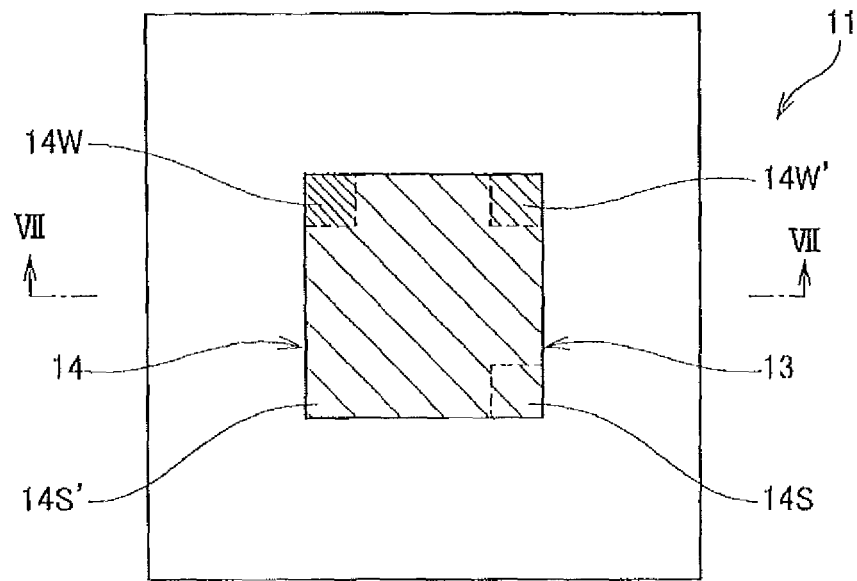
FIG. 27 is a plan view of a transfer substrate on which an uneven structure is formed in a pattern formation area in an imprint performed in advance.
Figure 28:
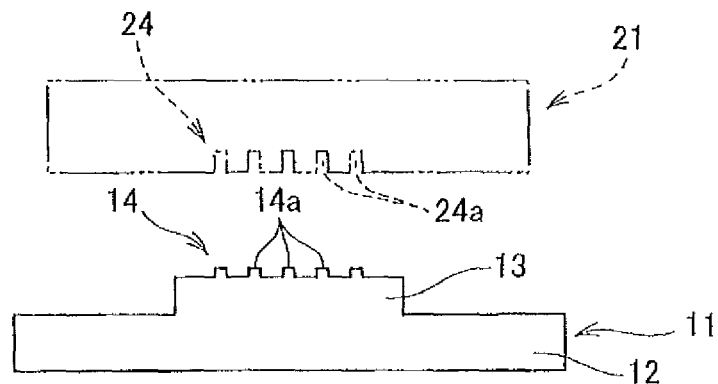
FIG. 28 is a vertical sectional view taken along line VII-VII of the transfer substrate shown in FIG. 27.

FIG. 27 is a plan view of a transfer substrate on which an uneven structure is formed in a pattern formation area in an imprint performed in advance, and FIG. 28 is a vertical sectional view taken along line VII-VII of the transfer substrate shown in FIG. 27. In FIGS. 27 and 28, the transfer substrate 11 is obtained by etching a hard mask material layer by using a pattern structure formed in the projection structure part 13 that is a pattern formation area as an etching mask to form a hard mask and, thereafter, etching the projection structure part 13 by using the hard mask as an etching mask to form the uneven structure 14 in the projection structure part 13. Note that the uneven structure is omitted in FIG. 27. Subsequently, a contraction tendency portion where a width dimension of a projection 14$a$ of the uneven structure 14 formed in the projection structure part 13 that is a pattern formation area tends to be smaller than an opening dimension of a corresponding depression 24$a$ of the used mold 21 is identified. In addition, an expansion tendency portion where a width dimension of the projection 14$a$ of the uneven structure 14 tends to be larger than an opening dimension of the corresponding depression 24$a$ of the used mold 21 is identified. In FIG. 27, in the uneven structure 14, a portion 14S and a portion 14S' are contraction tendency portions, in which case a contraction tendency of the portion 14S is stronger than that of the portion 14S'. In addition, in the uneven structure 14, a portion 14W and a portion 14W' are expansion tendency portions, in which case an expansion tendency of the portion 14W is stronger than that of the portion 14W'. The portion 14S, the portion 14S', the portion 14W, and the portion 14W' described above are shown by hatchings with different pitches. It should be noted that, in the present invention, measurements of a width dimension of a projection of an uneven structure and an opening dimension of a depression of a mold can be performed using the Scanning Electron Microscope (SEM)-Based Critical Dimension (CD) Measurement System E3620 manufactured by Advantest Corporation.

In the present embodiment, after identifying a contraction tendency portion and an expansion tendency portion in advance as described above, as shown in FIG. 29, the hard mask material layer 15 is formed on the transfer substrate 11, and droplets of the molded resin 31 are discharged by an ink jet system and supplied to a desired area on the hard mask material layer 15 of the projection structure part 13 in the resin supply step. In addition, the balance layer 35 is formed in a desired area on the hard mask material layer 15 of the surface 12$a$ in an area outside of the projection structure part 13 that is a pattern formation area. The balance layer 35 is formed based on the contraction tendency portions (the portion 14S and the portion 14S') and the expansion tendency portions (the portion 14W and the portion 14W') which have been identified as described above. Specifically, in the example shown in FIG. 29, a distance from a balance layer positioned in a vicinity of the contraction tendency portions (the portion 14S and the portion 14S') identified as described above to the projection structure part 13 that is a pattern formation area is denoted by L1, and a distance from an outer edge of the balance layer to the projection structure part 13 that is a pattern formation area is denoted by L2. In addition, a distance from a balance layer positioned in a vicinity of the expansion tendency portions (the portion 14W and the portion 14W') to the projection structure part 13 that is a pattern formation area is denoted by L1', and a distance from an outer edge of the balance layer to the projection structure part 13 that is a pattern formation area is denoted by L2'. The balance layer is formed so as to satisfy a relationship expressed by L2'<L2, and satisfy a relationship expressed by (L2'−L1')<(L2−L1). The balance layer can be formed such that the distances L1 and L1' are equal to or less than 300 μm and the distances L2 and L2' are equal to or more than 800 μm.

Figure 29:
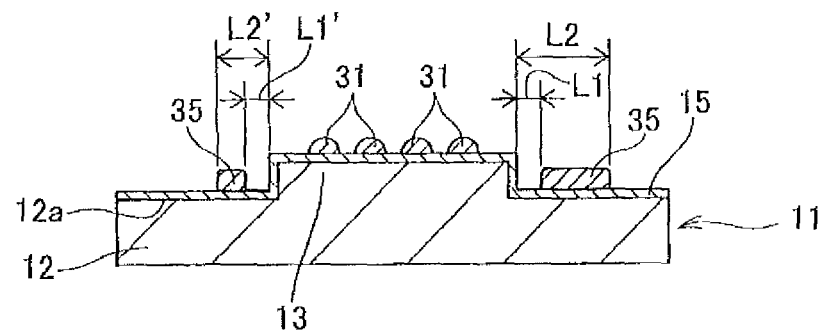
FIG. 29 is a diagram for explaining a droplet supply step according to another embodiment of an imprint method of the present invention.
Figure 30:
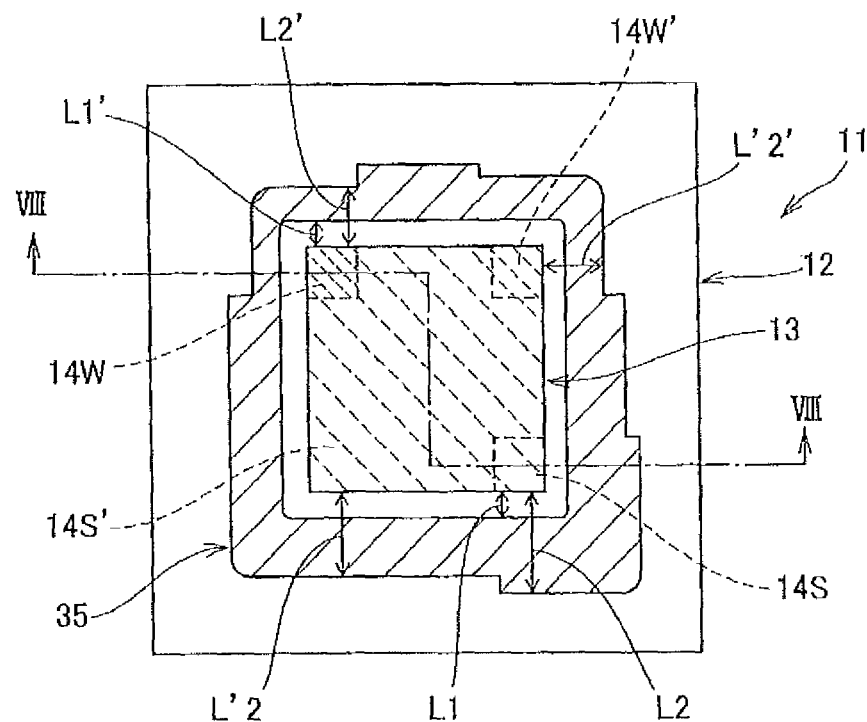
FIG. 30 is a plan view of a transfer substrate on which a balance layer is formed as shown in FIG. 29.

FIG. 30 is a plan view of a transfer substrate on which a balance layer is formed as shown in FIG. 29, and FIG. 29 corresponds to a vertical section taken along line VIII-VIII in FIG. 30. The hard mask material layer 15 and the molded resin 31 are omitted in FIG. 30. In the example shown in FIG. 30, in an imprint performed in advance, distances L2 and L'2 from an outer edge of a balance layer positioned in a vicinity of portions corresponding to the portion 14S and the portion 14S' identified as contraction tendency portions to the projection structure part 13 that is a pattern formation area and distances L2' and L'2' from an outer edge of a balance layer positioned in a vicinity of portions corresponding to the portion 14W and the portion 14W' identified as expansion tendency portions to the projection structure part 13 that is a pattern formation area satisfy a relationship expressed as L2'<L'2'<L'2<L2. In other words, the stronger a contraction tendency of a portion, the greater the distance from the outer edge of a balance layer positioned in a vicinity thereof to the projection structure part 13 that is a pattern formation area. On the other hand, the stronger an expansion tendency of a portion, the smaller the distance from the outer edge of a balance layer positioned in a vicinity thereof to the projection structure part 13 that is a pattern formation area.

Figure 31:
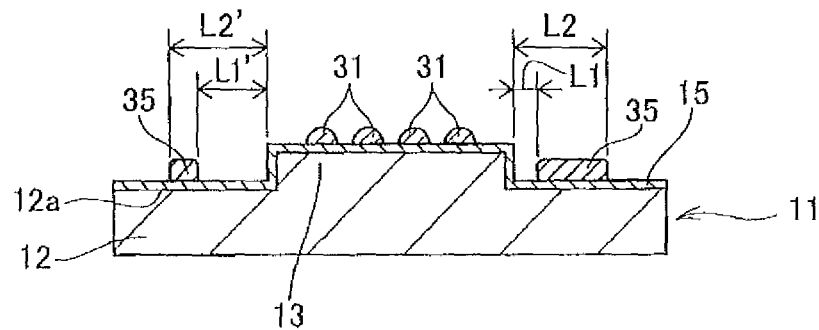
FIG. 31 is a diagram for explaining a droplet supply step according to another embodiment of an imprint method of the present invention.

In addition, in the present embodiment, a balance layer can be formed as described below. Specifically, as shown in FIG. 31, a distance from a balance layer positioned in a vicinity of the identified contraction tendency portions (the portion 14S and the portion 14S') to the projection structure part 13 that is a pattern formation area is denoted by L1, and a distance from an outer edge of the balance layer to the projection structure part 13 that is a pattern formation area is denoted by L2. In addition, a distance from a balance layer positioned in a vicinity of the expansion tendency portions (the portion 14W and the portion 14W') to the projection structure part 13 that is a pattern formation area is denoted by L1', and a distance from an outer edge of the balance layer to the projection structure part 13 that is a pattern formation area is denoted by L2'. Subsequently, the balance layer can be formed so as to satisfy a relationship expressed by L1<L1', and satisfy a relationship expressed by (L2'−L1')<(L2−L1). The balance layer can be formed such that the distances L1 and L1' are equal to or less than 300 μm and the distances L2 and L2' are equal to or more than 800 μm.

Figure 32:
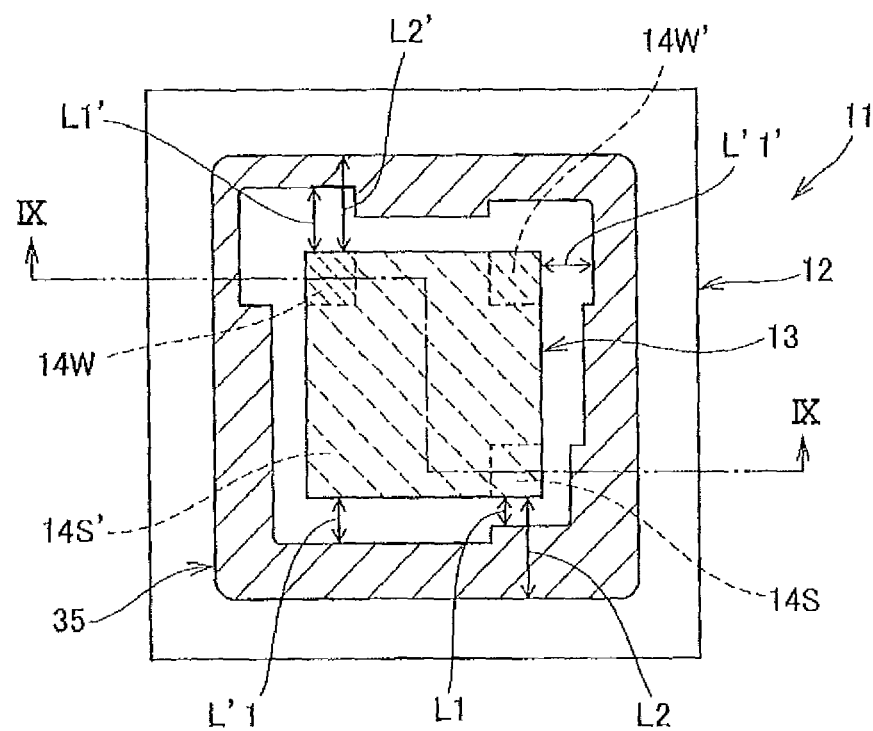
FIG. 32 is a plan view of a transfer substrate on which a balance layer is formed as shown in FIG. 31.

FIG. 32 is a plan view of a transfer substrate on which a balance layer is formed as shown in FIG. 31, and FIG. 31 corresponds to a vertical section taken along line IX-IX in FIG. 32. The hard mask material layer 15 and the molded resin 31 are omitted in FIG. 32. In the example shown in FIG. 32, in an imprint performed in advance, distances L1 and L'1 from a balance layer positioned in a vicinity of portions corresponding to the portion 14S and the portion 14S' identified as contraction tendency portions to the projection structure part 13 that is a pattern formation area and distances L1' and L'1' from a balance layer positioned in a vicinity of portions corresponding to the portion 14W and the portion 14W' identified as expansion tendency portions to the projection structure part 13 that is a pattern formation area satisfy a relationship expressed as L1'>L'1'>L'1>L1. In other words, the stronger a contraction tendency of a portion, the smaller the distance from a balance layer positioned in a vicinity thereof to the projection structure part 13 that is a pattern formation area. On the other hand, the stronger an expansion tendency of a portion, the greater the distance from a balance layer positioned in a vicinity thereof to the projection structure part 13 that is a pattern formation area.

After supplying droplets of the molded resin 31 to a desired area on the hard mask material layer 15 of the projection structure part 13 and forming the balance layer 35 on the hard mask material layer 15 in an area outside of the projection structure part 13 that is a pattern formation area as described above, subsequent steps can be performed in a similar manner to, for example, the first embodiment. Specifically, in a similar manner to the first embodiment, the pattern structure 41 can be formed on the hard mask material layer 15 of the projection structure part 13 that is a pattern formation area of the transfer substrate 11 and the balance layer 37 can be formed on the hard mask material layer 15 in an area outside of the projection structure part 13 through the contact step, the curing step, and the mold release step (refer to FIGS. 1C to 2A). Furthermore, after forming the pattern structure 41 and the balance layer 37 as described above, the hard mask 17a is formed in a similar manner to the first embodiment described above. Subsequently, by performing etching via the hard mask 17a, the replica mold 1 in which the uneven structure 14 is formed in the projection structure part 13 can be fabricated (refer to FIGS. 2B and 2C).

With etching of the hard mask material layer 15 using the pattern structure 41 and the balance layer 37 as etching masks, as described above, the presence of the balance layer 37 enables an influence of a micro-loading effect with respect to etching of the hard mask material layer 15 in the projection structure part 13 that is a pattern formation area to be made more uniform across the entire projection structure part 13. In addition, since a state where a width dimension of a projection of the formed uneven structure changes relative to an opening dimension of a depression of a used mold is identified in a plurality of previously performed imprints, and a position and dimensions of the balance layer 37 are adjusted based on a result of the identification, a fluctuation of the width dimension of a projection of the formed uneven structure relative to the opening dimension of a depression of the mold can be suppressed. Therefore, as described above, the hard mask 17a formed in the projection structure part 13 that is a pattern formation area by etching the hard mask material layer 15 by using the pattern structure 41 and the balance layer 37 as etching masks has suppressed variation in dimensional accuracy.

It should be noted that, in the present embodiment, the formation of the balance layer 37 on the hard mask material layer 15 in an area outside of the projection structure part 13 can be performed after forming the pattern structure 41 in a similar manner to the third embodiment (refer to FIG. 7C).

In addition, the transfer substrate used in the present embodiment may have a flat shape without a projection structure part.

Tenth Embodiment

In the present embodiment, a state where a width dimension of a projection of a formed uneven structure changes relative to an opening dimension of a depression of a used mold is identified in a plurality of previously performed imprints, and coverage for a balance layer is adjusted based on a result of the identification.

Figure 33:
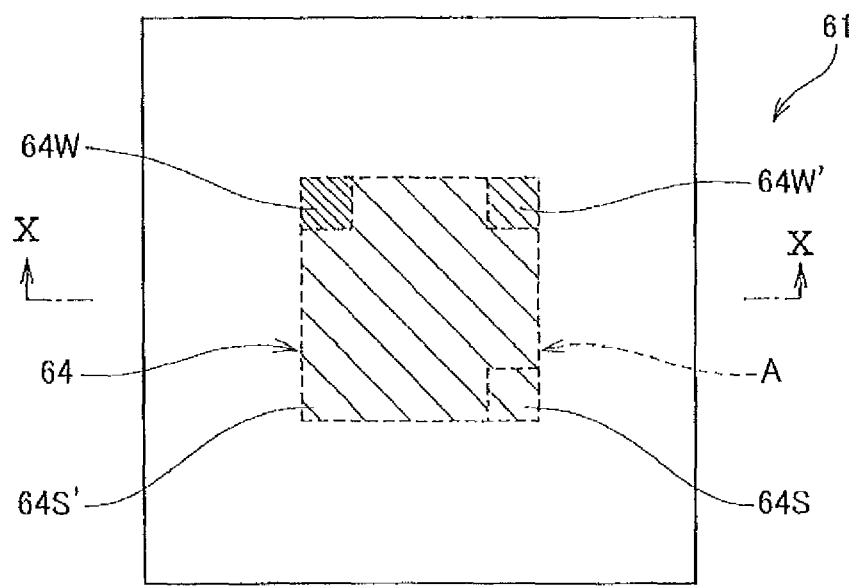
FIG. 33 is a plan view of a transfer substrate on which an uneven structure is formed in a pattern formation area in an imprint performed in advance.
Figure 34:
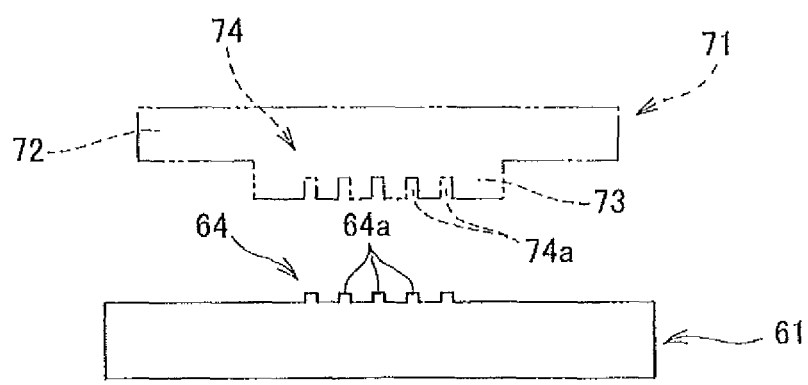
FIG. 34 is a vertical sectional view taken along line X-X of the transfer substrate shown in FIG. 33.

FIG. 33 is a plan view of a transfer substrate on which an uneven structure is formed in a pattern formation area in an imprint performed in advance, and FIG. 34 is a vertical sectional view taken along line X-X of the transfer substrate shown in FIG. 33. In FIGS. 33 and 34, the transfer substrate 61 includes the uneven structure 64 formed in the pattern formation area A. Specifically, a hard mask material layer is etched by using a pattern structure formed in the pattern formation area A as an etching mask to form a hard mask, and the transfer substrate 61 is etched by using the hard mask as an etching mask to form the uneven structure 64 in the pattern formation area A. Subsequently, a contraction tendency portion where a width dimension of a projection 64a of the uneven structure 64 formed in the pattern formation area A tends to be smaller than an opening dimension of a corresponding depression 74a of the used mold 71 is identified. In addition, an expansion tendency portion where a width dimension of the projection 64a of the uneven structure 64 tends to be larger than an opening dimension of the corresponding depression 74a of the used mold 71 is identified. In FIG. 33, in the uneven structure 64, a portion 64S and a portion 64S' are contraction tendency portions, in which case a contraction tendency of the portion 64S is stronger than that of the portion 64S'. In addition, in the uneven structure 64, a portion 64W and a portion 64W' are expansion tendency portions, in which case an expansion tendency of the portion 64W is stronger than that of the portion 64W'. The portion 64S, the portion 64S', the portion 64W, and the portion 64W' described above are shown by hatchings with different pitches. Note that the uneven structure is omitted in FIG. 33.

In the present embodiment, after identifying a contraction tendency portion and an expansion tendency portion in advance as described above, as shown in FIG. 35, the hard mask material layer 65 is formed on the transfer substrate 61. Subsequently, in the resin supply step, droplets of the molded resin 81 are discharged by an ink jet system and supplied to a desired area on the hard mask material layer 65 of the pattern formation area A. In addition, the balance layer 85 is formed in a desired area on the hard mask material layer 65 in an area outside of the pattern formation area A. The balance layer 85 is formed based on the contraction tendency portions (the portion 64S and the portion 64S') and the expansion tendency portions (the portion 64W and the portion 64W') which have been identified as described above. Specifically, the balance layer is formed such that coverage for the balance layer positioned in a vicinity of the contraction tendency portions (the portion 64S and the portion 64S') identified as described above is larger than coverage for the balance layer positioned in a vicinity of the expansion tendency portions (the portion 64W and the portion 64W'). In addition, the balance layer 85 can be formed such that a distance of separation between the pattern formation area A and the balance layer 85 is 300 μm or less and a shortest distance from an outer edge of the pattern formation area A to an outer edge of the balance layer 85 is 800 µm or more.

Figure 35:
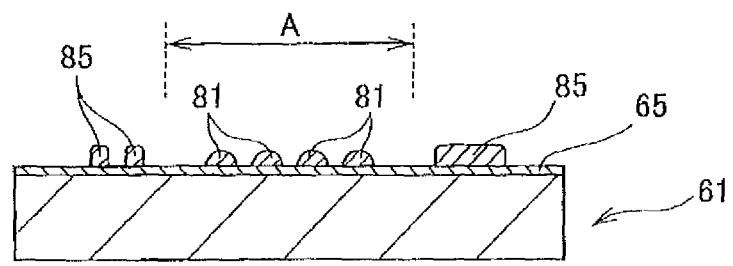
FIG. 35 is a diagram for explaining a droplet supply step according to another embodiment of an imprint method of the present invention.
Figure 36:
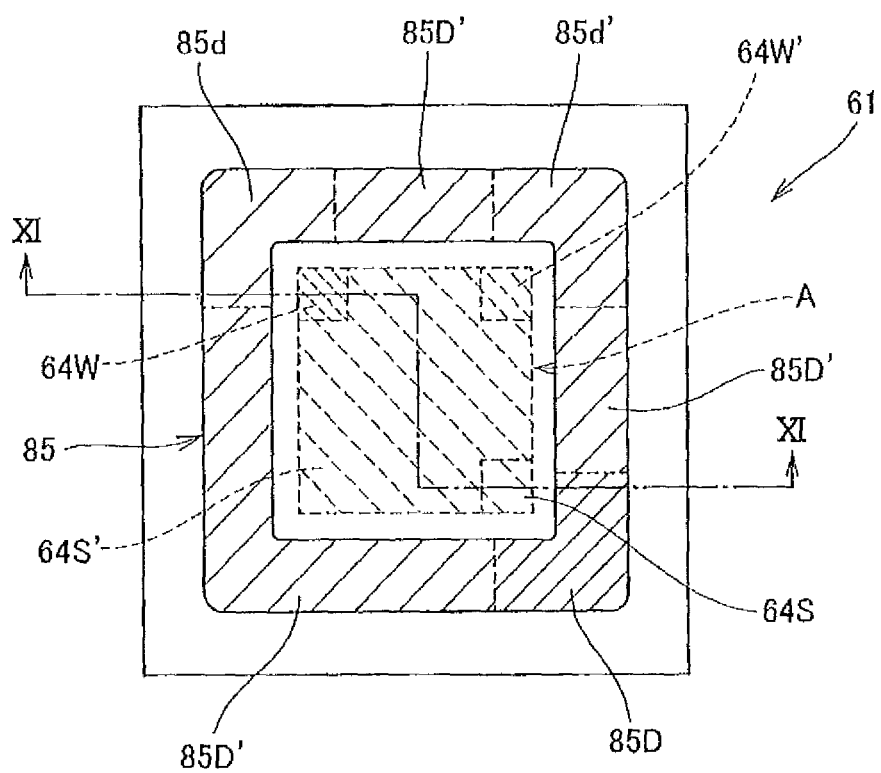
FIG. 36 is a plan view of a transfer substrate on which a balance layer is formed as shown in FIG. 35.

FIG. 36 is a plan view of a transfer substrate on which a balance layer is formed as shown in FIG. 35, and FIG. 35 corresponds to a vertical section taken along line XI-XI in FIG. 36. In FIG. 36, the hard mask material layer 65 and the molded resin 81 are omitted. In the example shown in FIG. 36, in an imprint performed in advance, coverages for a portion 85D and a portion 85D' of the balance layer 85 positioned in a vicinity of portions corresponding to the portion 64S and the portion 64S' identified as contraction tendency portions and coverages in a portion 85$d$ and a portion 85$d'$ of the balance layer 85 positioned in a vicinity of portions corresponding to the portion 64W and the portion 64W' identified as expansion tendency portions satisfy a relationship expressed as 85$d$<85$d'$<85D'<85D. In other words, the larger the contraction tendency, the higher the coverage for the balance layer 85, and the larger the expansion tendency, the lower the coverage for the balance layer 85. Such coverage for the balance layer 85 can be appropriately set within a range where the relationship described above is satisfied. For example, coverages for the portion 85$d$, the portion 85$d'$, the portion 85D', and the portion 85D can be set to 17%, 38%, approximately 85%, and 100%. Note that, in FIG. 36, the respective portions with different coverages of the balance layer 85 are depicted by hatchings with different pitches.

After supplying droplets of the molded resin 81 to a desired area on the hard mask material layer 65 of the pattern formation area A and forming the balance layer 85 on the hard mask material layer 65 in an area outside of the pattern formation area A as described above, the balance layer 87 can be formed in a similar manner to, for example, the second embodiment. Specifically, in a similar manner to the second embodiment, the pattern structure 91 can be formed on the hard mask material layer 65 of the pattern formation area A of the transfer substrate 61 and the balance layer 87 can be formed on the hard mask material layer 65 in an area outside of the pattern formation area A through the contact step, the curing step, and the mold release step (refer to FIGS. 4B to 5A). Furthermore, after forming the pattern structure 91 and the balance layer 87 as described above, the hard mask 67$a$ is formed in a similar manner to the second embodiment described above. Subsequently, by performing etching via the hard mask 67$a$, the replica mold 51 in which the uneven structure 64 is formed in the pattern formation area A can be fabricated (refer to FIGS. 5B and 5C).

With etching of the hard mask material layer 65 using the pattern structure 91 and the balance layer 87 as etching masks, as described above, the presence of the balance layer 87 enables an influence of a micro-loading effect with respect to etching of the hard mask material layer 65 in the pattern formation area A to be made more uniform. In addition, a state where a width dimension of a projection of the formed uneven structure changes relative to an opening dimension of a depression of a used mold is identified in a plurality of previously performed imprints, and coverage for the balance layer 87 is adjusted based on a result of the identification. Accordingly, a fluctuation of the width dimension of a projection of the formed uneven structure relative to the opening dimension of a depression of the mold can be suppressed. Therefore, as described above, the hard mask 67$a$ formed in the pattern formation area A by etching the hard mask material layer 65 by using the pattern structure 91 and the balance layer 87 as etching masks has suppressed variation in dimensional accuracy.

It should be noted that, in the present embodiment, the formation of the balance layer 87 on the hard mask material layer 65 in an area outside of the pattern formation area A can be performed after forming the pattern structure 91 in a similar manner to the fourth embodiment (refer to FIG. 8C).

In addition, the transfer substrate used in the present embodiment may be a mesa structure with a projection structure part.

Eleventh Embodiment

In the present embodiment, a dimension distribution of an opening of a depression of an uneven structure included in a mold used for imprinting is identified and a position and dimensions of a balance layer to be formed are adjusted based on a result of the identification.

Figure 37:
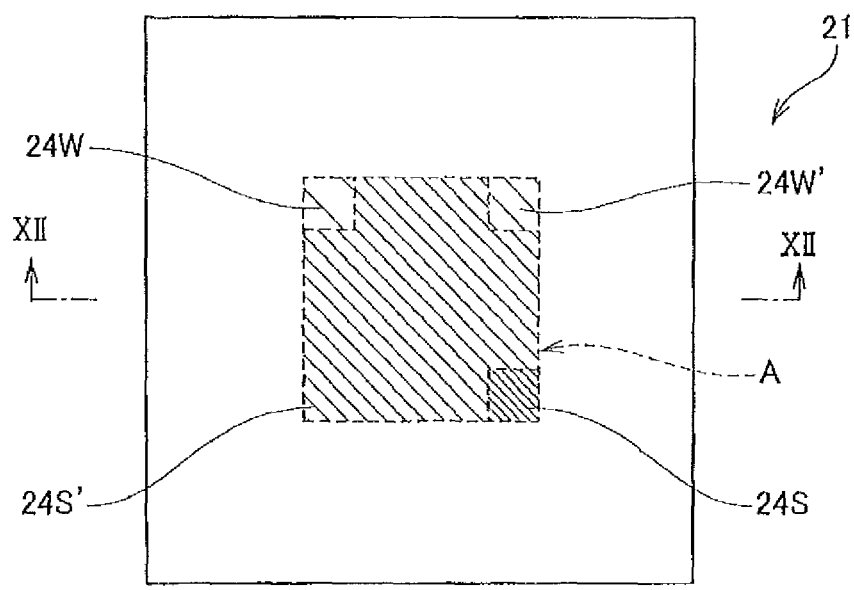
FIG. 37 is a plan view of a surface on which an uneven structure of a mold to be used for imprinting is formed.
Figure 38:
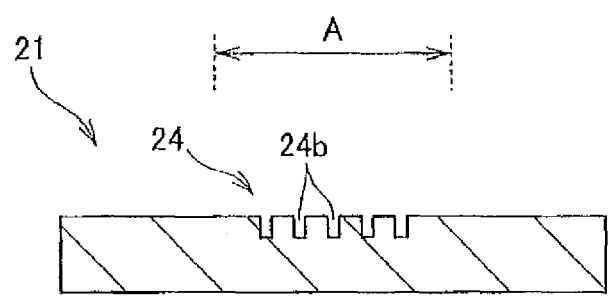
FIG. 38 is a vertical sectional view taken along line XII-XII of the transfer substrate shown in FIG. 37.

FIG. 37 is a plan view of a surface on which an uneven structure of a mold used for imprinting is formed, and FIG. 38 is a vertical sectional view taken along line XII-XII of the transfer substrate shown in FIG. 37. In FIGS. 37 and 38, the uneven structure 24 of the mold 21 is constituted by a plurality of types of depressions 24$b$ with different opening dimensions. In the example shown in FIG. 37, in the uneven structure 24, an opening dimension of the depression 24$b$ included in a portion 24W is the largest, and opening dimensions of included depressions 24$b$ decrease in an order of a portion 24W', a portion 24S', and a portion 24S. Note that, in FIG. 37, the portion 24W, the portion 24W', the portion 24S', and the portion 24S are shown by hatchings with different pitches.

In the present embodiment, after identifying a dimension distribution of an opening of a depression of an uneven structure included in a mold used for imprinting as described above, as shown in FIG. 39, the hard mask material layer 15 is formed on the transfer substrate 11, and droplets of the molded resin 31 are discharged by an ink jet system and supplied to a desired area on the hard mask material layer 15 of the projection structure part 13 in the resin supply step. In addition, the balance layer 35 is formed in a desired area on the hard mask material layer 15 of the surface 12$a$ in an area outside of the projection structure part 13 that is a pattern formation area. The balance layer 35 is formed based on the dimension distribution of an opening of a depression of an uneven structure included in a mold having been identified as described above. Specifically, in the example shown in FIG. 39, in the projection structure part 13 that is a pattern formation area, a distance from a balance layer positioned in a vicinity of a portion corresponding to a portion where a dimension of an opening of the depression 24$b$ constituting the uneven structure 24 of the mold 21 is small to the projection structure part 13 that is a pattern formation area is denoted by L1, and a distance from an outer edge of the balance layer to the projection structure part 13 that is a pattern formation area is denoted by L2. In addition, a distance from a balance layer positioned in a vicinity of a portion corresponding to a portion where a dimension of an opening of the depression 24$b$ constituting the uneven structure 24 of the mold 21 is large to the projection structure part 13 that is a pattern formation area is denoted by L1', and a distance from an outer edge of the balance layer to the projection structure part 13 that is a pattern formation area is denoted by L2'. Subsequently, the balance layer is formed so as to satisfy a relationship expressed by L2'<L2, and satisfy a relationship expressed by (L2'−L1')<(L2−L1). The balance layer can be formed such that the distances L1 and L1' are equal to or less than 300 µm and the distances L2 and L2' are equal to or more than 800 µm.

Figure 39:
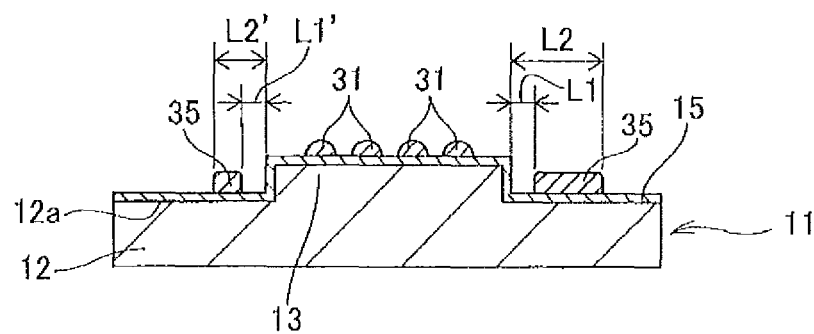
FIG. 39 is a diagram for explaining a droplet supply step according to another embodiment of an imprint method of the present invention.
Figure 40:
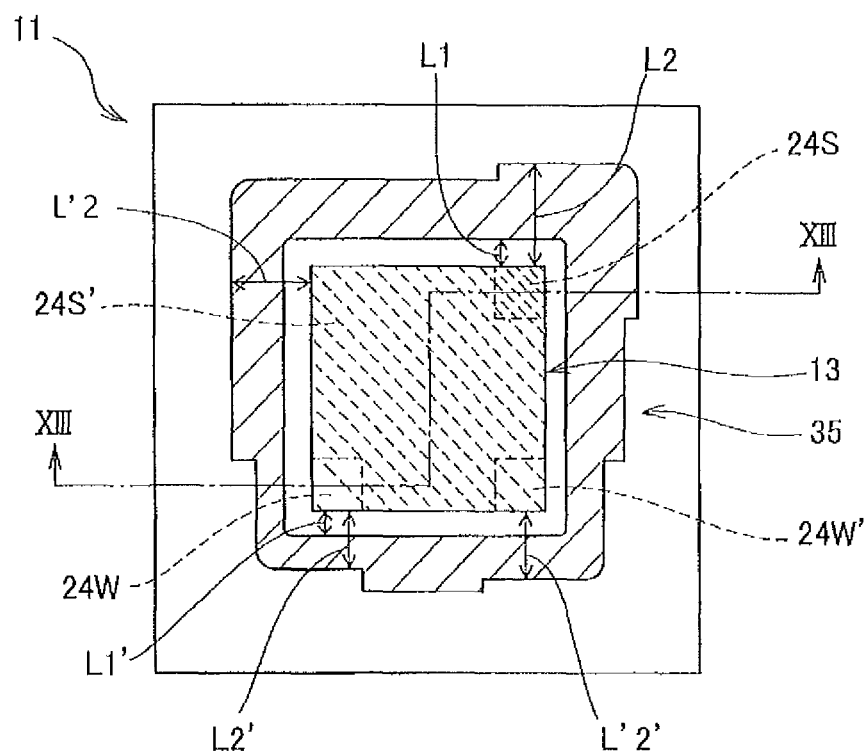
FIG. 40 is a plan view of a transfer substrate on which a balance layer is formed as shown in FIG. 39.

FIG. 40 is a plan view of a transfer substrate on which a balance layer is formed as shown in FIG. 39, and FIG. 39 corresponds to a vertical section taken along line XIII-XIII in FIG. 40. In addition, the hard mask material layer 15 and the molded resin 31 are omitted in FIG. 40. In the example shown in FIG. 40, in the uneven structure 24, distances L2', L'2', L'2, and L2 from an outer edge of the balance layer positioned in the vicinity of the portion 24W, the portion 24W', the portion 24S', and the portion 24S to the projection structure part 13 that is a pattern formation area increase in a descending order of opening dimensions of the depression 24b (the portion 24W>the portion 24W'>the portion 24S'>the portion 24S) and satisfy a relationship expressed as L2'<L'2'<L'2<L2.

Figure 41:
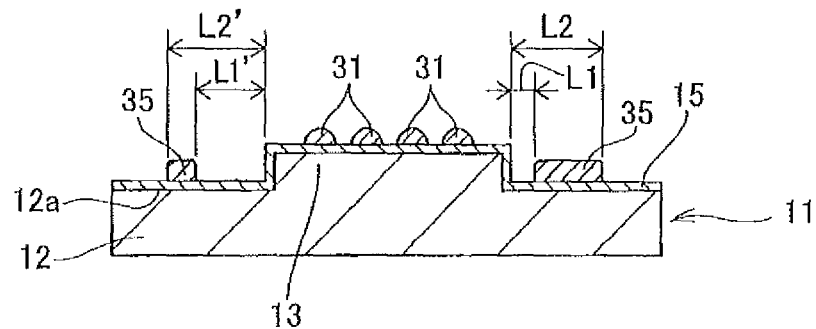
FIG. 41 is a diagram for explaining a droplet supply step according to another embodiment of an imprint method of the present invention.

In addition, in the present embodiment, a balance layer can be formed as shown in FIG. 41. Specifically, in the projection structure part 13 that is a pattern formation area, a distance from a balance layer positioned in a vicinity of a portion corresponding to a portion where a dimension of an opening of the depression 24b constituting the uneven structure 24 of the mold 21 is small to the projection structure part 13 that is a pattern formation area is denoted by L1, and a distance from an outer edge of the balance layer to the projection structure part 13 that is a pattern formation area is denoted by L2. In addition, a distance from a balance layer positioned in a vicinity of a portion corresponding to a portion where an opening dimension of the depression 24b constituting the uneven structure 24 of the mold 21 is large to the projection structure part 13 that is a pattern formation area is denoted by L1', and a distance from an outer edge of the balance layer to the projection structure part 13 that is a pattern formation area is denoted by L2'. Subsequently, the balance layer can be formed so as to satisfy a relationship expressed by L1<L1', and satisfy a relationship expressed by (L2'−L1')<(L2−L1). The balance layer can be formed such that the distances L1 and L1' are equal to or less than 300 µm and the distances L2 and L2' are equal to or more than 800 µm.

Figure 42:
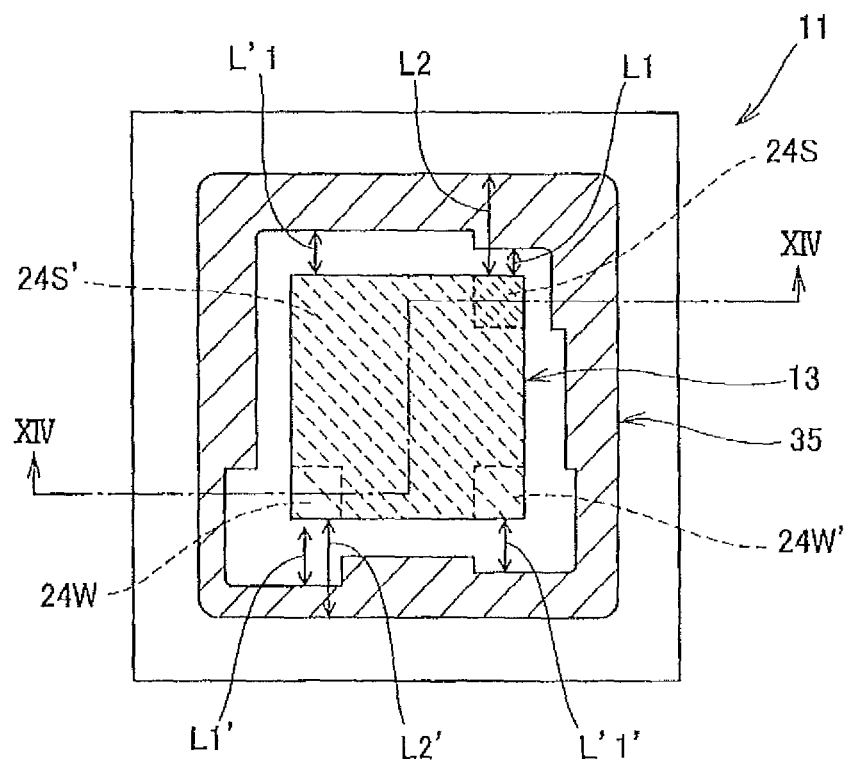
FIG. 42 is a plan view of a transfer substrate on which a balance layer is formed as shown in FIG. 41.

FIG. 42 is a plan view of a transfer substrate on which a balance layer is formed as shown in FIG. 41, and FIG. 41 corresponds to a vertical section taken along line XIV-XIV in FIG. 42. In addition, the hard mask material layer 15 and the molded resin 31 are omitted in FIG. 42. In the example shown in FIG. 42, in the uneven structure 24, distances L1', L'1', L'1, and L1 from the balance layer positioned in the vicinity of the portion 24W, the portion 24W', the portion 24S', and the portion 24S to the projection structure part 13 that is a pattern formation area decrease in a descending order of opening dimensions of the depression 24b (the portion 24W>the portion 24W'>the portion 24S'>the portion 24S) and satisfy a relationship expressed as L1'>L'1'>L'1>L1.

After supplying droplets of the molded resin 31 to a desired area on the hard mask material layer 15 of the projection structure part 13 and forming the balance layer 35 on the hard mask material layer 15 in an area outside of the projection structure part 13 that is a pattern formation area as described above, the balance layer 37 can be formed in a similar manner to, for example, the first embodiment. Specifically, in a similar manner to the first embodiment, the pattern structure 41 can be formed on the hard mask material layer 15 of the projection structure part 13 that is a pattern formation area of the transfer substrate 11 and the balance layer 37 can be formed on the hard mask material layer 15 in an area outside of the projection structure part 13 through the contact step, the curing step, and the mold release step (refer to FIGS. 1C to 2A). Furthermore, after forming the pattern structure 41 and the balance layer 37 as described above, by forming the hard mask 17a and performing etching via the hard mask 17a, the replica mold 1 in which the uneven structure 14 is formed in the projection structure part 13 can be fabricated in a similar manner to the first embodiment described above (refer to FIGS. 2B and 2C).

With etching of the hard mask material layer 15 using the pattern structure 41 and the balance layer 37 as etching masks, as described above, the presence of the balance layer 37 enables an influence of a micro-loading effect with respect to etching of the hard mask material layer 15 in the projection structure part 13 that is a pattern formation area to be made more uniform across the entire projection structure part 13. In addition, since a dimension distribution of an opening of a depression of an uneven structure included in a mold used for imprinting is identified and a position and dimensions of the balance layer 37 are adjusted based on a result of the identification, a fluctuation of the width dimension of a projection of the formed uneven structure relative to the opening dimension of a depression of the mold can be suppressed. Therefore, as described above, the hard mask 17a formed in the projection structure part 13 that is a pattern formation area by etching the hard mask material layer 15 by using the pattern structure 41 and the balance layer 37 as etching masks has suppressed variation in dimensional accuracy.

It should be noted that, in the present embodiment, the formation of the balance layer 37 on the hard mask material layer 15 in an area outside of the projection structure part 13 can be performed after forming the pattern structure 41 in a similar manner to the third embodiment (refer to FIG. 7C).

In addition, the transfer substrate used in the present embodiment may have a flat shape without a projection structure part.

Twelfth Embodiment

In the present embodiment, a dimension distribution of an opening of a depression of an uneven structure included in a mold used for imprinting is identified and coverage for a balance layer is adjusted based on a result of the identification.

Figure 43:
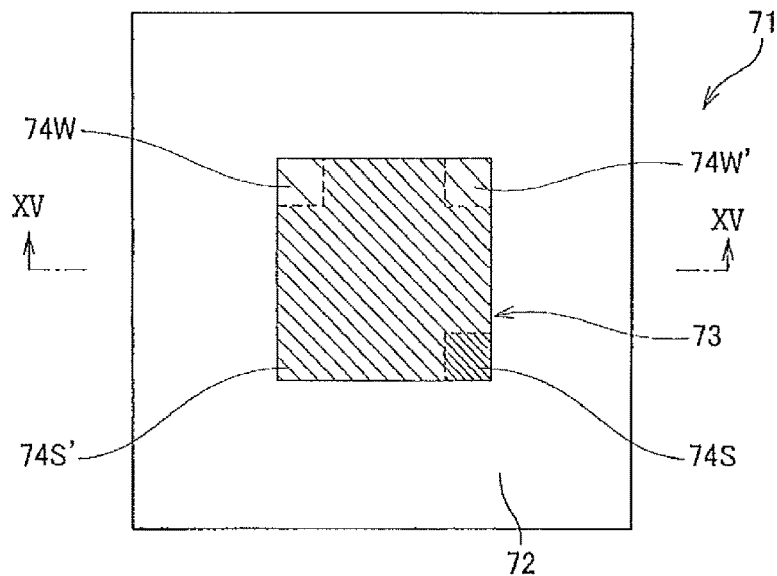
FIG. 43 is a plan view of a surface on which an uneven structure of a mold to be used for imprinting is formed.
Figure 44:
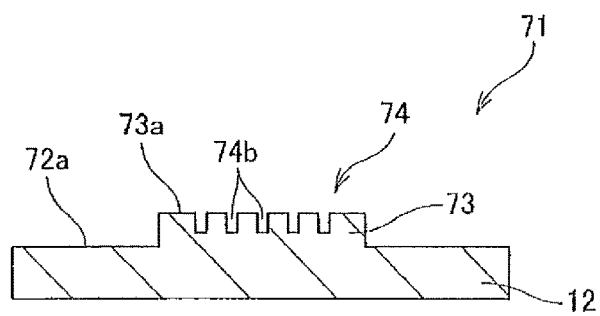
FIG. 44 is a vertical sectional view taken along line XV-XV of the transfer substrate shown in FIG. 43.

FIG. 43 is a plan view of a surface on which an uneven structure of a mold used for imprinting is formed, and FIG. 44 is a vertical sectional view taken along line XV-XV of the transfer substrate shown in FIG. 43. In FIGS. 43 and 44, the uneven structure 74 of the mold 71 is constituted by a plurality of types of depressions 74b with different opening dimensions. In the example shown in FIG. 43, in the uneven structure 74, a dimension of an opening of the depression 74b included in a portion 74W is largest, and dimensions of an opening of included depressions 74b become smaller in an order of a portion 74W', a portion 74S', and a portion 74S. Note that, in FIG. 43, the portion 74W, the portion 74W', the portion 74S', and the portion 74S are shown by hatchings with different pitches.

In the present embodiment, after identifying a dimension distribution of an opening of a depression of an uneven structure included in a mold used for imprinting as described above, as shown in FIG. 45, the hard mask material layer 65 is formed on the transfer substrate 61, and droplets of the molded resin 81 are discharged by an ink jet system and supplied to a desired area on the hard mask material layer 65 of the pattern formation area A in the resin supply step. In addition, the balance layer 85 is formed in a desired area on the hard mask material layer 65 in an area outside of the pattern formation area A. The balance layer 85 is formed based on the dimension distribution of an opening of a depression of an uneven structure included in a mold having been identified as described above. Specifically, in the example shown in FIG. 45, a balance layer is formed such that, in the pattern formation area A, coverage for the balance layer positioned in a vicinity of a portion corresponding to a portion where an opening dimension of the depression 74b constituting the uneven structure 74 of the mold 71 is small is larger than coverage for the balance layer positioned in a vicinity of a portion corresponding to a portion where an opening dimension of the depression 74b constituting the uneven structure 74 of the mold 71 is large. In addition, the balance layer can be formed such that a distance of separation between the pattern formation area A and the balance layer is 300 µm or less and a shortest distance from an outer edge of the pattern formation area A to an outer edge of the balance layer is 800 µm or more.

Figure 45:
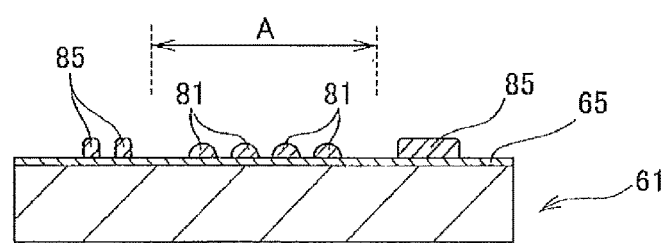
FIG. 45 is a diagram for explaining a droplet supply step according to another embodiment of an imprint method of the present invention.
Figure 46:
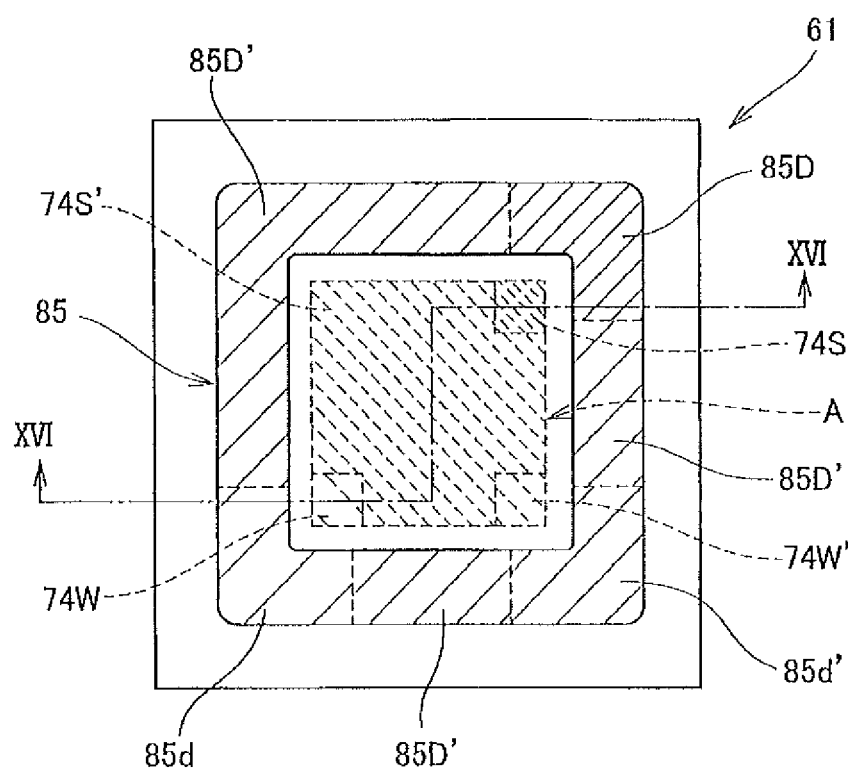
FIG. 46 is a plan view of a transfer substrate on which a balance layer is formed as shown in FIG. 45.

FIG. 46 is a plan view of a transfer substrate on which a balance layer is formed as shown in FIG. 45, and FIG. 45 corresponds to a vertical section taken along line XVI-XVI in FIG. 46. In addition, the hard mask material layer 65 and the molded resin 81 are omitted in FIG. 46. In the uneven structure 74 in the example shown in FIG. 46, in a descending order of opening dimensions of the depression 74b (the portion 74W>the portion 74W'>the portion 74S'>the portion 74S), coverages for the portion 85d, the portion 85d', the portion 85D', and the portion 85D of the balance layer 85 positioned in the vicinity of these portions increase and satisfy a relationship expressed as 85d<85d'<85D'<85D. In other words, the smaller the opening dimension of the depression 74b, the higher the coverage for the balance layer 85. Such coverage for the balance layer 85 can be appropriately set within a range where the relationship described above is satisfied and, for example, coverages for the portion 85d, the portion 85d', the portion 85D', and the portion 85D can be set to 17%, 38%, approximately 85%, and 100%. Note that, in FIG. 46, the respective portions with different coverages of the balance layer 85 are depicted by hatchings with different pitches.

After supplying droplets of the molded resin 81 to a desired area on the hard mask material layer 65 of the pattern formation area A and forming the balance layer 85 on the hard mask material layer 65 in an area outside of the pattern formation area A as described above, the balance layer 87 can be formed in a similar manner to, for example, the second embodiment. Specifically, in a similar manner to the second embodiment, the pattern structure 91 can be formed on the hard mask material layer 65 of the pattern formation area A of the transfer substrate 61 and the balance layer 87 can be formed on the hard mask material layer 65 in an area outside of the pattern formation area A through the contact step, the curing step, and the mold release step (refer to FIGS. 4B to 5A). Furthermore, after forming the pattern structure 91 and the balance layer 87 as described above, by forming the hard mask 67a and performing etching via the hard mask 67a, the replica mold 51 in which the uneven structure 64 is formed in the pattern formation area A can be fabricated in a similar manner to the second embodiment described above (refer to FIGS. 5B and 5C).

With etching of the hard mask material layer 65 using the pattern structure 91 and the balance layer 87 as etching masks, as described above, the presence of the balance layer 87 enables an influence of a micro-loading effect with respect to etching of the hard mask material layer 65 in the pattern formation area A to be made more uniform. In addition, a dimension distribution of an opening of a depression of an uneven structure included in a mold used for imprinting is identified and coverage for the balance layer 87 is adjusted based on a result of the identification. Accordingly, a fluctuation of the width dimension of a projection of the formed uneven structure relative to the opening dimension of a depression of the mold can be suppressed. Therefore, as described above, the hard mask 67a formed in the pattern formation area A by etching the hard mask material layer 65 by using the pattern structure 91 and the balance layer 87 as etching masks has suppressed variation in dimensional accuracy.

It should be noted that, in the present embodiment, the formation of the balance layer 87 on the hard mask material layer 65 in an area outside of the pattern formation area A can be performed after forming the pattern structure 91 in a similar manner to the fourth embodiment (refer to FIG. 8C).

In addition, the transfer substrate used in the present embodiment may be a mesa structure with a projection structure part.

Thirteenth Embodiment

Figure 47A:
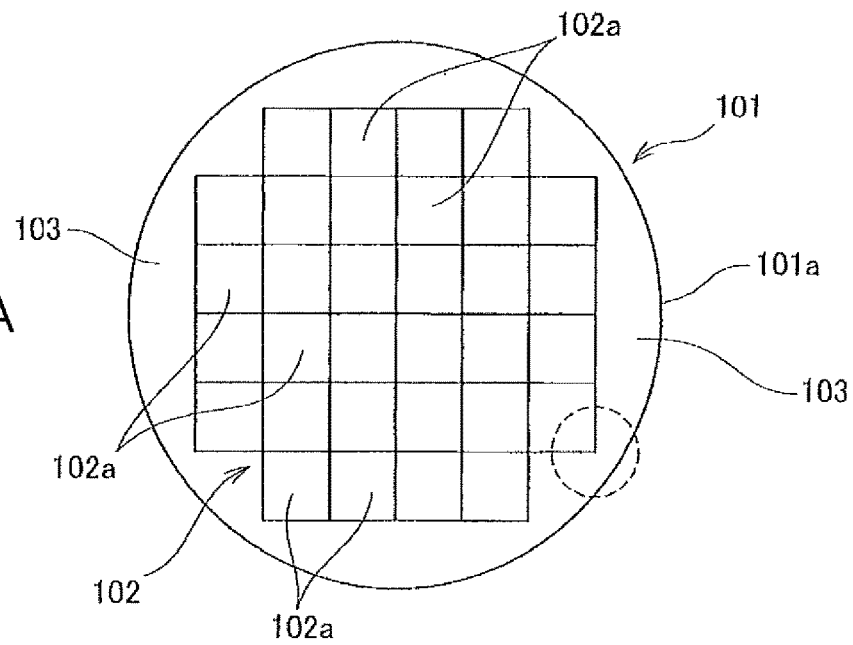
FIGS. 47A and 47B are plan views for explaining another embodiment of an imprint method of the present invention.
Figure 47B:
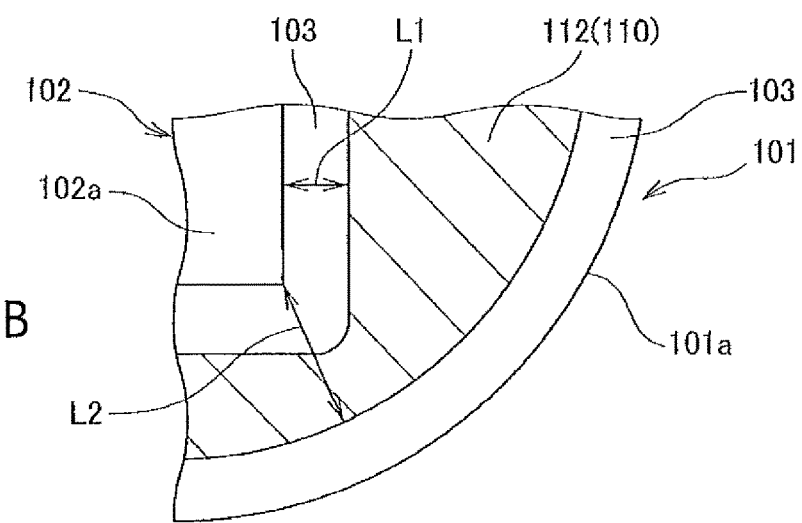

FIGS. 47A and 47B are diagrams for explaining another embodiment of the imprint method of the present invention.

In the present embodiment, a silicon wafer is used as a transfer substrate. In the example shown in the drawing, a plurality of pattern formation areas 102a in which a pattern structure is to be formed by an imprint method are set on one surface of a silicon wafer 101 by multiple patterning (FIG. 47A). Note that the silicon wafer may have a desired thin film such as a copper foil or a silicon oxide film formed on a surface thereof.

With respect to each pattern formation area 102a of the silicon wafer 101 described above, the resin supply step, the contact step, the curing step, and the mold release step are repeated in a similar manner to the fourth embodiment described above to form a pattern structure in all of the pattern formation areas 102a by a so-called step and repeat system.

Subsequently, in the balance layer formation step, a balance layer 110 is formed by supplying a molded resin by an ink jet system in an area 103 on the outside of an area 102 where the pattern formation areas 102a are assembled, and the balance layer 110 is cured to obtain a balance layer 112. Formation of the balance layer 110 can be performed in a similar manner to the second embodiment described above. In addition, when the molded resin used is a photocurable resin, curing of the balance layer 110 may be performed by irradiating the balance layer 110 with light. Meanwhile, when the molded resin used is a thermosetting resin, curing may be performed by applying a heating process to the balance layer 110. FIG. 47B is a diagram which explains a state after forming the balance layer 112 in this manner and which is an enlarged plan view of a portion enclosed by a dashed line in FIG. 47A. As shown in FIG. 47B, the balance layer 112 (shown hatched) is positioned in the area 103 which is on the outside of the area 102 where the pattern formation areas 102a are assembled and which is an area between the area 102 and a peripheral edge 101a of the silicon wafer 101. In addition, a distance of separation L1 between the area 102 where the pattern formation areas 102a are assembled and the balance layer 112 can be set to 300 µm or less and a shortest distance L2 from an outer edge of the area 102 where the pattern formation areas 102a are assembled to an outer edge of the balance layer 112 can be set to 800 µm or more. When the distance of separation L1 exceeds 300 µm or when the shortest distance L2 falls below 800 µm, an effect of the balance layer may not be sufficiently exhibited, which is not preferable.

It should be noted that the distance of separation L1 between the area 102 where the pattern formation areas 102a are assembled and the balance layer 112 may be zero or, in other words, the balance layer 112 may be brought into contact with the area 102 where the pattern formation areas 102a are assembled.

As described above, since the balance layer 112 is formed in the area 103 which is on the outside of the area 102 where the pattern formation areas 102a are assembled, when processing the silicon wafer 101 or a desired thin film positioned on a surface of the silicon wafer 101 by using a pattern structure formed in each pattern formation area 102a as an etching mask, an influence of a micro-loading effect with respect to etching in each pattern formation area 102a can be made more uniform across the entire area 102 where the pattern formation areas 102a are assembled. Therefore, processing the silicon wafer 101 or a desired thin film positioned on a surface of the silicon wafer 101 can be performed with high accuracy.

In addition, since the balance layer 110 is formed in the balance layer formation step after forming a pattern structure in all of the pattern formation areas 102a by a step and repeat system, the balance layer 110 can be formed using a different resin material from a molded resin for forming the pattern structures. In this case, the thickness of the balance layer 110 can be reduced within a range where the balance layer 112 functions as an etching mask when processing the silicon wafer 101 or a desired thin film positioned on a surface of the silicon wafer 101 by using the balance layer 112 together with the pattern structures as etching masks. Therefore, for example, a resin material with low viscosity or a resin material with a higher etching resistance than the molded resin for forming the pattern structures can be used. Accordingly, peeling and cleaning of the balance layer 112 after a desired etching process can be performed more readily. In addition, prevention of contact during an imprint according to a step and repeat system need not be taken into consideration when supplying a resin material for forming the balance layer 110. Therefore, a shape and the like of a mold to be used need not be taken into consideration even when setting the distance of separation L1 and the shortest distance L2 described above and, consequently, various mold shapes can be accommodated.

In addition, in the imprint method according to the present invention in which a silicon wafer is used as a transfer substrate, the balance layer 110 may be formed in the area 103 on the outside of the area 102 where the pattern formation areas 102a are assembled in a stage of forming a pattern structure in each pattern formation area 102a by the step and repeat system. In other words, when forming a pattern structure in a pattern formation area 102a positioned near a periphery of the area 102, the balance layer 110 may be formed in the area 103 in a vicinity of the pattern formation area 102a. Therefore, upon completion of the formation of the pattern structure in all of the pattern formation areas 102a, the balance layer 110 positioned in the area 103 on the outside of the area 102 where the pattern formation areas 102a are assembled is to be constituted by a plurality of balance layers having different formation timings. It should be noted that, as described above, when forming the balance layer 110 in the nearby area 103 during the formation of a pattern structure in a pattern formation area 102a positioned near a periphery of the area 102, the balance layer 110 may be formed in the nearby area 103 in the balance layer formation step after the mold release step with respect to the pattern formation area 102a. Alternatively, the balance layer may be formed by supplying a molded resin also to the nearby area 103 in the resin supply step with respect to the pattern formation area 102a.

Figure 48A:
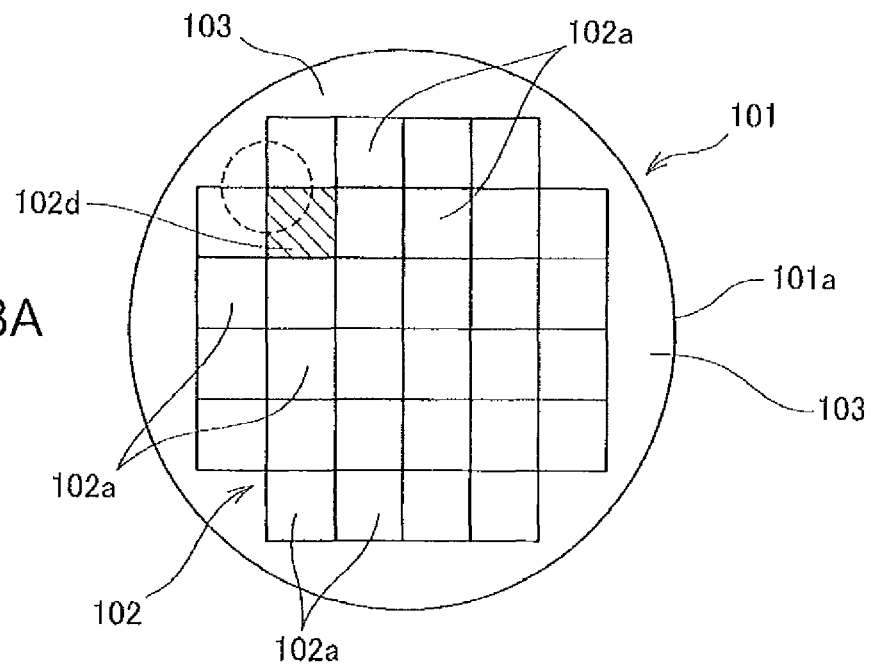
FIGS. 48A and 48B are plan views for explaining another embodiment of an imprint method of the present invention.

Furthermore, in the imprint method according to the present invention in which a silicon wafer is used as a transfer substrate, a silicon wafer subjected to a defect inspection in advance may be used. In this case, for example, as shown in FIG. 48A, a defective area 102d (shown hatched) where a defect of a prescribed size exists is excluded from the areas where a pattern structure is to be formed in pattern formation areas of the silicon wafer 101 on which a plurality of pattern formation areas 102a are set by multiple patterning. In addition, a pattern structure is formed by a step and repeat system as described above with respect to each pattern formation area 102a excluding the defective area 102d. Subsequently, in the balance layer formation step, the balance layer 110 is formed by an ink jet system in the area 103 on the outside of the area 102 where the pattern formation areas 102a are assembled and also in the defective area 102d, and the balance layer 110 is cured to obtain the balance layer 112.

Figure 48B:
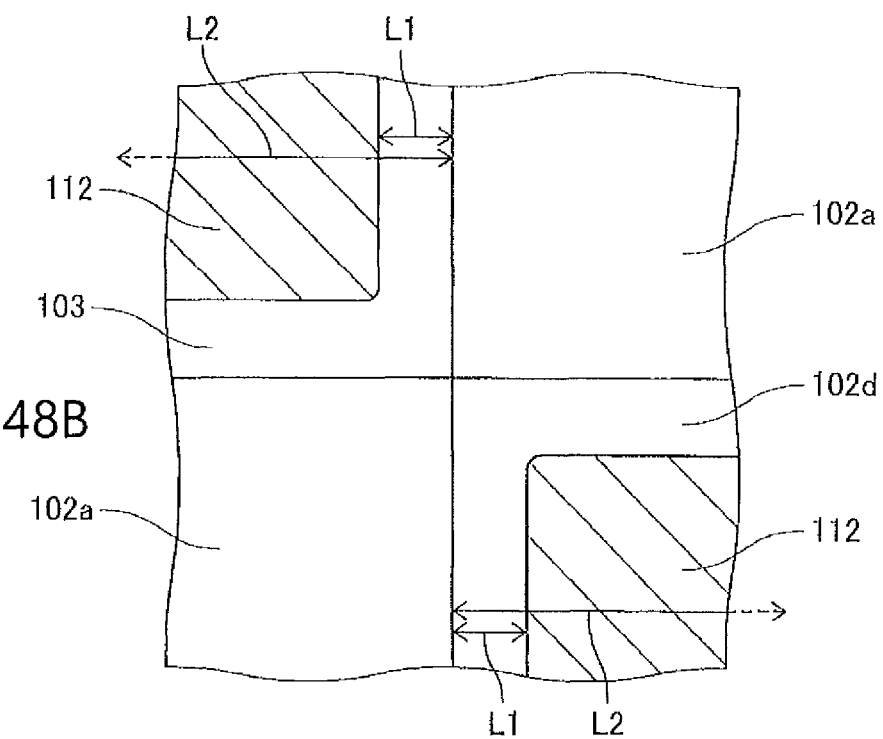

FIG. 48B is a diagram which explains a state after forming the balance layer 112 in the defective area 102d and which is an enlarged plan view of a portion enclosed by a dashed line in FIG. 48A. As shown in FIG. 48B, the formation of the balance layer 112 (shown hatched) in the defective area 102d can be performed in a similar manner to the description presented earlier such that a distance of separation L1 between an adjacent pattern formation area 102a and the balance layer 112 is 300 µm or less and a shortest distance L2 from an outer edge of the adjacent pattern formation area 102a to an outer edge of the balance layer 112 is 800 µm or more.

The formation of the balance layer 112 in the area 103 on the outside of the area 102 where the pattern formation areas 102a are assembled and also in the defective area 102d may be performed after forming a pattern structure in all of the pattern formation areas 102a by a step and repeat system. Alternatively, the balance layer 110 may be formed in the area 103 on the outside of the area 102 where the pattern formation areas 102a are assembled in a stage of forming a pattern structure in each pattern formation area 102a by the step and repeat system. In the case of the latter, the formation of the balance layer 112 in the defective area 102d may be performed when forming a pattern structure in the pattern formation area 102a adjacent to the defective area 102d.

The embodiments of the imprint method and the mold manufacturing method described above are only exemplary, and the imprint method and the mold manufacturing method according to the present invention are not limited thereto.

Practical Example 1

<Fabrication of Master Mold>

Quartz glass (152 mm square) with a thickness of 6.35 mm was prepared as a base for an optical imprint mold. A chromium thin film (15 nm thickness) was formed on a surface of the base by a sputtering method. Thereafter, a commercially available electron beam-sensitive resist was applied onto the chromium thin film.

Subsequently, the base was arranged on a stage in a commercially available electron beam drawing apparatus such that a rear surface of the base opposed the stage, and the resist was irradiated with an electron beam to form a desired pattern latent image.

Next, the resist was developed to form a resist pattern, and a chromium hard mask was formed by dry etching by using the resist pattern as an etching mask. Furthermore, a master mold was fabricated by forming an uneven pattern on the base by dry etching by using the hard mask as an etching mask.

The formed uneven pattern was positioned in a 35 mm-square uneven formation area positioned at a center of the base and had line/space design values of 33 nm/33 nm. An average value of a width dimension of spaces in the line/space uneven pattern was as shown in Table 1 presented below. In addition, a threefold value (3σ) of a standard deviation (σ) of the width dimension of spaces in a central part of the 35 mm-square uneven formation area and a threefold value (3σ) of a standard deviation (σ) of the width dimension of spaces on a peripheral side (an area extending 1 mm inward from an peripheral end) of the 35 mm-square uneven formation area were measured. The measurements were as shown in Table 1 presented below. It should be noted that the measurements were performed using a scanning electron microscope (E3620 manufactured by Advantest Corporation).

<Fabrication of Transfer Substrate>

Meanwhile, as a transfer substrate, a mesa-structure quartz glass substrate (152 mm×152 mm, 6.35 mm thickness) that had a 35 mm-square, 20 µm-high projection structure portion at a center thereof was prepared. A chromium thin film (15 nm thickness) was formed by a sputtering method on a surface of the quartz glass substrate on which the projection structure portion was positioned to form a hard mask material layer.

<Fabrication of Replica Mold Using Imprint Method>

Subsequently, a photocurable resin was supplied by an ink jet system on the hard mask material layer of the projection structure part which is a pattern formation area of the transfer substrate. In addition, the photocurable resin was supplied by an ink jet system to a hard mask material layer on the outside of the projection structure part, and a balance layer was formed in a ring shape so as to enclose the projection structure part.

Next, the transfer substrate and the master mold were brought close to each other, droplets were spread between the projection structure part of the transfer substrate and the mold, and a molded resin layer was formed.

Subsequently, parallel light (ultraviolet rays having a peak wavelength of 365 nm) was emitted to the side of the master mold from an illumination optical system of the imprint apparatus under a condition of 150 mJ/cm$^2$. Accordingly, the molded resin layer was cured to obtain a transfer resin layer on which was formed an uneven structure with a line/space shape in which projections and depressions of the uneven structure with a line/space shape of the master mold were inverted. In addition, the balance layer was cured to obtain a balance layer with a thickness of 3 µm. A distance of separation L1 of the balance layer from the projection structure part ranged from 180 to 200 µm, and a shortest distance L2 from an outer edge of the projection structure part to an outer edge of the balance layer ranged from 840 to 860 µm.

Next, the transfer resin layer and the master mold were separated from each other, and the pattern structure that is a transfer resin layer was positioned on the projection structure part of the transfer substrate.

As described above, using the pattern structure formed on the hard mask material layer of the projection structure part of the transfer substrate and the balance layer formed on the hard mask material layer in an area outside of the projection structure part as etching masks, a hard mask was formed by etching the hard mask material layer by chlorine-based reactive ion etching (refer to FIG. 2B).

Next, by etching the transfer substrate by reactive ion etching using a fluorine-based gas and using the hard mask formed as described above as an etching mask, a replica mold was fabricated in which a line/space uneven structure was formed in the projection structure part.

With respect to the line/space uneven structure of the replica mold fabricated as described above, an average value of a width dimension of the lines, a threefold value (3σ) of a standard deviation (σ) of the width dimension of the lines in a central part of a 35 mm-square pattern formation area, and a threefold value (3σ) of a standard deviation (σ) of the width dimension of the lines on a peripheral side (an area extending 1 mm inward from an peripheral end) of the 35 mm-square pattern formation area were measured in a similar manner to that described above. The measurements were as shown in Table 1 presented below.

Practical Example 2

A replica mold was fabricated in a similar manner to Practical example 1 with the exception of setting a distance of separation L1 between the balance layer and the projection structure part to 80 to 100 µm.

With respect to the line/space uneven structure of the replica mold fabricated as described above, an average value of a width dimension of the lines, a threefold value (3σ) of a standard deviation (σ) of the width dimension of the lines in a central part of a 35 mm-square pattern formation area, and a threefold value (3σ) of a standard deviation (σ) of the width dimension of the lines on a peripheral side (an area extending 1 mm inward from an peripheral end) of the 35 mm-square pattern formation area were measured in a similar manner to Practical example 1. The measurements were as shown in Table 1 presented below.

Practical Example 3

A replica mold was fabricated in a similar manner to Practical example 1 with the exception of setting a shortest distance L2 from an outer edge of the projection structure part to an outer edge of the balance layer to 1800 to 2000 µm.

With respect to the line/space uneven structure of the replica mold fabricated as described above, an average value of a width dimension of the lines, a threefold value (3σ) of a standard deviation (σ) of the width dimension of the lines in a central part of a 35 mm-square pattern formation area, and a threefold value (3σ) of a standard deviation (σ) of the width dimension of the lines on a peripheral side (an area extending 1 mm inward from an peripheral end) of the 35 mm-square pattern formation area were measured in a similar manner to Practical example 1. The measurements were as shown in Table 1 presented below.

Comparative Example

A replica mold was fabricated in a similar manner to the practical examples with the exception of not forming a balance layer. With respect to the line/space uneven structure of the replica mold, an average value of a width dimension of the lines, a threefold value (3σ) of a standard deviation (σ) of the width dimension of the lines in a central part of a 35 mm-square pattern formation area, and a threefold value (3σ) of a standard deviation (σ) of the width dimension of the lines on a peripheral side (an area extending 1 mm inward from an peripheral end) of the 35 mm-square pattern formation area were measured in a similar manner to the practical examples. The measurements were as shown in Table 1 presented below.

Practical Example 4

A replica mold was fabricated in a similar manner to Practical example 1 with the exception of setting a distance of separation L1 between the balance layer and the projection structure part to 400 to 420 μm.

With respect to the line/space uneven structure of the replica mold fabricated as described above, an average value of a width dimension of the lines, a threefold value (3σ) of a standard deviation (σ) of the width dimension of the lines in a central part of a 35 mm-square pattern formation area, and a threefold value (3σ) of a standard deviation (σ) of the width dimension of the lines on a peripheral side (an area extending 1 mm inward from an peripheral end) of the 35 mm-square pattern formation area were measured in a similar manner to Practical example 1. The measurements were as shown in Table 1 presented below.

Practical Example 5

A replica mold was fabricated in a similar manner to Practical example 1 with the exception of setting a shortest distance L2 from an outer edge of the projection structure part to an outer edge of the balance layer to 680 to 700 μm.

With respect to the line/space uneven structure of the replica mold fabricated as described above, an average value of a width dimension of the lines, a threefold value (3σ) of a standard deviation (σ) of the width dimension of the lines in a central part of a 35 mm-square pattern formation area, and a threefold value (3σ) of a standard deviation (σ) of the width dimension of the lines on a peripheral side (an area extending 1 mm inward from an peripheral end) of the 35 mm-square pattern formation area were measured in a similar manner to Practical example 1. The measurements were as shown in Table 1 presented below.

TABLE 1

| REPLICA MOLD | 3σ (nm) | | AVERAGE VALUE OF WIDTH DIMENSION OF LINES* (nm) | |
|---|---|---|---|---|
| | CENTRAL PART | PERIPH-ERAL SIDE | CENTRAL PART | PERIPHERAL SIDE |
| PRACTICAL EXAMPLE 1 | 1.1 | 1.4 | 33.0 | 32.0 |
| PRACTICAL EXAMPLE 2 | 1.2 | 1.2 | 33.5 | 33.7 |
| PRACTICAL EXAMPLE 3 | 1.0 | 1.1 | 33.4 | 33.5 |
| COMPARATIVE EXAMPLE | 1.0 | 4.1 | 33.1 | 27.6 |
| PRACTICAL EXAMPLE 4 | 1.1 | 2.2 | 33.2 | 30.8 |
| PRACTICAL EXAMPLE 5 | 1.2 | 2.6 | 33.3 | 30.9 |
| MASTER MOLD | 0.8 | 1.1 | 32.2 | 32.8 |

*VALUES OF MASTER MOLD REPRESENT AVERAGE VALUE OF WIDTH DIMENSION OF SPACES (nm)

As shown in Table 1, with Practical examples 1 to 3, differences between the average value and the threefold value (3σ) of the standard deviation (σ) of the width dimension of the lines in the central part of the pattern formation area and the average value and the threefold value (3σ) of the standard deviation (σ) of the width dimension of the lines on the peripheral side of the pattern formation area were small. The numerical values were close to an average value and a threefold value (3σ) of a standard deviation (σ) of a width dimension of spaces in a central part of the master mold, and had high dimensional accuracy.

In contrast, with the Comparative example, there was a significant difference between average values of the width dimension of lines between the peripheral side and the central part of the pattern formation area, and the threefold value (3σ) of the standard deviation (σ) on the peripheral side of the pattern formation area was significant. Dimensional accuracy of the line/space uneven structure on the peripheral side of the pattern formation area was inferior.

In addition, with Practical examples 4 and 5, there was a slightly large difference between average values of the width dimension of lines between the peripheral side and the central part of the pattern formation area, and the threefold value (3σ) of the standard deviation (σ) on the peripheral side of the pattern formation area was slightly large. While more favorable than the Comparative example, dimensional accuracy was inferior in comparison to Practical examples 1 to 3.

Practical Example 6

Figure 49:
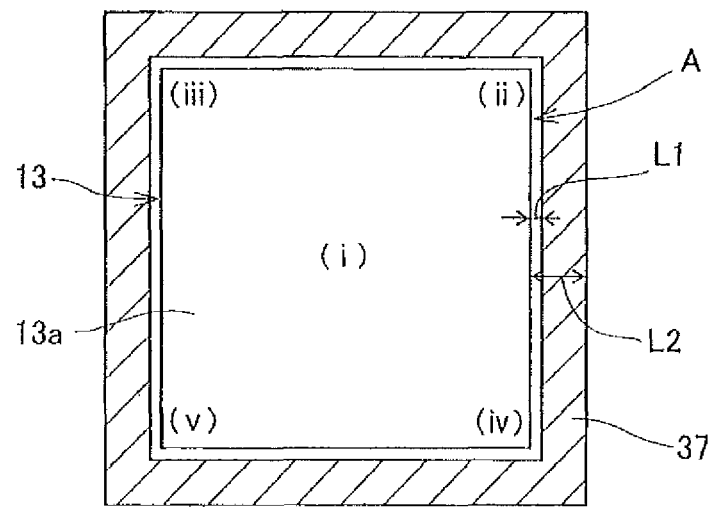
FIG. 49 is a plan view showing locations where a thickness of a remaining film of a pattern structure is measured and an external shape of a balance layer in a practical example.

Using the master mold fabricated in Practical example 1 and a transfer substrate similar to that used in Practical example 1, the pattern structure 41 that is a transfer resin layer was formed on the hard mask material layer 15 of the projection structure part 13 (in which the 35 mm-square surface 13a had a square shape) which is the pattern formation area A of the transfer substrate. Thickness of the remaining film 42 positioned between projections of the pattern structure 41 formed in this manner was measured as shown in FIG. 49 at a total of five locations including a center location (i) of the pattern formation area A and locations (ii) to (v) respectively separated toward the center by 200 μm from four corners of the pattern formation area. The measurements were as shown in Table 2 presented below. It should be noted that the thickness of the remaining film of the pattern structure was measured using a spectroscopic reflectometer (Atlas-M manufactured by Nanometrics Incorporated).

Subsequently, the balance layer 37 (shown hatched in FIG. 49) was fabricated in a similar manner to Practical example 3, and a replica mold was fabricated in a similar manner to Practical example 1. Specifically, the balance layer 37 was formed such that a distance of separation L1 from the projection structure part ranged from 180 to 200 μm, and a shortest distance L2 from an outer edge of the projection structure part to an outer edge of the balance layer was 2 mm. A width dimension of lines of a line/space uneven structure of the replica mold fabricated in this manner was measured in a similar manner to Practical example 1 at locations corresponding to the five locations ((i) to (v)) where the thickness of the remaining film was measured as described above. The measurements were as shown in Table 2 presented below.

Figure 50:
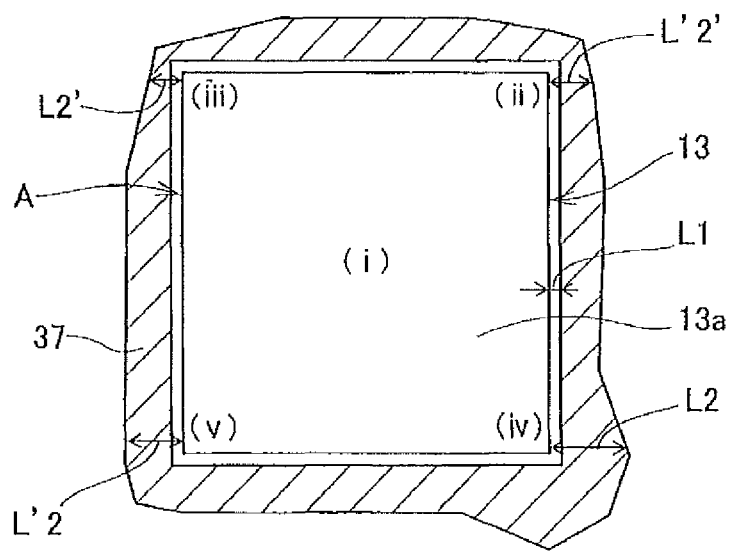
FIG. 50 is a plan view showing locations where a thickness of a remaining film of a pattern structure is measured and an external shape of a balance layer in a practical example.

In contrast, as Practical example 6, first, in a stage (refer to FIG. 9C) where the pattern structure 41 had been formed, thickness of the remaining film 42 positioned between projections of the pattern structure 41 was measured as shown in FIG. 50 in a similar manner to Practical example 3 at a total of five locations (i) to (v). The measurements were as shown in Table 2 presented below.

Next, shortest distances from outer edges of four corners of the projection structure part 13 that is the pattern formation area A to an outer edge of the balance layer 37 were denoted as L2', L'2', L'2, and L2 as shown in FIG. 50, and a replica mold was fabricated in a similar manner to Practical example 3 with the exception of forming the balance layer 37 based on the measurement results of the remaining film at (ii) to (v) such that L2'=1 mm, L'2'=1.5 mm, L'2=2 mm, and L2=3 mm. A width dimension of lines of a line/space uneven structure of the replica mold fabricated in this manner was measured in a similar manner to Practical example 1 at locations corresponding to the five locations ((i) to (v)) where the thickness of the remaining film was measured as described above. The measurements were as shown in Table 2 presented below.

TABLE 2

| REPLICA MOLD | MEASUREMENT LOCATION | THICKNESS OF REMAINING FILM (nm) | WIDTH DIMENSION OF LINES* (nm) |
|---|---|---|---|
| PRACTICAL EXAMPLE 3 | (i) | 14 | 33.3 |
| | (ii) | 17 | 34.5 |
| | (iii) | 21 | 36.2 |
| | (iv) | 10 | 31.0 |
| | (v) | 14 | 31.9 |
| PRACTICAL EXAMPLE 6 | (i) | 14 | 33.3 |
| | (ii) | 18 | 33.6 |
| | (iii) | 22 | 33.8 |
| | (iv) | 10 | 32.8 |
| | (v) | 14 | 32.0 |
| MASTER MOLD | (i) | — | 32.6 |
| | (ii) | — | 32.2 |
| | (iii) | — | 32.3 |
| | (iv) | — | 32.4 |
| | (v) | — | 32.2 |

*VALUES OF MASTER MOLD REPRESENT WIDTH DIMENSION OF SPACES (nm)

As shown in Table 2, with the replica mold according to Practical example 6, differences between widths of lines near the four corners (ii) to (v) of the pattern formation area and widths of lines at the central part (i) were smaller than those of Practical example 3. As a result, it was determined that an improvement in dimensional accuracy can be achieved by adjusting a width of a balance layer based on a thickness of a remaining film.

INDUSTRIAL APPLICABILITY

The present invention can be applied to the manufacturing of various pattern structures, fine machining of a workpiece such as a substrate, and the like which use the imprint method, and to the manufacturing of an imprint mold.

REFERENCE SIGNS LIST 11, 61 Transfer substrate
13 Projection structure part
15, 65 Hard mask material layer
21, 71 Mold
73 Projection structure part
35, 85 Balance layer
37, 87 Balance layer after curing
41, 91 Pattern structure
42, 92 Remaining film
101 Silicon wafer
102a Pattern formation area
102d Defective area
112 Balance layer after curing

The invention claimed is:

1. An imprint method, comprising:
 a resin supply step of supplying a molded resin on a hard mask material layer of a transfer substrate having the hard mask material layer on one main surface thereof;
 a contact step of bringing a mold having an uneven structure and the transfer substrate close to each other and spreading the molded resin between the mold and the transfer substrate to form a molded resin layer;
 a curing step of curing the molded resin layer to obtain a transfer resin layer; and
 a mold release step of separating the transfer resin layer and the mold from each other and positioning a pattern structure, which is the transfer resin layer, on the transfer substrate, wherein
 in the resin supply step, a balance layer is formed by supplying a molded resin also to an area outside of a pattern formation area of the transfer substrate in which the pattern structure is to be formed.

2. An imprint method, comprising:
 a resin supply step of supplying a molded resin on a hard mask material layer of a transfer substrate having the hard mask material layer on one main surface thereof;
 a contact step of bringing a mold having an uneven structure and the transfer substrate close to each other and spreading the molded resin between the mold and the transfer substrate to form a molded resin layer;
 a curing step of curing the molded resin layer to obtain a transfer resin layer;
 a mold release step of separating the transfer resin layer and the mold from each other and positioning a pattern structure, which is the transfer resin layer, on the transfer substrate; and
 a balance layer formation step of forming a balance layer by supplying a molded resin to an area outside of a pattern formation area of the transfer substrate in which the pattern structure has been formed, and curing the molded resin.

3. The imprint method according to claim 1, wherein the balance layer is formed such that, when the pattern formation area and the balance layer separate from each other, a distance of separation is equal to or less than 300 μm.

4. The imprint method according to claim 1, wherein the balance layer is formed such that a shortest distance from an outer edge of the pattern formation area to an outer edge of the balance layer is equal to or more than 800 μm.

5. The imprint method according to claim 1, wherein by using a transfer substrate with a mesa structure in which the pattern formation area constitutes a projection structure part that is more projected than a surrounding area, the balance layer is formed on the transfer substrate on the outside of the projection structure part.

6. The imprint method according to claim 1, wherein by using a mold with a mesa structure in which an area having an uneven structure constitutes a projection structure part that is more projected than a surrounding area, the balance layer is formed on a surface of the transfer substrate so as to be positioned on the outside of an area corresponding to the projection structure part of the mold.

7. The imprint method according to claim 1, wherein
 when a distance from a balance layer positioned in a vicinity of a portion where thickness of a remaining film of a pattern structure formed in the pattern formation area is small to the pattern formation area is denoted by L1, a distance from an outer edge of the balance layer to the pattern formation area is denoted by L2, a distance from a balance layer positioned in a vicinity of a portion where thickness of the remaining film of the pattern structure formed in the pattern formation area is large to the pattern formation area is denoted by L1', and a distance from an outer edge of the balance layer to the pattern formation area is denoted by L2', the balance layer is formed so as to satisfy a relationship expressed by L2'<L2 or L1<L1', and satisfy a relationship expressed by (L2'−L1')<(L2−L1).

8. The imprint method according to claim 1, wherein the balance layer is formed such that coverage for a balance layer positioned in a vicinity of a portion where thickness of a remaining film of a pattern structure formed in the pattern formation area is small is greater than coverage for a balance layer positioned in a vicinity of a portion where thickness of the remaining film of the pattern structure formed in the pattern formation area is large.

9. The imprint method according to claim 7, wherein after the mold release step, an area where the balance layer is formed is determined based on a result of a measurement of a thickness distribution of a remaining film of a pattern structure formed in the pattern formation area.

10. The imprint method according to claim 8, wherein after the mold release step, an area where the balance layer is formed is determined based on a result of a measurement of a thickness distribution of a remaining film of a pattern structure formed in the pattern formation area.

11. The imprint method according to claim 7, wherein an area where the balance layer is formed is determined based on a result of a measurement of a thickness distribution of a remaining film of a pattern structure formed in the pattern formation area, the measurement being performed in advance in a plurality of previously performed imprints.

12. The imprint method according to claim 8, wherein an area where the balance layer is formed is determined based on a result of a measurement of a thickness distribution of a remaining film of a pattern structure formed in the pattern formation area, the measurement being performed in advance in a plurality of previously performed imprints.

13. The imprint method according to claim 1, wherein
in a plurality of previously performed imprints, a hard mask is formed by etching the hard mask material layer by using a pattern structure formed in the pattern formation area as an etching mask, an uneven structure is formed in the pattern formation area by etching the transfer substrate by using the hard mask as an etching mask, and in an outer edge portion in the pattern formation area, a contraction tendency portion where a width dimension of a projection of the uneven structure tends to be smaller than an opening dimension of a corresponding depression of the mold and an expansion tendency portion where the width dimension of the projection of the uneven structure tends to be larger than the opening dimension of the corresponding depression of the mold are identified, and
when a distance from a balance layer positioned in a vicinity of the contraction tendency portion to the pattern formation area is denoted by L1, a distance from an outer edge of the balance layer to the pattern formation area is denoted by L2, a distance from a balance layer positioned in a vicinity of the expansion tendency portion to the pattern formation area is denoted by L1', and a distance from an outer edge of the balance layer to the pattern formation area is denoted by L2', the balance layer is formed so as to satisfy a relationship expressed by L2'<L2 or L1<L1', and satisfy a relationship expressed by (L2'−L1')<(L2−L1).

14. The imprint method according to claim 1, wherein
in a plurality of previously performed imprints, a hard mask is formed by etching the hard mask material layer by using a pattern structure formed in the pattern formation area as an etching mask, an uneven structure is formed in the pattern formation area by etching the transfer substrate by using the hard mask as an etching mask, and in an outer edge portion in the pattern formation area, a contraction tendency portion where a width dimension of a projection of the uneven structure tends to be smaller than an opening dimension of a corresponding depression of the mold and an expansion tendency portion where the width dimension of the projection of the uneven structure tends to be larger than the opening dimension of the corresponding depression of the mold are identified, and
the balance layer is formed such that coverage for a balance layer positioned in a vicinity of the contraction tendency portion is larger than coverage for a balance layer positioned in a vicinity of the expansion tendency portion.

15. The imprint method according to claim 1, wherein
a dimension distribution of an opening of a depression of the uneven structure included in the mold is identified,
when a distance from a balance layer positioned in a vicinity of a portion included in an outer edge portion in the pattern formation area of the transfer substrate and corresponding to a portion of the mold where an opening dimension of the depression is small to the pattern formation area is denoted by L1, a distance from an outer edge of the balance layer to the pattern formation area is denoted by L2,
a distance from a balance layer positioned in a vicinity of a portion included in the outer edge portion in the pattern formation area of the transfer substrate and corresponding to a portion of the mold where the opening dimension of the depression is large to the pattern formation area is denoted by L1', and a distance from an outer edge of the balance layer to the pattern formation area is denoted by L2',
the balance layer is formed so as to satisfy a relationship expressed by L2'<L2 or L1<L1', and satisfy a relationship expressed by (L2'−L1')<(L2−L1).

16. The imprint method according to claim 1, wherein
a dimension distribution of an opening of a depression of the uneven structure included in the mold is identified, and
the balance layer is formed such that coverage for a balance layer positioned in a vicinity of a portion included in an outer edge portion in the pattern formation area of the transfer substrate and corresponding to a portion of the mold where an opening dimension of the depression is small is larger than coverage for a balance layer positioned in a vicinity of a portion included in the outer edge portion in the pattern formation area of the transfer substrate and corresponding to a portion of the mold where the opening dimension of the depression is large.

17. The imprint method according to claim 1, wherein
a silicon wafer is used as the transfer substrate, and a plurality of pattern formation areas in which a pattern structure is to be formed are set on one surface of the silicon wafer by multiple patterning, and in a stage of forming a pattern structure in the plurality of pattern formation areas by a step and repeat system or after forming the pattern structure in the plurality of pattern formation areas by the step and repeat system, the balance layer is formed by supplying a molded resin to an area outside of an area of the silicon wafer where the plurality of pattern formation areas are assembled.

18. The imprint method according to claim 1, wherein
a silicon wafer subjected to a defect inspection is used as the transfer substrate, a plurality of pattern formation areas in which a pattern structure is to be formed are set on one surface of the silicon wafer by multiple patterning and a defective area in which a defect of a prescribed size exists among the pattern formation areas is excluded from the areas where the pattern structure is to be formed, and
in a stage of forming a pattern structure in the plurality of pattern formation areas by a step and repeat system or after forming the pattern structure in the plurality of pattern formation areas by the step and repeat system, the balance layer is formed by supplying a molded resin to an area outside of an area of the silicon wafer where the plurality of pattern formation areas are assembled and also to the defective area.

19. An imprint mold manufacturing method of manufacturing a replica mold using a master mold, the imprint mold manufacturing method comprising the steps of:
preparing a transfer substrate for a replica mold having a hard mask material layer on one main surface thereof, and forming a pattern structure and a balance layer on the hard mask material layer of the transfer substrate by using a desired master mold and using the imprint method according to claim 1;
forming a hard mask by etching the hard mask material layer by using the pattern structure and the balance layer as etching masks; and
etching the transfer substrate by using the hard mask as an etching mask.

* * * * *